(12) United States Patent
Uehara et al.

(10) Patent No.: US 8,964,157 B2
(45) Date of Patent: *Feb. 24, 2015

(54) DISPLAY DEVICE

(71) Applicant: NLT Technologies, Ltd., Kanagawa (JP)

(72) Inventors: Shinichi Uehara, Kanagawa (JP);
Hidenori Ikeno, Kanagawa (JP);
Tetsushi Satou, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/199,430

(22) Filed: Mar. 6, 2014

(65) Prior Publication Data

US 2014/0184977 A1    Jul. 3, 2014

Related U.S. Application Data

(63) Continuation of application No. 14/048,561, filed on Oct. 8, 2013, now Pat. No. 8,687,160, which is a continuation of application No. 13/864,595, filed on Apr. 17, 2013, now Pat. No. 8,587,757, which is a
(Continued)

(30) Foreign Application Priority Data

Oct. 15, 2007   (JP) ................................. 2007-268423

(51) Int. Cl.
*G02F 1/133*   (2006.01)
*G02F 1/1343*  (2006.01)
(Continued)

(52) U.S. Cl.
CPC ........ *G02F 1/13624* (2013.01); *G02B 27/2214* (2013.01); *G02B 27/2264* (2013.01); *G02F 1/134309* (2013.01); *H04N 13/0404* (2013.01);
(Continued)

(58) Field of Classification Search
None
See application file for complete search history.

(56) References Cited

U.S. PATENT DOCUMENTS 7,187,425 B2    3/2007   Yamazaki
7,283,192 B2 *  10/2007  Shimoshikiryo ............. 349/144
(Continued)

FOREIGN PATENT DOCUMENTS

CN    1615453    5/2005
CN    1979318    6/2007
(Continued)

OTHER PUBLICATIONS

Japanese Official Action—2007-268423—Feb. 4, 2014.
(Continued)

*Primary Examiner* — Michelle R Connelly
(74) *Attorney, Agent, or Firm* — Young & Thompson

(57) ABSTRACT

To provide a plural-viewpoint display device having an image separating optical element such as a lenticular lens or a parallax barrier, which is capable of arranging thin film transistors and wirings while achieving substantially trapezoid apertures and high numerical aperture, and to provide a driving method thereof, a terminal device, and a display panel. A neighboring pixel pair arranged with a gate line interposed therebetween is connected to the gate line placed between the pixels, each of the pixels configuring the neighboring pixel pair is connected to the data line different from each other, and each of the neighboring pixel pairs neighboring to each other in an extending direction of the gate lines is connected to the gate line different from each other.

3 Claims, 34 Drawing Sheets

Related U.S. Application Data continuation of application No. 13/153,984, filed on Jun. 6, 2011, now Pat. No. 8,446,554, which is a continuation of application No. 12/236,675, filed on Sep. 24, 2008, now Pat. No. 7,969,544.

(51) Int. Cl.

| | | |
|---|---|---|
| *G02F 1/1362* | (2006.01) | |
| *G02B 27/22* | (2006.01) | |
| *H04N 13/04* | (2006.01) | |
| *G09G 5/00* | (2006.01) | |
| *G02F 1/1335* | (2006.01) | |

(52) U.S. Cl.
CPC ....... *H04N 13/0409* (2013.01); *H04N 13/0447* (2013.01); *H04N 13/0497* (2013.01); *G09G 5/003* (2013.01); *G02F 1/134363* (2013.01); *G02F 1/133512* (2013.01); *G02F 1/133526* (2013.01); *G02F 1/136213* (2013.01); *G02F 1/136286* (2013.01); *G02F 2201/122* (2013.01); *G02F 2201/40* (2013.01); *H04N 2213/001* (2013.01)
USPC .......................................... 349/143; 349/139

(56) References Cited

U.S. PATENT DOCUMENTS

| | | | |
|---|---|---|---|
| 7,463,321 B2 | 12/2008 | Song et al. | |
| 7,471,274 B2 * | 12/2008 | Kim | 345/88 |
| 7,936,323 B2 | 5/2011 | Mori et al. | |
| 7,969,544 B2 | 6/2011 | Uehara et al. | |
| 8,054,428 B2 | 11/2011 | Song et al. | |
| 8,207,921 B2 | 6/2012 | Lee et al. | |
| 8,446,554 B2 | 5/2013 | Uehara et al. | |
| 2003/0112213 A1 | 6/2003 | Noguchi et al. | |
| 2005/0083279 A1 | 4/2005 | Lee et al. | |
| 2005/0099378 A1 | 5/2005 | Kim | |
| 2005/0128409 A1 | 6/2005 | Lee | |
| 2006/0050385 A1 | 3/2006 | Uehara et al. | |
| 2006/0114394 A1 * | 6/2006 | Yamzaki | 349/139 |
| 2007/0132684 A1 | 6/2007 | Baek et al. | |
| 2009/0096726 A1 | 4/2009 | Uehara et al. | |
| 2009/0096943 A1 | 4/2009 | Uehara et al. | |
| 2011/0069057 A1 | 3/2011 | Cho et al. | |
| 2011/0241979 A1 | 10/2011 | Baek et al. | |

FOREIGN PATENT DOCUMENTS

| | | |
|---|---|---|
| JP | 61-097626 | 5/1986 |
| JP | 02-110433 | 4/1990 |
| JP | 04-223428 | 8/1992 |
| JP | 04-309926 | 11/1992 |
| JP | 06-332354 | 12/1994 |
| JP | 10-197894 | 7/1998 |
| JP | 2003-149676 | 5/2003 |
| JP | 2005-062416 | 3/2005 |
| JP | 2005-208567 | 8/2005 |
| JP | 2007-167100 | 7/2007 |

OTHER PUBLICATIONS

Japanese Office Action dated Feb. 26, 2013 in corresponding Japanese Patent Application No. 2007-268423 with English translation.
Chinese Search Report—2011103485439—Nov. 25, 2013.
Chinese Official Action—201110349034.8—Sep. 30, 2013.

* cited by examiner

FIG.23

| | D1 | D2 | D3 | D4 | D5 | D6 | D7 | D8 | |
|---|---|---|---|---|---|---|---|---|---|
| | | | | | | | | | G2 | | G4 | |
| G1 | + | − | − | + | + | − | − | + | |
| | + | + | − | − | + | + | − | − | |
| G3 | − | + | + | − | − | + | + | − | |
| | − | − | + | + | − | − | + | + | |
| G5 | + | − | − | + | + | − | − | + | |

DISPLAY DEVICE

CROSS REFERENCE TO RELATED APPLICATIONS

This application is a continuation of application Ser. No. 14/048,561 filed on Oct. 8, 2013, which is a continuation of Ser. No. 13/864,595 filed on Apr. 17, 2013, which is a continuation of application Ser. No. 13/153,984 filed on Jun. 6, 2011, which is a continuation of application Ser. No. 12/236,675 filed on Sep. 24, 2008, which claims foreign priority to Japanese Application No. 2007-268423 filed on Oct. 15, 2007. The entire contents of each of the above applications are hereby incorporated by reference.

BACKGROUND OF THE INVENTION

1. Field of the Invention

The present invention relates to a display device capable of displaying an image to each of a plurality of viewpoints, its driving method, a terminal device, and a display panel. More specifically, the present invention relates to a display device capable of providing high quality display, its driving method, a terminal device, and a display panel.

2. Description of the Related Art

Owing to the recent technical developments, display panels are used in various places by being loaded not only to large-scale terminal devices such as monitors and television receiver sets but also to medium-scale terminal devices such as notebook-type personal computers, cash dispensers, and vending machines, and to small-scale terminal devices such as personal TVs, PDAs (Personal Digital Assistances), portable telephones, and portable game machines. Particularly, liquid crystal display devices using liquid crystal have many advantages such as being thin in thickness, light in weight, small in size, and low in terms of power consumption, so that those are loaded to various terminal devices. With a current display device, same display contents as those when viewed from a front direction can be observed from places other than the front direction. However, a display device with which different images can be observed depending on the viewpoints, i.e., depending on the positions from which observers views the display, has also been developed. Such device is expected to grow as a display device of next generation.

As an example of the device capable of displaying different images to each of a plurality of viewpoints, there is a stereoscopic image display device. Particularly, a lenticular lens type and parallax barrier type have been proposed as a stereoscopic image display system that requires no special eye glasses.

The inventors of the present invention have zealously conducted studies on a plural-viewpoint display device having an optical element such as a lenticular lens for separating images so as to develop a method for achieving high quality images (see Japanese Unexamined Patent Publication 2005-208567 (FIG. 37): Patent Document 1, for example). FIG. 34 is a plan view showing a display panel of an image display device depicted in Patent Document 1. As shown in FIG. 34, an aperture 1075 of the display panel is in a shape including a trapezoid on a plan view. Specifically, the aperture 1075 is in a hexagonal shape in which a bilateral-symmetric trapezoid and a rectangle whose long side has an equal length with the length of a lower bottom of the trapezoid are placed in such a manner that a lower bottom of the trapezoid and a long side of the rectangle are in contact with each other.

Assuming that the longitudinal direction of cylindrical lenses 1003a that configure a lenticular lens is a vertical direction 1011 and an arranging direction thereof is a lateral direction 1012, the shape of the aperture 1075 is laterally symmetrical with respect to a segment extending in the vertical direction 1011. Further, there is a pair of sides that are tilted in opposite directions with respect to the vertical direction 1011 from each other, having same angles between the extending direction and the vertical direction 1011. As a result, in the lateral direction 1012, the end positions of the apertures 1075 of the display panel and the optical axis positions of the cylindrical lenses 1003a become relatively shifted in the vertical direction 1011.

Further, the apertures 1075 neighboring to each other in the vertical direction 1011 are arranged to be line-symmetrical with respect to a segment extending in the lateral direction 1012. Further, the apertures 1075 neighboring to each other in the lateral direction 1012 are arranged to be point-symmetrical with respect to an intersection point between a segment connecting between the middle point of both ends in the vertical direction 1011 and a segment connecting between the middle points of both ends in the lateral direction 102. Thus, the width of the aperture 1075 in the vertical direction 1011 together with the neighboring aperture 1075 in the lateral direction 1012 is substantially constant regardless of the positions in the lateral direction 1012.

A light shielding part 1076 is provided only at an edge of a pixel extending in the lateral direction 1012 but not provided at edges of the pixel sloping towards the vertical direction 1011. The apertures 1075 neighboring to each other in the lateral direction 1012 are sectioned by wirings 1070, and shielded from light by the wirings 1070.

In the display device depicted in Patent Document 1, the aperture of each pixel is formed in a shape including a trapezoid, and the apertures of the neighboring pixels are arranged to be in a point-symmetrical or line-symmetrical relation. Thereby, the numerical aperture in the vertical direction 1011 can be made substantially constant at arbitrary positions in the lateral direction 1012. As a result, deterioration in the display qualities caused due to the light-shielding areas can be prevented completely.

Further, as another example of the device capable of displaying different images for each of a plurality of viewpoints, there has been developed a plural-image simultaneous displaying device that is capable of displaying a plurality of different images for a plurality of viewpoints simultaneously (see Japanese Unexamined Patent Publication 06-332354: Patent Document 2, for example). This is a display that displays different images for each observing direction simultaneously under a same condition by utilizing an image allotting function of a lenticular lens. This makes it possible with a single display device to provide different images from each other simultaneously to a plurality of observers that are located at a different position from each other with respect to the display device.

As described, a great number of plural-viewpoint display devices have been studied, and the aperture shapes of the pixels suited for those display devices have been proposed.

However, the techniques described above have following issues. That is, for increasing the display qualities while using thin film transistors, it is difficult with the conventional pixel structure to improve the numerical aperture while maintaining the above-described aperture shape.

SUMMARY OF THE INVENTION

The present invention has been designed in view of such issues. It is an exemplary object of the present invention to provide a display device capable of displaying images to each of a plurality of viewpoints, which can display a high quality image by arranging thin film transistors and wirings while achieving the substantially trapezoid aperture shape described above and high numerical aperture, and to provide its driving method, a terminal device, and a display panel.

A display device according to an exemplary aspect of the invention includes: a plurality of pixel units each including at least pixels for displaying different images toward each direction; data lines for supplying display data to each of the pixels; pixel switches for transmitting display data signals from the data lines to the pixels; gate lines for controlling the pixel switches; and an optical element for distributing light emitted from each of the pixels configuring the pixel units towards different directions, wherein a neighboring pixel pair arranged with the gate line interposed therebetween is controlled by the gate line that is provided between those pixels, each of the pixels configuring the neighboring pixel pair is connected to the data line different from each other, and each of the neighboring pixel pairs neighboring to each other in an extending direction of the gate lines is connected to the gate line different from each other.

With this, the pixels configuring the neighboring pixel pair can be connected to the gate line placed between those pixels, and the thin film transistors can be disposed with high density by utilizing the areas of the neighboring pixel pair mutually. Furthermore, through connecting each of the pixels configuring the pixel pair to the different data line from each other and connecting each of the neighboring pixel pairs neighboring to each other in the extending direction of the gate lines to the different gate line from each other, it becomes possible to prevent the same-kind wirings from being arranged close to each other. As a result, the wirings can be disposed efficiently, so that the numerical aperture can be improved. As described, the wirings and the thin film transistor can be arranged efficiently in each of the pixels having the trapezoid aperture. Thereby, high numerical aperture can be obtained. As a result, display qualities can be improved.

Further, in the display device according to another exemplary aspect of the invention, when arranging each of the pixels configuring the neighboring pixel pairs vertically in top and bottom with a common gate line interposed therebetween, there may be arranged the neighboring pixel pairs each having an upper-side pixel connected to a left-side data line and the neighboring pixel pairs each having an upper-side pixel connected to a right-side data line.

With this, the neighboring pixel pairs of different structures can be arranged. Thus, it is possible to decrease influences of abnormal alignment of the liquid crystal molecules if it happens. This is because it is possible to prevent the abnormal state from generating at same positions of the whole pixels, since the positions of having abnormal alignment or the like differ when the pixel structures vary. Especially, the plural-viewpoint display device according to the exemplary embodiment of the present invention enlarges the images by using the image separating device such as a lens. Therefore, when the abnormal state occurs at the same positions of the whole pixels, the display image quality at the corresponding observing position becomes deteriorated. Through arranging the neighboring pixel pairs of different structures, the positions at which the deteriorated display image is observed can be dispersed. This makes it possible to improve the display quality.

BRIEF DESCRIPTION OF THE DRAWINGS

FIG. 23 is a table showing polarities of data lines when each gate line is being selected in the display device according to the exemplary embodiment;

DETAILED DESCRIPTION OF THE PREFERRED EMBODIMENTS

Figure 1:
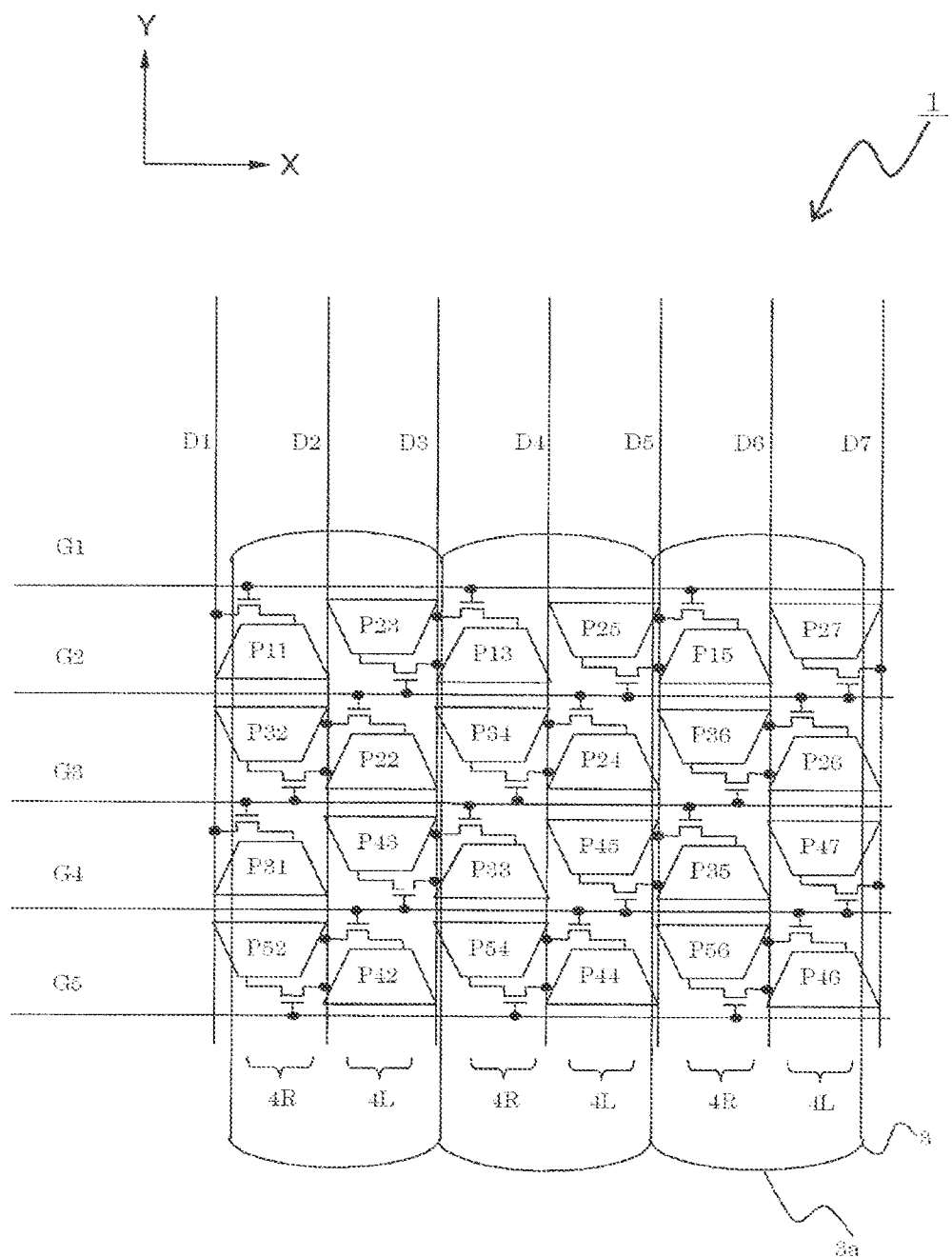
FIG. 1 is a top plan view showing a display device according to a first exemplary embodiment of the present invention.
Figure 2:
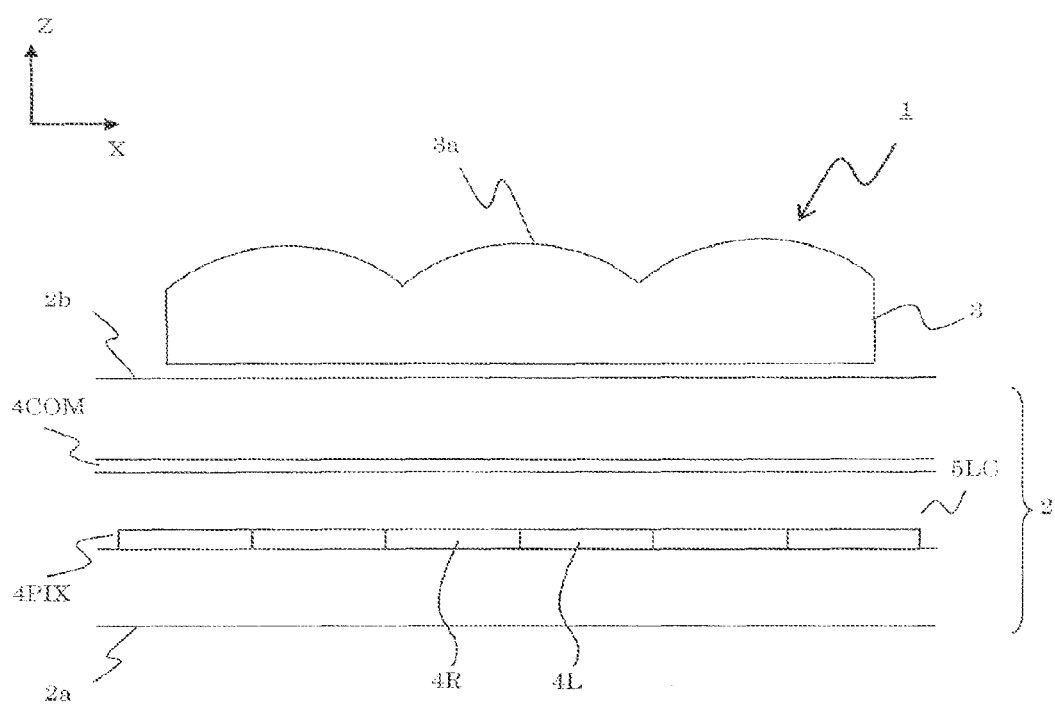
FIG. 2 is a sectional view showing the display device according to this exemplary embodiment.
Figure 3:
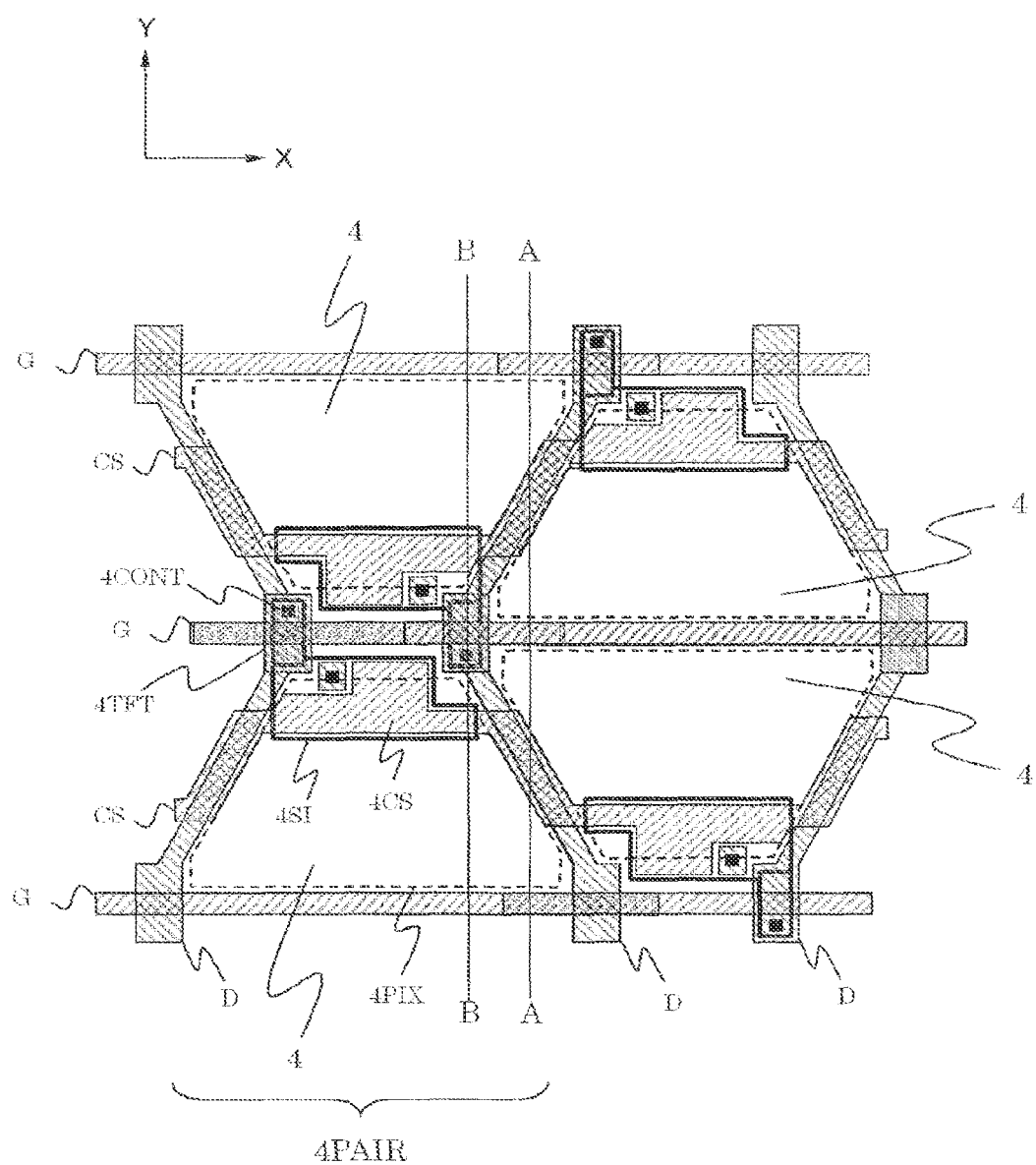
FIG. 3 is a top plan view showing pixels of the display device according to this exemplary embodiment.
Figure 4:
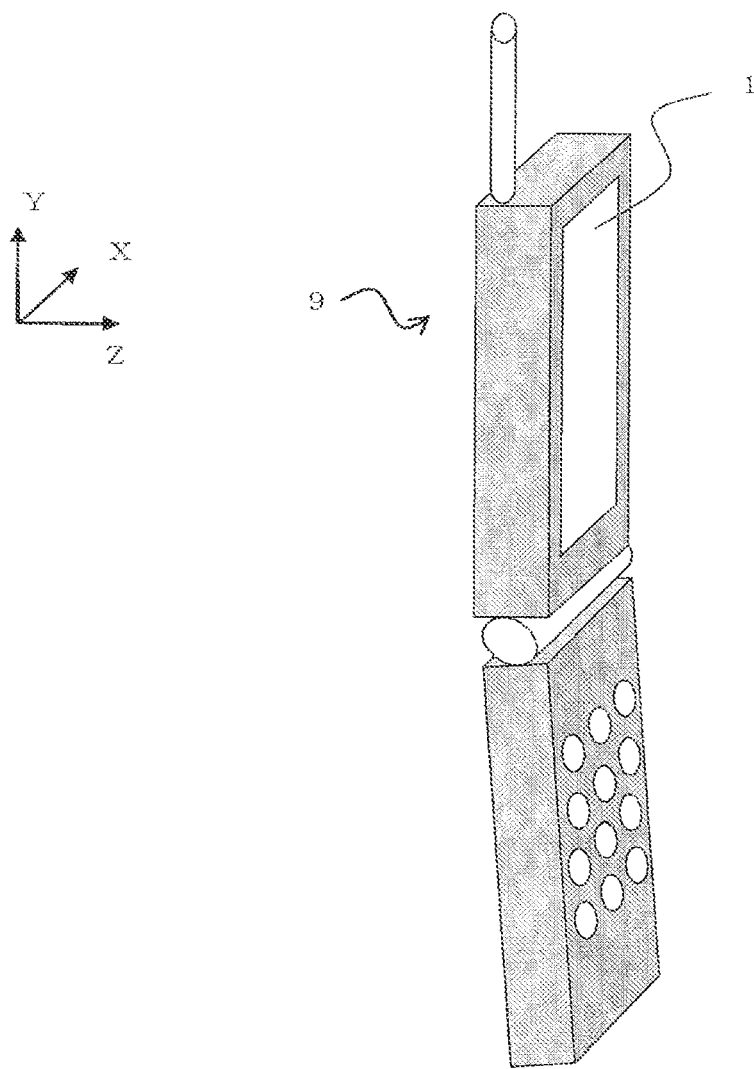
FIG. 4 is a perspective view showing a terminal device according to this exemplary embodiment.

Hereinafter, a display device, its driving method, a terminal device, and a display panel according to exemplary embodiments of the present invention will be described in a concrete manner by referring to the accompanying drawings. First, the display device, its driving method, the terminal device, and the display panel according to a first exemplary embodiment of the present invention will be described. FIG. 1 is a top plan view showing the display device according to the first exemplary embodiment of the present invention, which, in particular, shows a relation between electrical connection of pixels and a lenticular lens as an image separating device. FIG. 2 is a sectional view showing the display device according to this exemplary embodiment. FIG. 3 is a top plan view showing pixels of the display device according to this exemplary embodiment, and FIG. 4 is a perspective view showing a terminal device according to this exemplary embodiment.

As shown in FIG. 1 and FIG. 2, the display device according to the first exemplary embodiment is a display device 1 used for stereoscopic image display, which has a lenticular lens 3 provided to a display panel 2 that utilizes liquid crystal molecules as electro-optical elements. The lenticular lens 3 is disposed on the display surface side of the display panel 2, i.e., on the user side.

The display panel 2 is a two-viewpoint display panel for stereoscopic display, in which pixel pairs (as a pixel unit) each configured with one each of a left-eye pixel 4L and a right-eye pixel 4R are arranged in matrix. In this exemplary embodiment, the left-eye pixel 4L and the right-eye pixel 4R are also referred to as pixels 4 as a general term. The lenticular lens 3 is a lens array where a great number of cylindrical lenses 3a are arranged one-dimensionally. The cylindrical lens 3a is a one-dimensional lens having a semicylindrical convex part. The extending direction, i.e., the longitudinal direction, is a direction that is orthogonal to the arranging direction on the display surface. The cylindrical lens 3a exhibits no lens effect in the extending direction, and exhibits the lens effect only in the arranging direction that is orthogonal to the extending direction. Thus, the lenticular lens 3 is a one-dimensional lens array that exhibits the lens effect only in the arranging direction of the cylindrical lenses 3a. The arranging direction of the cylindrical lenses 3a is set as a direction towards which the left-eye pixel 4L and the right-eye pixel 4R are arranged in a repeated manner. The cylindrical lens 3a is arranged by corresponding to the pixel unit mentioned above.

The cylindrical lens 3a exhibits the lens effect only in the direction that is orthogonal to its extending direction, as described above. In this exemplary embodiment, the direction exhibiting the lens effect is consistent with the direction towards which the left-eye pixel 4L and the right-eye pixel 4R are arranged in a repeated manner. As a result, the cylindrical lens 3a works as a light separating device that is capable of separating light of the left-eye pixel 4L and light of the right-eye pixel 4R towards different directions. With this, the lenticular lens 3 can separate an image displayed at the left-eye pixel 4L and an image displayed at the right-eye pixel 4R of each pixel unit towards different directions. That is, the lenticular lens 3 is an optical member that works as an image separating device and an image distributing device. The focal distance of the cylindrical lens 3a is set as a distance between principal point of the cylindrical lens 3a (the vertex of the lens) and the pixel surface (the surface on which the left-eye pixel 4L or the right-eye pixel 4R is arranged).

In the current Specification, XYZ Cartesian coordinate system is set as follows for conveniences' sake. Regarding the direction towards which the left-eye pixel 4L and the right-eye pixel 4R are arranged in a repeated manner, the direction from the right-eye pixel 4R towards the left-eye pixel 4L is defined as "+X direction", and the opposite direction is defined as "−X direction". The +X direction and the −X direction are referred to as X-axis direction as a general term. Further, the longitudinal direction of the cylindrical lens 3a is defined as Y-axis direction. Furthermore, the direction that is orthogonal to both the X-axis direction and the Y-axis direction is defined as Z-axis direction. Regarding the Z-axis direction, the direction from the surface on which the left-eye pixel 4L or the right-eye pixel 4R is deposited towards the lenticular lens 3 is defined as "+Z direction" and the opposite direction is defined as "−Z direction". That is, the +Z direction is a direction towards the front, i.e., towards a user, and the user visually recognizes the +Z side of the display panel 2. +Y direction is defined as a direction where a right-hand coordinate system applies. That is, the middle finger of the right hand of a person comes to point towards the +Z direction, when the thumb thereof points towards the +X direction, the index finger points towards the +Y direction.

By setting the XYZ coordinate system in the manner described above, the arranging direction of the cylindrical lenses 3a is the X-axis direction, and the image for the left eye and the image for the right eye are separated along the X-axis direction. Further, the pixel units each configured with the left-eye pixel 4L and the right-eye pixel 4R are arranged in line towards the Y-axis direction. The arranging cycle of the pixel pairs in the X-axis direction is substantially equal to the arranging cycle of the cylindrical lenses. The pixel units arranged in line in the Y-axis direction are arranged by corresponding to a single cylindrical lens 3a.

On the display panel 2, a TFT substrate 2a and a counter substrate 2b are disposed by having a minute space therebetween, and a liquid crystal layer 5LC is placed in the space. The liquid crystal layer 5LC is formed to be in a transmissive TN mode, for example. The TFT substrate 2a is placed on the −Z direction side of the display panel 2, and the counter substrate 2b is placed on the +Z direction side. That is, the lenticular lens 3 is arranged further on the +Z direction side of the counter substrate 2b.

The display panel 2 is an active-matrix type display panel having thin film transistors. The thin film transistors work as switches for transmitting display signals to each pixel, and the switches are operated with gate signals that flow on gate lines connected to gates of respective switches. In this exemplary embodiment, gate lines G1-G5 extending in the row direction, i.e., in the X-axis direction, are provided on the surface on the inner side of the TFT substrate 2a, i.e., on the surface of the +Z direction. The gate lines G1-G5 are also referred to as gate lines G as a general term. Further, on the same surface of the TFT substrate 2a, data lines D1-D7 extending in the column direction, i.e., in the Y-axis direction, are provided. The data lines D1-D7 are also referred to as data lines D as a general term. The data lines work to supply display data signals to the thin film transistors. In this exemplary embodiment, the gate lines G are extended in the X-axis direction, and there are a plurality of them arranged in the Y-axis direction. Further, even though the data lines D are being bent, the extended direction of the data lines after being bent for a plurality of times is the Y-axis direction, and there are a plurality of them arranged in the X-axis direction. Further, a pixel (the left-eye pixel 4L or the right-eye pixel 4R) is disposed in the vicinity of an intersection point between the gate line and the data line. In particular, in FIG. 1, a pixel connected to the gate line G3 and the data line D2, for example, is expressed as P32 for clearly showing the connected relation of the pixel with respect to the gate line and the data line. That is, the number following "P" is the gate line number (number applied after "G"), and the number thereafter is the data line number (number applied after "D").

As shown in FIG. 1 and FIG. 3, a pixel electrode 4PIX, a pixel thin film transistor 4TFT, a storage capacitance 4CS are provided to a pixel 4. The pixel thin film transistor 4TFT is a MOS-type thin film transistor, and its source electrode or drain electrode is connected to the data line D via a contact hole 4CONT, and the other is connected either to the pixel electrode 4PIX or to an electrode of the storage capacitance 4CS. In the present invention, it is so defined that the electrode to which the pixel electrode is connected is a source electrode, and the electrode connected to the signal line is a drain electrode. The gate electrode of the pixel thin film transistor 4TFT is connected to the gate line G. A storage capacitance line CS is connected to the other electrode of the storage capacitance 4CS. Further, a common electrode 4COM is formed on the inner side of the counter substrate, and a pixel capacitance 4CLC is formed between the common electrode 4COM and the pixel electrode 4PIX. Further, although not shown, a light shielding layer for covering the part other than the apertures may be formed on the inner side of the counter substrate. A term "light shielding part" is used in this exemplary embodiment. However, this term is not limited only to the light shielding layer but may refer to any of those members that can shield light. In FIG. 3, each structural element is illustrated in appropriate size and reduced scale for securing the visibility of the drawing. Further, the structure of the pixel 4 is common to the left-eye pixel 4L and the right-eye pixel 4R. Further, the thin film transistor and the pixel electrode shown in FIG. 3 are extracted and illustrated in FIG. 1 for showing the connecting relation of each pixel with respect to the gate lines and the data lines.

A polysilicon thin film transistor using polycrystalline silicon as a semiconductor is used as the pixel thin film transistor 4TFT. As an example of the polycrystalline silicon, there is a p-type semiconductor containing a small amount of boron. That is, the pixel thin film transistor 4TFT is so-called a PMOS-type thin film transistor where the source electrode and the drain electrode becomes electrically conductive when a potential of the gate electrode becomes lower than a potential of the source electrode or the drain electrode.

For the polysilicon thin film transistor, for example, an amorphous silicon layer is formed after forming a silicon oxide layer on the TFT substrate 2a, and the amorphous silicon layer is polycrystallized to form a polysilicon thin film. As a polycrystallization method, heat annealing or laser annealing is used. In particular, laser annealing using a laser such as an excimer laser can achieve heat polycrystallization only on the silicon layer while suppressing the temperature increase in the glass substrate to minimum, so that it is possible to use a no-alkali glass or the like that has a low melting point. This makes it possible to cut the cost. Thus, it is used often as so-called a low-temperature polysilicon. It is also possible to form the amorphous silicon thin film transistor by omitting the annealing step.

Then, a silicon oxide layer as a gate insulating layer is formed on the silicon layer, and patterning is performed as appropriate. In this process, it is preferable to give conductivity by doping ions to an area other than the part used as the semiconductor layer of the silicon thin film. As a method for patterning, optical patterning that uses photosensitive resist can be applied. As a way of example, after spin-coating the photosensitive resist, light is irradiated partially by an exposure device such as a stepper, and the film of the photosensitive resist is kept only in the part to have the pattern remained by going through a development step. Thereafter, the silicon layer in the area where no film of the photosensitive resist remains is eliminated by dry etching or the like. At last, the film of the photosensitive resist is exfoliated.

Then, an amorphous silicon layer and a tungsten silicide layer to be the gate electrode are deposited to form the gate electrode and the like. At this time, the gate line to which the gate electrode is connected as well as the storage capacitance line may also be formed. Then, a silicon oxide layer and a silicon nitride layer are formed, and then those are patterned as appropriate. Thereafter, an aluminum layer and a titanium layer are deposited to form the source electrode and the drain electrode. At this time, the data line may be formed simultaneously.

Then, a silicon nitride layer is deposited, and then it is pattered as appropriate. Thereafter, a transparent electrode such as ITO is deposited and patterned to form the pixel electrode. With this, a pixel structure having the thin film transistor can be formed. By using the thin film transistor, circuits for driving the gate line, the data line, and the storage capacitance line can be formed simultaneously.

FIG. 3 shows four pixels of this exemplary embodiment. In this exemplary embodiment, the gate lines G and the storage capacitance lines CS are formed on the same layer as that of the gate electrode of the thin film transistor 4TFT. Further, a storage capacitance 4CS is formed between a silicon layer 4SI and the storage capacitance line CS. As described above, the silicon layer 4SI is connected to the data line D via the contact hole 4CONT. However, another contact hole 4CONT provided to a part other than the pixel thin film transistor 4TFT in the pixel 4 is for electrically connecting the silicon layer 4SI in the storage capacitance 4CS to the pixel electrode 4PIX.

In this drawing, the contact holes 4CONT are painted in black, shapes of the pixel electrodes 4PIX are shown with dotted lines, and shapes of the silicon layers 4SI are shown with thick lines.

In this exemplary embodiment of the present invention, a term "neighboring pixel pair" is used. It is to be understood that this term is used especially when two pixels arranged by sandwiching a gate line are connected to the gate line that is placed between those pixels. That is, the pixels configuring the neighboring pixel pair are controlled by the gate line that is disposed between those pixels. In FIG. 3, the two pixels on the left side configure a neighboring pixel pair 4PAIR.

Further, each pixel configuring the neighboring pixel pair 4PAIR is connected to a different data line from each other. Regarding the neighboring pixel pair 4PAIR on the left side of FIG. 3, the pixel 4 on the −Y direction side is connected to the data line D disposed on the −X direction, and the pixel 4 on the +Y direction is connected to the data line disposed on the +X direction side.

Neighboring pixel pairs 4PAIR neighboring to each other in the extending direction of the gate lines G, i.e., in the X-axis direction, are not connected to a common gate line G but connected to different gate lines G. This is because the neighboring pixel pairs 4PAIR are neighboring to each other in the X-axis direction while being shifted by one pixel along the Y-axis direction. With this layout, the number of necessary wirings can be suppressed to minimum. Thus, it is possible to improve the numerical aperture.

In this exemplary embodiment, the four pixels shown in FIG. 3 are disposed repeatedly in the X-axis direction and the Y-axis direction.

Referring back to FIG. 1, layout of the pixels will be checked. First, a neighboring pixel pair configured with a pixel P31 and a pixel P32 will be looked into. For conveniences' sake, this neighboring pixel pair will be expressed as (P31, P32). There is a neighboring pixel pair (P22, P23) neighboring to the neighboring pixel pair (P31, P32) in the +X direction. The neighboring pixel pair (P22, P23) takes the gate line G2 as a common gate line. Note here that an expression "the neighboring pixel pair takes the gate line G2 as a common gate line" means that each of the pixels configuring the neighboring pixel pair is connected to the gate line G2 (the gate line placed between those pixels) and controlled by that gate line. The neighboring pixel pair (P31, P32) takes the gate line G3 as a common gate line, so that the neighboring pixel pair (P31, P32) and the neighboring pixel pair (P22, P23) use different gate lines as the common gate lines thereof. Those common gate lines are neighboring to each other.

There is also a neighboring pixel pair (P42, P43) neighboring to the neighboring pixel pair (P31, P32) in the +X direction. Those neighboring pixel pairs also take different gate lines from each other as the common gate lines thereof.

Furthermore, there is a neighboring pixel pair (P33, P34) disposed in the +X direction for the neighboring pixel pair (P22, P23) or the neighboring pixel pair (P42, P43). It is the same as the case of the neighboring pixel pair (P32, P32) that the neighboring pixel pair (P33, P34) takes the gate line G3 as the common gate line. That is, the neighboring pixel pairs taking the same gate line as the common gate line are disposed on every other pixel column. That is, the gate lines connected to the neighboring pixel pairs that configure the right-eye pixels 4R are not connected to the neighboring pixel pairs that configure the left-eye pixels 4L.

Next, referring back to FIG. 3, the pixel structure will be described. In this exemplary embodiment, a part of one of the pixels that configure the neighboring pixel pair, which is connected to the data line, i.e., the drain electrode, is arranged on the other pixel side with respect to the common gate line of the neighboring pixel pair. Looking into the neighboring pixel pair (P31, P32), for example, the drain electrode of the pixel P31 is arranged at a position towards the +Y direction from the gate line G3, i.e., arranged on the pixel P32 side. In other words, the drain electrode and the source electrode of the thin film transistor 4TFT are arranged by having the gate line G interposed therebetween. Normally, "L size" of the thin film transistor indicates a length of the silicon thin film in the direction where the drain electrode and the source electrode are formed, and "W size" indicates a width of the silicon thin film in a direction orthogonal to that direction. The "L size" is also referred to as a channel length, and "W size" is also referred to as a channel width. Assuming that the direction where the drain electrode and the source electrode are formed is "L direction" and the orthogonal direction is "W direction", the W direction of the thin film transistor is consistent with the extending direction of the gate line in this exemplary embodiment. Further, the silicon thin film part of the thin film transistor is arranged by overlapping with the data line D. The thin film transistor has a single gate structure. Further, the W size is larger than the L size.

Then, each of the pixels configuring the neighboring pixel pair is arranged to be in a dot-symmetrical relation. Further, each of the neighboring pixel pairs is arranged to be in a translated relation. That is, each of the neighboring pixel pairs is arranged by being translated. "Translation" is a motion of simply changing the center position of something without making a dot-symmetrical motion or a line-symmetrical motion.

Further, the display area, i.e., the area used for display, is in a substantially trapezoid shape. Accordingly, the shape of the pixel electrode 4PIX is also in a substantially trapezoid shape. Further, the neighboring pixel pair can also be expressed as "two pixels each having a substantially trapezoid display area arranged with the upper bottoms facing with each other". Further, the thin film transistors 4TFT are arranged on the upper-bottom sides of the display areas of the pixels having a substantially trapezoid shape, i.e., arranged on the upper-bottom sides of each pixel configuring the neighboring pixel pair.

Further, the storage capacitance line CS is arranged in the extending direction of the gate line, i.e., arranged to connect the storage capacitances of each of the pixels neighboring to each other in the X-axis direction. The positions of the thin film transistors in the Y-axis direction are different in each of the pixels neighboring to each other in the X-axis direction, so that the storage capacitance lines CS are disposed by being bent in order to connect those pixels. Like the thin film transistor, the storage capacitance is arranged on the upper-bottom side of the display area having a substantially trapezoid shape. With this, the storage capacitance can be arranged efficiently between the upper bottoms of each pixel that configures the neighboring pixel pair. Thus, it is possible to improve the numerical aperture further. Further, the storage capacitance line CS is not arranged in a direction orthogonal to the extending direction of the gate line. This is an extremely important point when providing an image separating device having a separating effect in the extending direction of the gate line. As will be described later, it is also an important factor for improving the numerical aperture that the storage capacitance line CS is formed on the same layer as the gate line G.

Further, the intersection part between the storage capacitance line CS and the data line D is arranged along the data line.

As shown in FIG. 4, the terminal device according to this exemplary embodiment is a portable telephone 9. The display device 1 described above is loaded on the portable telephone 9. The X-axis direction of the display device 1 is a lateral direction of a screen of the portable telephone 9, and the Y-axis direction of the display device 1 is a vertical direction of the screen of the portable telephone 9.

Next, the pixel structure according to the exemplary embodiment and the effects thereof will be described in more details. In order to achieve high numerical aperture and high image quality in the plural-viewpoint display device, it is necessary to have the maximum vertical numerical aperture, while making it constant regardless of the positions of the pixels in the lateral direction. The vertical numerical aperture is a value obtained by dividing, with a pixel pitch of the Y-axis direction, a height of an aperture in the Y-axis direction when a pixel is cut by a segment extending in a direction (i.e., Y-axis direction) that is orthogonal to the image separating direction (X-axis direction in this exemplary embodiment) of the image separating device. It is necessary to set the vertical numerical aperture to be the maximum while making it constant regardless of the image separating direction.

First, considering the layout of the gate lines and data lines, it is preferable for the gate lines and the data lines to be arranged in the periphery of each pixel. This makes it possible to cut dead spaces between the wirings to improve the numerical aperture. In other words, it is preferable to avoid having the gate lines or the data lines arranged neighboring to each other without providing a pixel therebetween. If the wirings of a same kind are arranged neighboring to each other, it becomes necessary to provide a space between the wirings for preventing short circuit. Thus, such space becomes a dead space, thereby deteriorating the numerical aperture.

For the relation between the extending direction of the gate lines and the image separating direction of the image separating device, at least the image separating direction is arranged to be in the lateral direction of the display device, particularly in a case of the stereoscopic image display device. Here, as in the conventional case, it is preferable for the extending direction of the gate lines to be in the lateral direction of the display device. Normally, data to be displayed is inputted assuming that the gate lines are extended in the lateral direction and arranged in the vertical direction. Therefore, if the gate lines are extended in the vertical direction while being rotated by 90 degrees, the vertical direction and the lateral direction of the input data need to be changed. Thus, it becomes necessary to provide an external memory for at least one frame, which results in increasing the cost of the display device. That is, in the stereoscopic image display device, it is preferable for the image separating direction of the image separating device and the extending direction of the gate lines to be consistent.

Further, it is preferable for the storage capacitance lines CS to be arranged to extend along the image separating direction. This is because when the storage capacitance lines are arranged along the image separating direction, the image on the storage capacitance line becomes expanded by the image separating device so that the displayed image quality is deteriorated extremely. That is, it is preferable to reduce the wirings arranged along the image separating direction as much as possible, and only the data lines are arranged in this exemplary embodiment of the present invention. With this, the image quality can be improved further.

Further, in order to set the vertical numerical aperture to be constant regardless of the positions in the image separating direction, the dada lines need to be bent from the arranging direction of the gate lines. The factors for restricting the vertical numerical aperture are the structure of the slope of the bend part, the structure between the lower bottoms of the trapezoid apertures, and the structure between the upper bottoms. More specifically, as in A-A line of FIG. 3, in the vertical line cutting through the oblique-side part, the height of the oblique-side part in the Y-axis direction and the height between the lower bottoms affect the vertical numerical aperture. Further, as in B-B line of FIG. 3, in the vertical line cutting through the TFT part, the height between the upper bottoms and the height between the lower bottoms affect the vertical numerical aperture.

It is the height between the lower bottoms, which is common to both the A-A line and the B-B line. Thus, a structure for allowing the height between the lower bottoms to be the minimum will be discussed first. As described above, it is necessary to dispose at least one gate line between the lower bottoms. Then, in order to minimize the height between the lower bottoms, it is preferable to have only one gate line as a structure. For example, to have a thin film transistor disposed between the lower bottoms is not preferable, since the height between the lower bottoms becomes increased for that amount. At the A-A line in particular, the lower bottoms are disposed facing with each other. Thus, an influence of the increase in the height between the lower bottoms is tremendous. Therefore, it is necessary to avoid having structures placed between the lower bottoms as much as possible. Further, when the storage capacitance line is formed on the same layer as that of the gate line, it is preferable not to dispose the storage capacitance line between the lower bottoms. With this, it becomes possible to shorten the process while reducing the height between the lower bottoms.

Next, the height of the oblique-side part at the line A-A will be discussed. The wiring is bent in this oblique-side part, so that the height becomes increased in accordance with the extent of the bent. For example, provided that a bending angle with respect to the Y-axis direction is $\theta$ and width of the oblique-side part is WOB, the height of the oblique-side part is "WOB/sin $\theta$". For example, when $\theta$ is 30 degrees, the height of the oblique-side part becomes twice as large as the size of the width. Since the height of the oblique-side part is affected by an amount of 1/sin $\theta$-times the width, it is extremely important to keep the width of the oblique-side part small.

For keeping the width of the oblique-side part small, it is preferable not to place structures in the oblique-side part as much as possible. For example, if a thin film transistor is disposed on the oblique-side part, the width becomes increased for that amount. Thus, it is not preferable since the height becomes increased by 1/sin $\theta$ times. However, as described above, it is necessary to dispose at least a single data line. Further, when the storage capacitance line is formed on the same layer as that of the gate line, especially the storage capacitance line can be arranged by overlapping with the data line. In that case, the intersection area between the storage capacitance line CS and the data line D comes to be placed along the data line. Therefore, the height of the oblique-side part can be suppressed, thereby making it possible to improve the vertical numerical aperture.

Lastly, the height between the upper bottoms at the B-B line will be discussed. As described above, the thin film transistor cannot be arranged between the lower bottoms or in the oblique-side part. Thus, it is necessary to arrange the thin film transistor between the upper bottoms. Here, it is important to determine the layout for reducing the height between the upper bottoms. As can be clearly seen from FIG. 3, the structure that has the highest height among those placed between the upper bottoms is the thin film transistor. Therefore, it is important to reduce the height of the thin film transistor, i.e., to reduce the length in the Y-axis direction.

In this exemplary embodiment, the drain electrode and the source electrode of the thin film transistor are arranged with the gate line G interposed therebetween. In other words, the part of one of the pixels of the neighboring pixel pair, which is connected to the data line, is arranged on the other pixel side with respect to the common gate line of that neighboring pixel pair. With this, the thin film transistor can be arranged efficiently, especially when the W size of the thin film transistors is larger than the L size.

In the meantime, when the W direction of the thin film transistor is to be set in parallel to the extending direction of the gate line, it is difficult to dispose the drain electrode and the source electrode of the thin film transistor by having the gate line interposed therebetween. As a result, it becomes difficult to arrange the thin film transistor efficiently. When the gate line and the storage capacitance line are formed on the same layer in particular, it becomes necessary to provide a space between the gate line and the storage capacitance line. This deteriorates the efficiency further.

Furthermore, the thin film transistors of the two pixels configuring the neighboring pixel pair are arranged at different positions in the X-axis direction. This makes it possible to easily achieve the layout where the drain electrode and the gate electrode are arranged by having the gate line interposed therebetween. Further, the pixels configuring the neighboring pixel pair are arranged to be in a point-symmetrical relation. This point-symmetrical layout makes it easier to arrange each pixel, and the number of designing steps can be reduced.

As described in this exemplary embodiment, the highest efficiency can be achieved by disposing the storage capacitance line in the vicinity of the thin film transistor, when forming the storage capacitance. This is evident from the fact that the storage capacitance is formed between the electrode connected to the drain electrode of the thin film transistor and the electrode connected to the storage capacitance line.

Further, through disposing the silicon thin film part of the thin film transistor by stacking it over the data line D, it becomes possible to reduce an ineffective space and utilize it as a space for the storage capacitance or the like.

Figure 5:
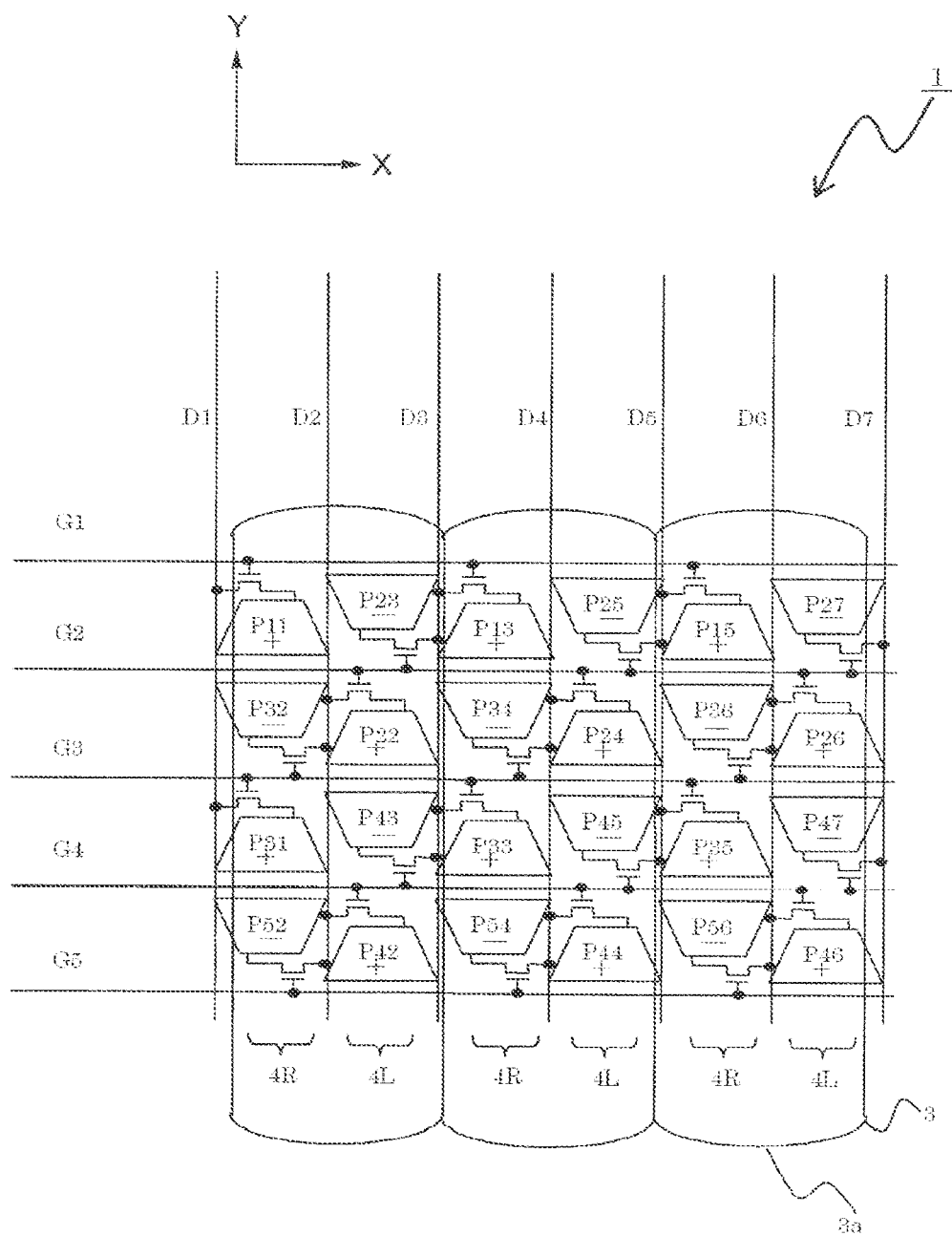
FIG. 5 is a top plan view showing polarities of each pixel in the display device according to this exemplary embodiment.

Next, described is a driving method (i.e., displaying operations) of the display device according to the exemplary embodiment structured as described above. FIG. 5 is a top plan view showing polarities of each pixel in the display device according to the exemplary embodiment. In this exemplary embodiment, the display device 1 is driven by dot inversion drive. The dot inversion drive is a driving method which inverts polarity of display data transmitted respectively to each data line with respect to the reference potential, inverts polarity of display data transmitted respectively to each gate line, and inverts polarity by each frame. The dot inversion drive is also referred to as 1H1V inversion drive, since the polarities are inverted by every single data line arranged in the horizontal direction (H direction) and every single gate line arranged in the vertical direction (V direction).

Explanations will be provided by referring to FIG. 5 which shows polarities of each pixel in a given frame obtained as a result of performing the dot inversion drive. First, when the gate lien G1 is selected, positive-polarity display data is transmitted to the data line D1, and positive-polarity voltage is written to the pixel P11. Further, negative-polarity display data is transmitted to the data line D2. Similarly, positive-polarity display data is transmitted to the data lines D3, D5, D7, and negative-polarity display data is transmitted to the data lines D4, D6. Then, when the gate line G2 is selected, the polarities of all the data lines are inverted. That is, negative-polarity display data is transmitted to the data lines D1, D3, D5, D7, and positive-polarity display data is transmitted to the data lines D2, D4, D6. Thereafter, when the gate line G3 or the gate line G5 is selected, the polarities are the same as the case of selecting the gate lien G1. When the gate line G4 is selected, the polarities are the same as the case of selecting the gate line G2. After completing this frame, the polarities are inverted further in a next frame. That is, at the time of selecting the gate lines G1, G3, G5, negative-polarity display data is transmitted to the data lines D1, D3, D5, D7, and positive-polarity display data is transmitted to the data lines D2, D4, D6. Further, at the time of selecting the gate lines G2, G4, positive-polarity display data is transmitted to the data lines D1, D3, D5, D7, and negative-polarity display data is transmitted to the data lines D2, D4, D6.

As the reference potential in the dot inversion drive, the potential of the common electrode opposing to the pixel electrode may be employed. In a strict manner, however, it is different from the reference voltage, since DC offset is applied to the common electrode potential in many cases to reduce an influence of feed-through of the thin film transistor.

Looking at the pixel group configured with right-eye pixels 4R, pixels with different polarities are arranged in the Y-axis direction, while pixels with a same polarity are arranged in the X-axis direction. This is the same for the pixel group configured with the left-eye pixels 4L. That is, a line inversion effect is achieved at each viewpoint, so that a higher image quality can be obtained compared to others such as a frame inversion effect, etc.

In this exemplary embodiment, the odd-numbered gate lines are connected to the right-eye pixels, and the even-numbered gate lines are connected to the left-eye pixels. As described, the effect of enabling the left-eye pixels or the right-eye pixels to be selected by the gate lines is extremely large. For example, in a case where display data of side-by-side format where left- and right-images are arranged side by side in the horizontal direction is inputted, it is possible to scan two gate lines successively for one row of display data. This makes it possible to reduce a memory required for temporarily saving the input data, so that the cost can be reduced. That is, in this exemplary embodiment, the driving method that successively scans the gate lines can be employed suitably for the input of the side-by-side format.

Figure 6:
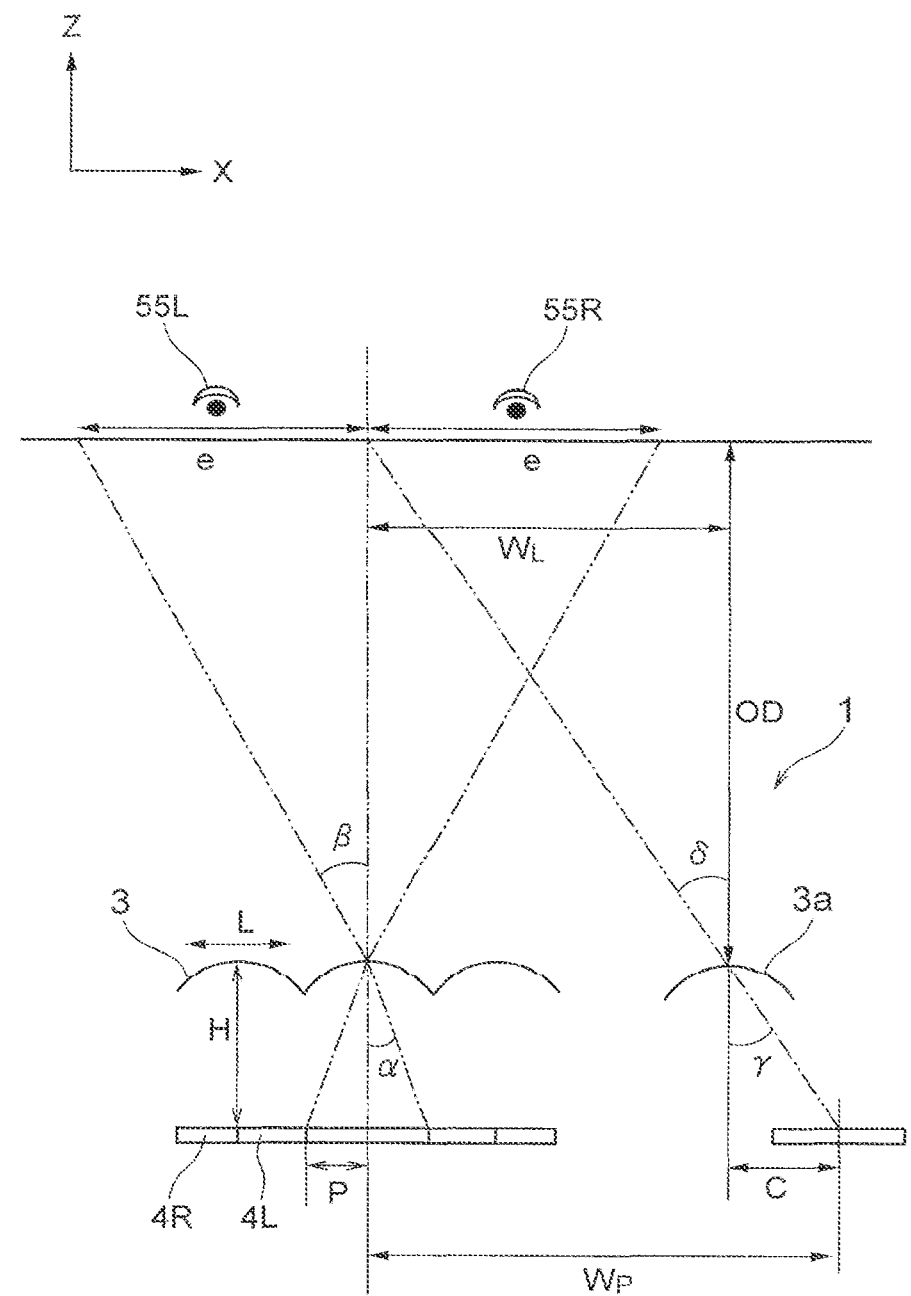
FIG. 6 is a sectional view showing an optical model of a case using a lenticular lens.

Here, an example of the structure of the stereoscopic image display device according to the exemplary embodiment and conditions for the lenticular lens to work as the image distributing device will be described in detail. In this exemplary embodiment, the image distributing device needs to distribute the light emitted from each pixel towards different directions from each other along a first direction in which the left-eye pixel and the right-eye pixel are arranged, i.e., in the X-axis direction. First, a case of exhibiting the image distributing effect to the maximum will be described by referring to FIG. 6.

It is assumed that the distance between the principle point (i.e., vertex) of the lenticular lens 3 and the pixel is H, the refractive index of the lenticular lens 3 is n, the lens pitch is L, and one each pitch of the left-eye pixel 4L or the right-eye pixel 4R is P. In this case, the arranging pitch of the pixel unit configured with one each of the left-eye pixel 4L and the right-eye pixel 4R is 2P.

Further, the distance between the lenticular lens 3 and an observer is defined as an optimum observing distance OD, a cycle of enlarged projection image of the pixel at the distance OD, i.e., a cycle of the width of the projection images of the left-eye pixel 4L and the right-eye pixel 4R on a virtual plane that is in parallel to the lens and is away from the lens by the distance OD, is defined as e for each. Further, the distance from the center of the cylindrical lens 3a located at the center of the lenticular lens 3 to the center of the cylindrical lens 3a located at the end of the lenticular lens 3 in the X-axis direction is defined as WL, and the distance between the center of the pixel unit configured with the left-eye pixel 4L and the right-eye pixel 4R located in the center of the reflection-type liquid crystal display panel 2 and the center of the pixel unit located at the end of the display panel 2 in the X-axis direction is defined as WP. Furthermore, the light incident angle and the light exit angle of the cylindrical lens 3a located in the center of the lenticular lens 3 are defined as a and 13, respectively, and the light incident angle and the light exit angle of the cylindrical lens 3a located at the end of the lenticular lens 3 in the X-axis direction are defined as γ and δ, respectively. Further, the difference between the distance WL and the distance WP is defined as C, and the number of pixels contained in the area of distance WP is defined as 2 m.

There is a mutual relationship between the arranging pitch L of the cylindrical lenses 3a and the arranging pitch P of the pixels. Thus, one of the pitches is determined depending on the other. Normally, the arranging pitch P of the pixels is taken as the constant, since the lenticular lens is designed in accordance with the display panel in many cases. Further, the refractive index n is determined depending on the selection of the material for the lenticular lens 3. In the meantime, desired values are set for the observing distance OD between the lens and the observer, and the cycles e of the pixel enlarged projection images at the observing distance OD.

The distance H between the lens vertex and the pixel as well as the lens pitch L is determined by using those values. Following Expressions 1-6 apply, according to Snell's law and geometrical relations. Further, following Expressions 7-9 apply.

$$n \times \sin \alpha = \sin \beta \quad \text{Expression 1}$$

$$OD \times \tan \alpha = e \quad \text{Expression 2}$$

$$H \times \tan \alpha = P \quad \text{Expression 3}$$

$$n \times \sin \gamma = \sin \delta \quad \text{Expression 4}$$

$$H \times \tan \gamma = C \quad \text{Expression 5}$$

$$OD \times \tan \delta = WL \quad \text{Expression 6}$$

$$WP - WL = C \quad \text{Expression 7}$$

$$WP = 2 \times m \times P \quad \text{Expression 8}$$

$$WL = m \times L \quad \text{Expression 9}$$

As mentioned above, the case of exhibiting the image distributing effect to the maximum will be discussed. This is a case where the distance H between the vertex of the lenticular lens and the pixel is set to be equal to the focal distance f of the lenticular lens. With this, Expression 10 in the following applies. Further, assuming that the curvature radius of the lens is r, the curvature radius r is obtained from Expression 11 in the followings.

$$f = H \quad \text{Expression 10}$$

$$r = H \times (n-1)/n \quad \text{Expression 11}$$

The parameters above can be summarized as follows. That is, the arranging pitch P of the pixels is a value determined depending on the display panel, and the observing distance OD and the cycles e of the pixel enlarged projection images are values determined according to the setting of the display device. The refractive index n is determined depending on the material and quality of the lens and the like. The arranging pitch L of the lenses and the distance H between the lens and the pixels calculated from those values can be the parameters for determining the positions where the light from each pixel is projected on the observing plane. The parameter that changes the image distributing effect is the curvature radius r of the lens. That is, if the curvature radius of the lens is changed from an ideal state in a case where the distance H between the lens and the pixel is fixed, the images at the pixels on the left and right become blurred. Thus, the images cannot be separated clearly. That is, it is necessary to find a range of the curvature radius with which the effective separation can be performed.

Figure 7:
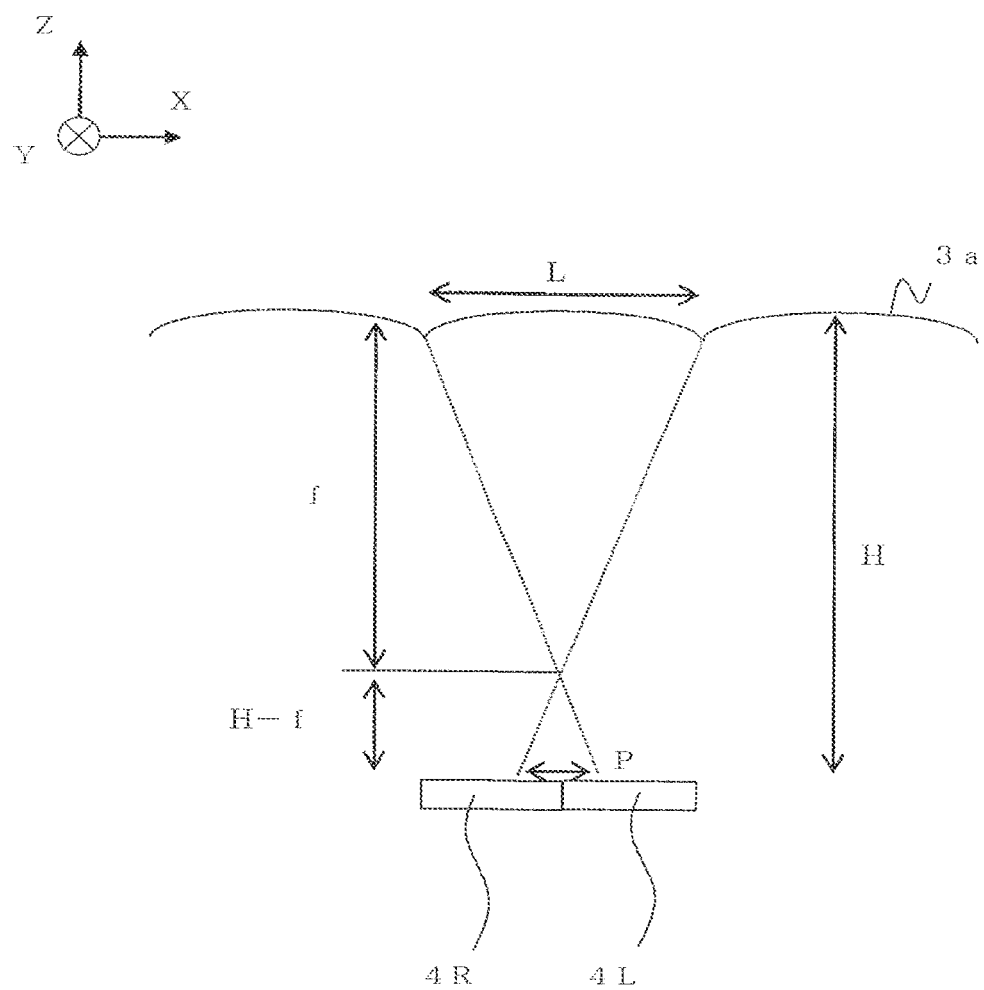
FIG. 7 is an illustration of the optical model at the time of minimum curvature radius for calculating an image separating condition of the lenticular lens.

First, the minimum value in the range of the curvature radius for producing the separating effect of the lens is calculated. As shown in FIG. 7, in order to have the separating effect, it is necessary to have a relation of similarity between a triangle having the lens pitch L as the base and the focal distance f as the height and a triangle having the pixel pitch P as the base and H-f as the height. With that, Expression 12 in the followings applies, and the minimum value of the focal distance, "fmin", can be obtained.

$$f\min = H \times L/(L+P) \quad \text{Expression 12}$$

Then, the curvature radius is calculated from the focal distance. The minimum value of the curvature radius, "rmin", can be calculated as in Expression 13 by using Expression 11.

$$r\min = H \times L \times (n-1)/(L+P)/n \quad \text{Expression 13}$$

Figure 8:
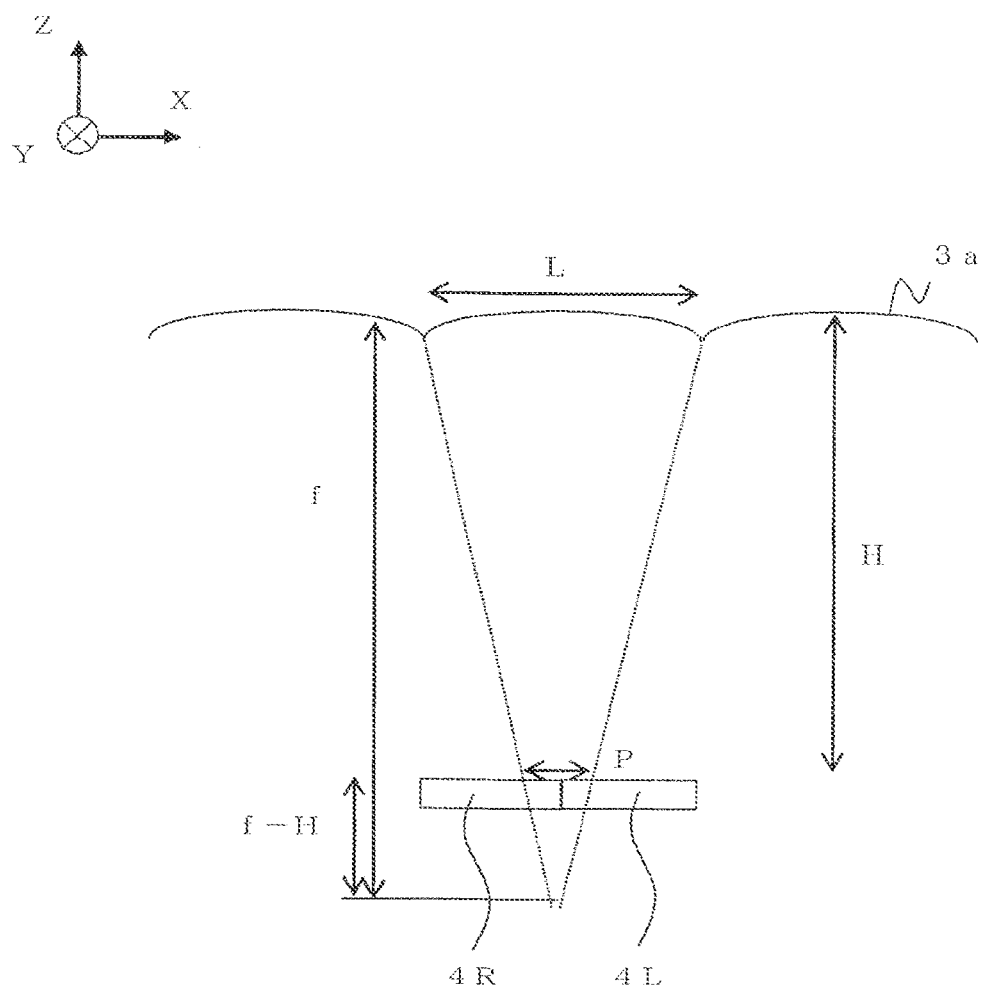
FIG. 8 is an illustration of the optical model at the time of maximum curvature radius for calculating an image separating condition of the lenticular lens.

Then, the maximum is calculated. As shown in FIG. 8, in order to have the separating effect, it is necessary to have a relation of similarity between a triangle having the lens pitch L as the base and the focal distance f as the height and a triangle having the pixel pitch P as the base and H-f as the height.

With that, Expression 14 in the followings applies, and the maximum value of the focal distance, "fmax", can be obtained.

$$f\max = H \times L/(L-P) \quad \text{Expression 14}$$

Next, the curvature radius is calculated from the focal distance. The maximum value of the curvature radius, "rmax", can be obtained as in Expression 15 by utilizing Expression 11.

$$r\max = H \times L \times (n-1)/(L-P)/n \quad \text{Expression 15}$$

In short, it is necessary for the curvature radius of the lens to fall within the range of Expression 16 obtained from Expression 13 and Expression 15, in order for the lens to achieve the image distributing effect.

$$H \times L \times (n-1)/(L+P)/n \leq r \leq H \times L \times (n-1)/(L-P)/n \quad \text{Expression 16}$$

In the above, the stereoscopic image display device of two viewpoints having left-eye pixels and right-eye pixels has been described. However, the exemplary embodiment of the present invention is not limited only to that. For example, the exemplary embodiment of the present invention can be applied to an N-viewpoint type display device in the same manner. In this case, the number of pixels contained in the area of the distance WP may be changed from "2 m" to "N×m" in the definition of the distance WP described above.

Figure 9:
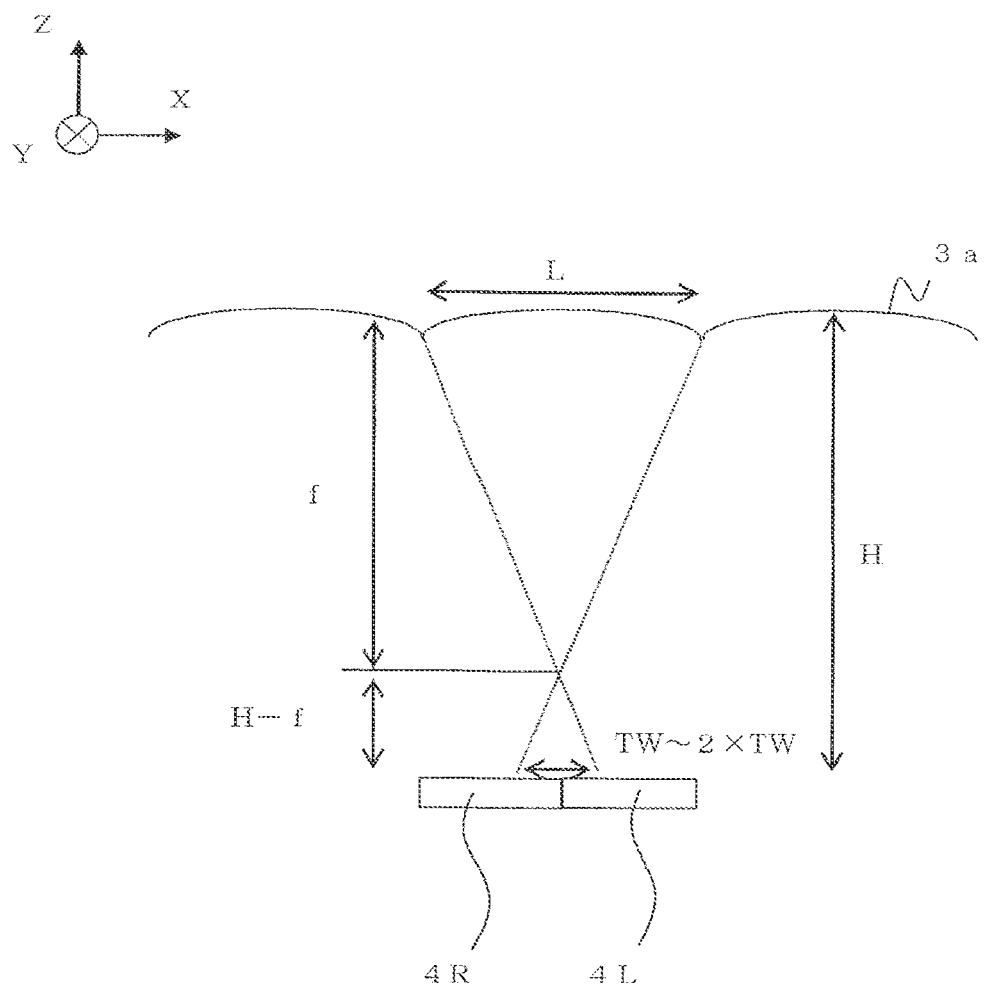
FIG. 9 is an illustration of the optical model showing a preferable range of the curvature radius in the liquid crystal display device that has trapezoid apertures.
Figure 10:
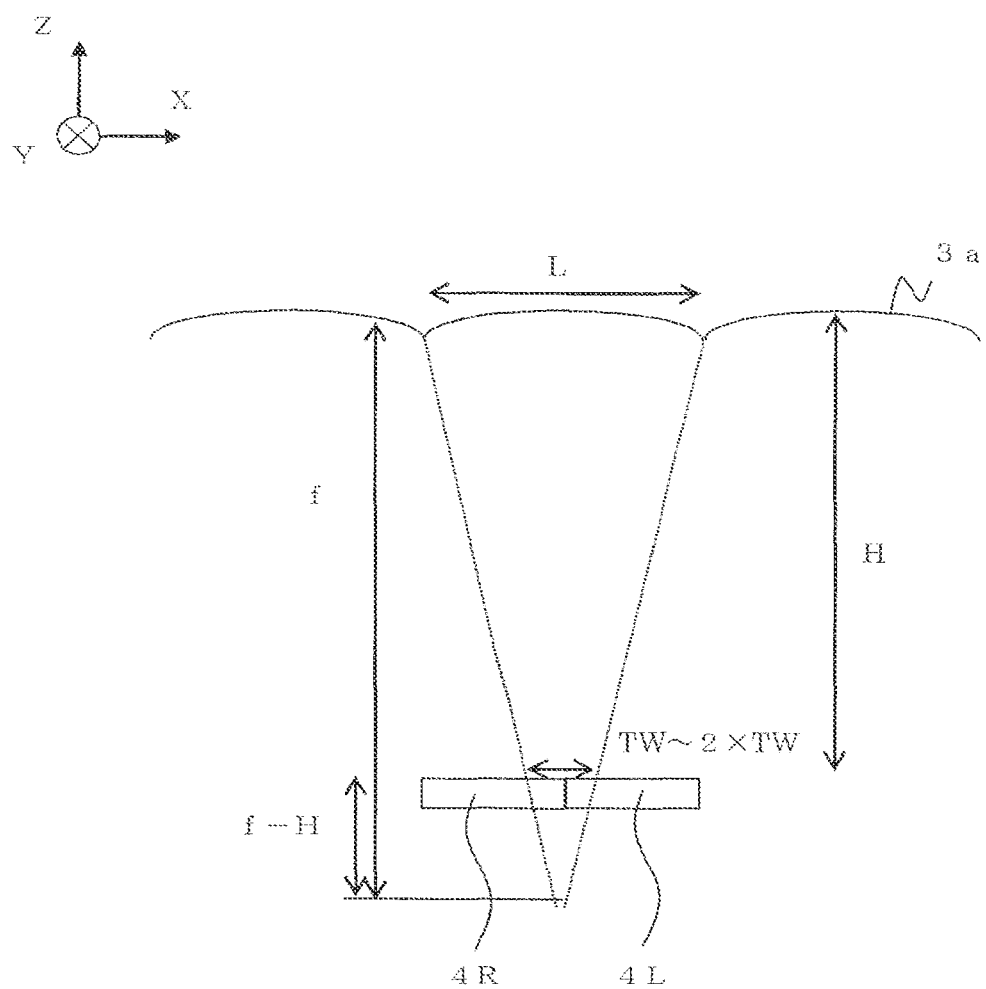
FIG. 10 is an illustration of the optical model showing a preferable range of the curvature radius in the liquid crystal display device that has the trapezoid apertures.

In order to achieve still higher image quality with the structure of the exemplary embodiment, it is preferable to have perfectly constant vertical numerical aperture regardless of the positions in the lateral direction. However, it is difficult to have the perfectly constant vertical numerical aperture in the vicinity of the vertexes of the oblique-side parts of the trapezoid apertures in particular, due to the process accuracy of the light shielding parts, etc. Thus, as shown in FIG. 9 and FIG. 10, this exemplary embodiment enables high picture quality by reducing influences of the process accuracy of the light shielding parts through arranging the focal point of the lens shifted from the pixel surface. Assuming here that the width of the oblique-side area in the X-axis direction is TW, it is preferable for a spot diameter on the pixel surface when the focal point of the lens is shifted from the pixel surface to be between TW and 2×TW, both inclusive. When the spot diameter is TW, it is a limit for the influences of the intersection points between the oblique sides and the upper bottom of the trapezoid aperture and the intersection points between the oblique sides and the lower bottom to be obscured in a composite manner. Thus, it is preferable to be set larger than that. When the spot diameter is 2×TW, the obscuring amount at the intersection points between the oblique lines and the upper bottom of the trapezoid aperture can be expanded to the positions of the intersection points between the oblique sides and the lower bottom. However, it is not preferable for the obscuring amount to become larger than this, because the separating performance of the lens starts to deteriorate. Therefore, it is preferable to set the lens curvature radius within a range with which Expression 17 and Expression 18 in the followings apply.

$$H \times L \times (n-1)/(L+2 \times TW)/n \leq r \leq H \times L \times (n-1)/(L+TW)/n \quad \text{Expression 17}$$

$$H \times L \times (n-1)/(L-TW)/n \leq r \leq H \times L \times (n-1)/(L-2 \times TW)/n \quad \text{Expression 18}$$

Furthermore, comparing the oblique sides and the lower bottom part at the A-A line to the upper bottom part and the lower bottom part at the B-B line shown in FIG. 3, the B-B line crosses the border line between the aperture and the light shielding part twice per pixel at the upper bottom and the lower bottom, whereas the A-A line crosses twice at the upper bottom and the lower bottom as well as twice at the oblique-side part per pixel (four times in total). That is, when the light shielding parts are formed in areas other than the aperture areas and if the light shielding parts are formed larger than the designed value, the vertical numerical aperture becomes deteriorated at the A-A line than at the B-B line. For example, if the only one side of the light shielding part is formed lager than the designed value by "$\Delta WOB$", the height of the vertical numerical aperture at the B-B line becomes smaller by "$2 \times \Delta WOB$". In the meantime, the height of the vertical numerical aperture at the A-A line becomes smaller by "$2 \times \Delta WOB(1+1/\sin \theta)$". As described above, the angle $\theta$ is the tilt angle of the oblique-side part with respect to the Y-axis direction.

Thus, especially in a case where it is known in advance that only the one side of the light shielding part is to be formed large by "$\Delta WOB$", it is effective to set the length of the light shielding part in the Y-axis direction in the oblique-side part to be smaller by "$2 \times \Delta WOB/\sin \theta$".

Figure 11:
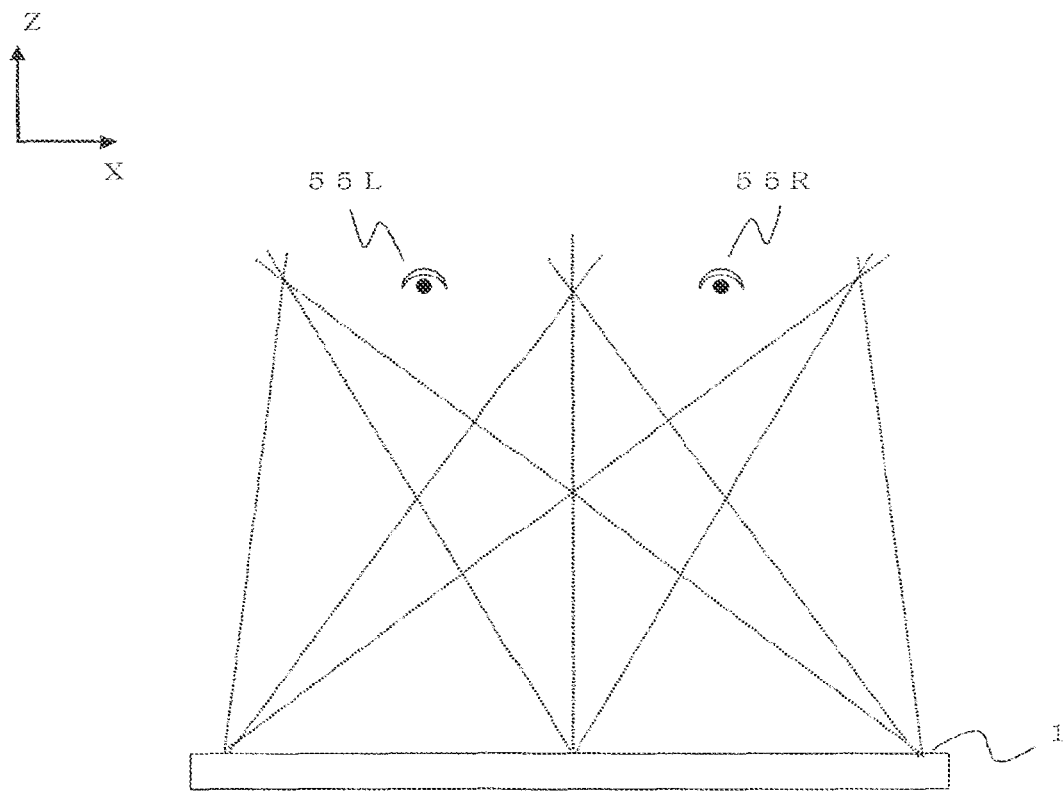
FIG. 11 is a conceptual diagram showing a light condensing system.

The explanations above are of the type which sets a plurality of viewpoints on the observing plane, and emits the light of the pixels for each viewpoint from all the pixel units on the display surface towards each of the set viewpoints. This type is also referred to as a light converging type, since it collects the light of corresponding viewpoints towards a certain viewpoint. The two-viewpoint stereoscopic image display device described above and multiple-viewpoint-type stereoscopic image display device which increases the number of viewpoints are classified as the light converging type. FIG. 11 shows a conceptual diagram of the light converging type. It is a feature of the converging type that it displays images by regenerating the light rays that make incident on the observer's eyes. The exemplary embodiment of the present invention can be effectively applied to such light converging type.

Figure 12:
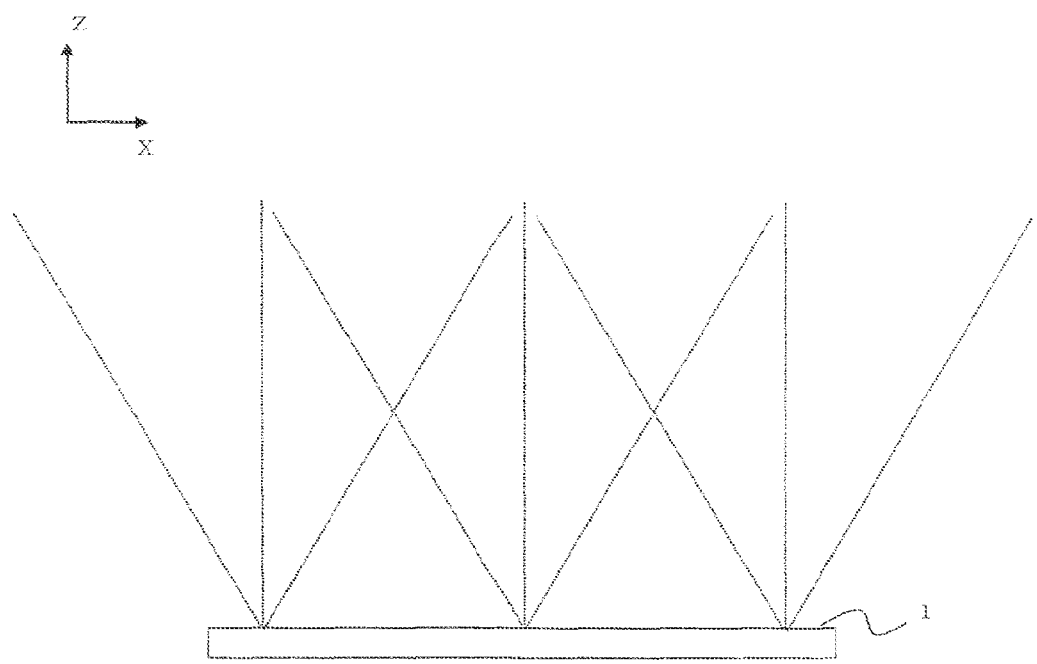
FIG. 12 is a conceptual diagram showing a spatial image system.

Further, as shown in FIG. 12, there are also proposed types such as a spatial image type and a spatial image reproducing type, a spatial image regenerating type, a spatial image forming type, and the like. Unlike the light converging type, the spatial image types do not set specific viewpoints. The spatial image types are different from the light converging type in respect that images are displayed to regenerate the light emitted from objects in the space. Stereoscopic image display devices such as an integral photography type, an integral videography type, and an integral imaging type are classified as such spatial image types. With the spatial image type, an observer at an arbitrary position does not visually recognize only the pixels for a same viewpoint on the entire display surface. However, there are plurality of kinds of areas with a prescribed width formed by the pixels for a same viewpoint. In each of those areas, the exemplary embodiment of the present invention can achieve the same effect as that of the light converging type described above. Thus, the exemplary embodiment of the present invention can also be applied to the spatial image type effectively.

Note here that the term "viewpoint" in this exemplary embodiment means as "the position from which the display device is observed (observing position)" and "a point or an area where the eyes of the user are to be located" but not "a certain point on the display area the user pays special attention (viewing point)".

For simplifying the explanations, the number of the gate lines and the number of the data lines in this exemplary embodiment are limited to the numbers required for the explanations. However, the exemplary embodiment of the present invention is not limited to such numbers, and the essential of the exemplary embodiment of the present invention is not affected by those numbers.

Further, the exemplary embodiment has been so described that the source electrode and the drain electrode of the thin film transistor become conductive, when the potential of the gate electrode becomes lower than the potential of the source electrode or the drain electrode. It is also possible to use so-called an NMOS-type thin film transistor which becomes conductive when the potential of the gate electrode becomes higher than the potential of the source electrode or the drain electrode.

Furthermore, in this exemplary embodiment, the contact holes of the pixels are formed by being shifted from the center of the pixels in the X-axis direction. It is highly probable for the viewpoints to be in the vicinity of the centers of the pixels when enlarged and projected on the observing plane by the image separating device such as a lens. If the contact holes are disposed in the vicinity of the centers of the pixels, alignment of the liquid crystal molecules may be disturbed. This may impose a bad influence on the display. Thus, when the contact holes are disposed in the vicinity of the centers of the pixels, a risk of deteriorating the display image quality is increased at most recognizable positions. Therefore, the display quality can be improved through disposing the contact holes by having those shifted from the areas in the vicinity of the centers of the pixels, as in this exemplary embodiment. Furthermore, it is also possible to prevent the X-axis coordinates of each of the contact holes from becoming consistent with each other, even if each of the pixels configuring the neighboring pixel pairs are arranged in a dot-symmetrical relation. This makes it possible to avoid having duplicated influences of a plurality of contact holes imposed at the same position on the observing plane, so that a high image quality can be obtained.

Furthermore, the exemplary embodiment has been so described that each of the pixels configuring the neighboring pixel pairs are arranged in a dot-symmetrical relation. This means that the positions of the thin film transistors of each pixel configuring the neighboring pixel pair are symmetrical in the X-axis direction with respect to the center line of the neighboring pixel pair in the X-axis direction. However, the exemplary embodiment is not limited to such case. The positions of the thin film transistors of each pixel configuring the neighboring pixel pair in the X-axis direction may be asymmetrical. With this, the thin film transistors can be positioned at different locations in each pixel, so that it is possible to avoid having duplicated influences of a plurality of thin film transistors imposed at the same position on the observing plane. Therefore, a high image quality can be obtained.

Further, the exemplary embodiment has been so described that a light shielding layer for covering the areas other than the aperture parts of the pixels may be formed on the inner side of the counter substrate. This light shielding layer may cover a part of the aperture parts of the pixels. An aperture part formed by the light shielding layer may be in a similar shape as the aperture part of the pixel, or the aperture part formed by the light shielding layer may be smaller. This makes it possible to suppress changes in the shape of the apertures even when positions of the TFT substrate and the counter substrate become shifted. As a result, a high image quality can be obtained.

Further, the connecting relation regarding the gate lines, the data lines, and the pixels in the exemplary embodiment can be expressed as follows. That is, regarding a pixel column sandwiched between two data lines among a plurality of data lines, the pixel connected to one of the data lines via a pixel switch and the pixel connected to the other data line via a pixel switch are arranged alternately. Further, regarding a pixel row sandwiched between two gate lines among a plurality of gate lines, the pixel connected to one of the gate lines via the pixel switch and the pixel connected to the other gate line via the pixel switch are arranged alternately. For such layout, it is preferable to have the data lines in the number that is one more than the number of the pixel columns. Similarly, it is preferable to have the gate lines in the number that is one more than the number of the pixel rows.

The lenticular lens according to the exemplary embodiment has been described by referring to the structure where the lens plane is arranged on the plane in the +Z direction that is the direction of the user side. However, the exemplary embodiment of the present invention is not limited to such case. The lens plane may be arranged on the plane in the −Z direction that is the direction on the display panel side. In this case, the distance between the lens and the pixels can be made shorter. Thus, it is advantageous for achieving high definition display.

Further, the pixel unit may be formed in a square. To form the pixel unit in a square means that the pitch in the X-axis direction of the pixel unit is the same as the pitch in the Y-axis direction. In other words, all the pitches for repeatedly arranging the pixel units are the same in the direction towards which the pixel units are arranged.

Further, the display panel according to the exemplary embodiment has been described as a liquid crystal display panel that utilizes liquid crystal molecules as electro-optical elements. As the liquid crystal display panel, not only a transmissive liquid crystal display panel but also a reflective liquid crystal display panel, a semi-transmissive liquid crystal display panel, a small-reflective liquid crystal display panel that has a larger proportion of the transmission area than the reflection area, a small-transmissive liquid crystal display panel that has a larger proportion of the reflection area than the transmission area, and the like can be employed. Further, the driving method of the display panel can be applied suitably to the TFT type. As the thin film transistors of the TFT type, not only those using amorphous silicon, low-temperature polysilicon, high-temperature polysilicon, or a single crystal silicon, but also those using an organic substance such as pentacene, metal oxide such as zinc oxide, or carbon nanotube may be employed suitably. Further, the exemplary embodiment of the present invention does not depend on the structure of the thin film transistor. A bottom-gate type, a top-gate type, a stagger type, an inverted stagger type, and the like may be employed suitably. Furthermore, the exemplary embodiment of the present invention can be applied to display panels other than the liquid crystal type, such as an organic electro-luminescence display panel, or a PALC (Plasma Address Liquid Crystal).

Further, a portable telephone is described as the terminal device in this exemplary embodiment. However, the exemplary embodiment of the present invention is not limited only to that, but may be applied to various kinds of terminal devices such as PDAs, personal TVs, game machines, digital cameras, digital video cameras, and notebook-type personal computers. Furthermore, the exemplary embodiment can be applied not only to the portable terminal devices but also to various kinds of fixed terminal devices such as cash dispensers, vending machines, monitors, and television receiver sets.

As an exemplary advantage according to the invention, it is possible to efficiently arrange the wirings and the thin film transistor for each of the pixels having the substantially trapezoid aperture in the display device that is provided with the image distributing optical element such as the lenticular lens or the parallax barrier. Therefore, a high image quality can be achieved.

Figure 13:
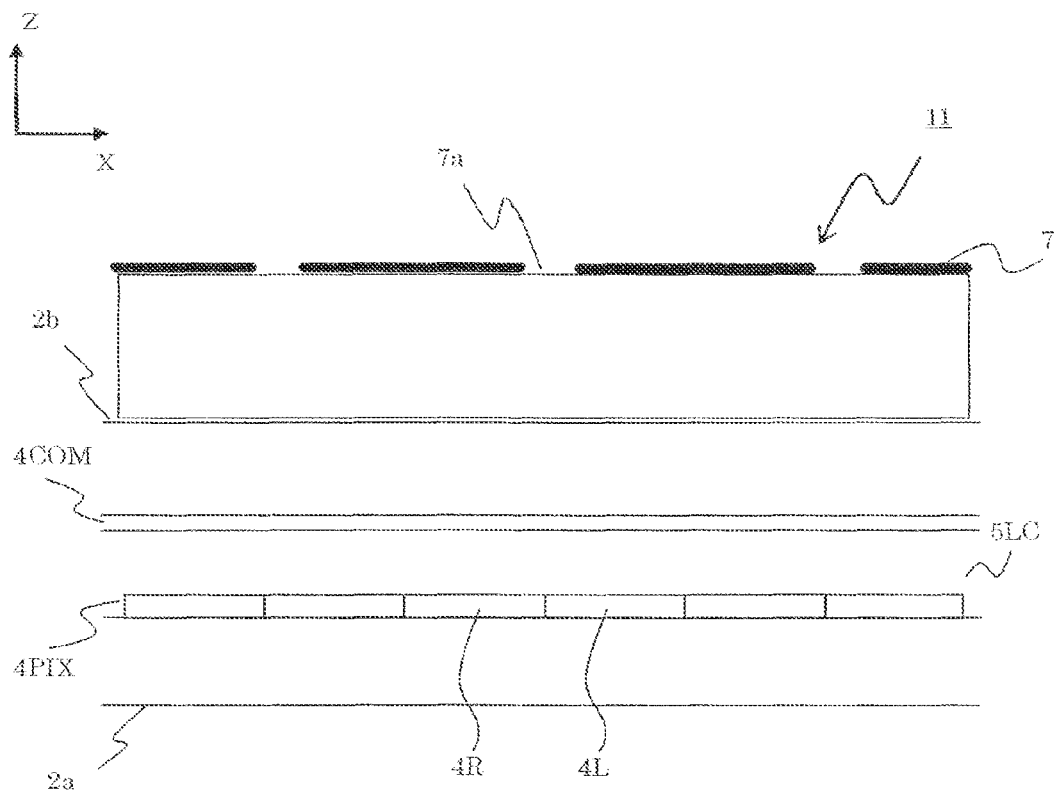
FIG. 13 is a sectional view showing a display device according to a second exemplary embodiment of the present invention.

Next, a second exemplary embodiment of the present invention will be described. FIG. 13 is a sectional view showing display device according to the second exemplary embodiment of the present invention. Compared to the first exemplary embodiment of the present invention, the second exemplary embodiment is different in respect that it uses a parallax barrier as the image distributing device instead of using the lenticular lens. As shown in FIG. 12, in a display device 11 of this exemplary embodiment, a parallax barrier 7 that is a slit array having a great number of slits 7a provided in the X-axis direction is disposed. Other structures of the second exemplary embodiment are the same as those of the first exemplary embodiment described above.

This exemplary embodiment implements reduction of the cost, since the parallax barrier can be fabricated easily by using photolithography. This is also due to the fact that the parallax barrier is in a flat two-dimensional shape, whereas the lenticular lens is in a three-dimensional shape having a structure in the height direction. However, there is no light loss caused by the image separating device, when the lenticular lens is used. Therefore, the lenticular lens type is advantageous in terms of achieving bright reflection display.

Here, conditions for the parallax barrier to work as the image distributing device will be described in detail. First, the parallax barrier system will be described by referring to FIG. 14.

The parallax barrier 7 is a barrier (light shielding plate) on which a great number of thin vertically striped openings, i.e., the slits 7a, are formed. In other words, the parallax barrier is an optical member in which a plurality of slits extending in a second direction that is orthogonal to a first direction to be the distributing direction are formed to be arranged along the first direction. When light emitted from a left-eye pixel 4L to the parallax barrier 7 transmits through the slits 7a, it turns out as a light flux that travels towards an area EL. Similarly, when light emitted from a right-eye pixel 4R to the parallax barrier 7 transmits through the slits 7a, it turns out as a light flux that travels towards an area ER. When an observer places the left eye 55L at the area EL and the right eye 55R at the area ER, the observer can recognize a stereoscopic image.

Figure 14:
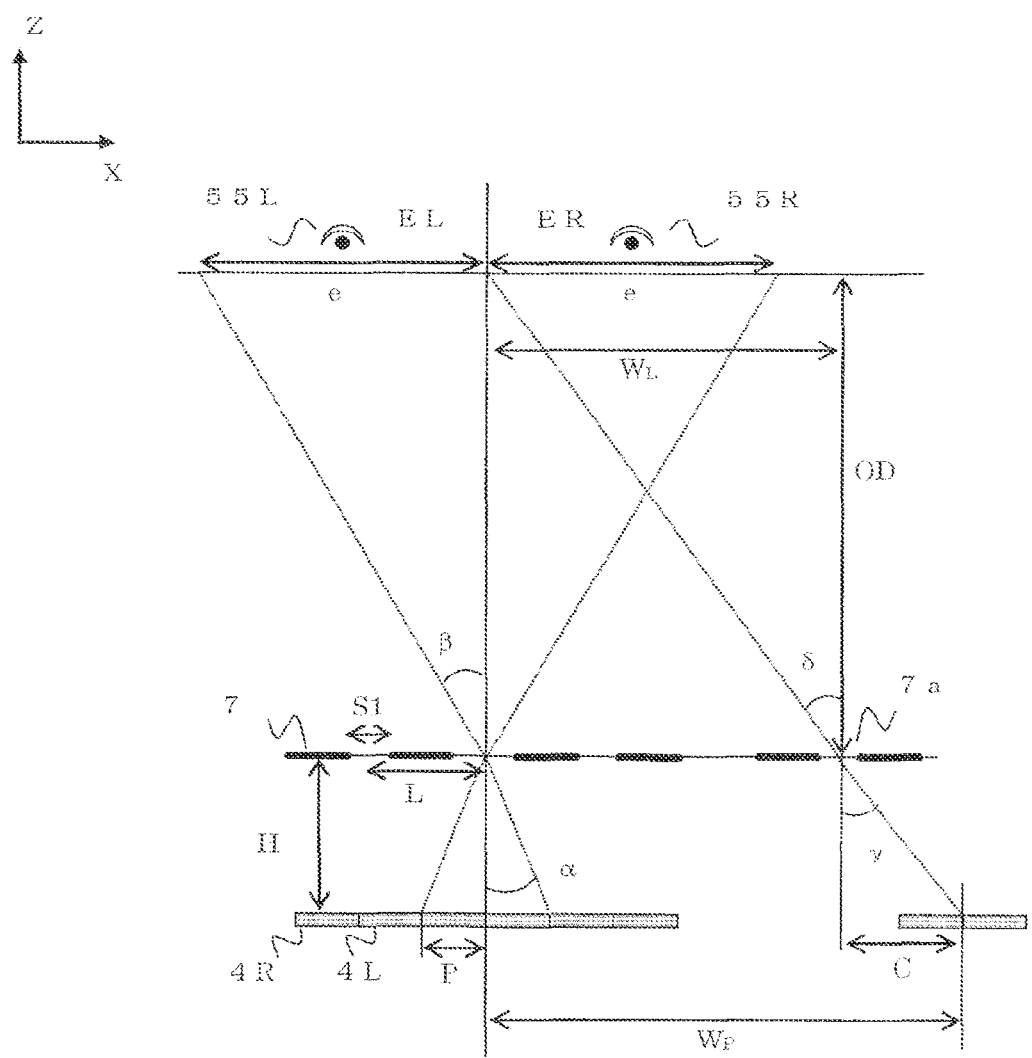
FIG. 14 is a sectional view showing an optical model of a case using a parallax barrier.

Next, a stereoscopic display device having a parallax barrier with slit-like openings formed on the front face of a display panel will be described in detail, regarding the sizes of each part. As shown in FIG. 14, an arranging pitch of the slits 7a of the parallax barrier 7 is defined as L, and distance between the parallax barrier 7 and the pixels is defined as H. Further, distance between the parallax barrier 7 and the observer is defined as an optimum observing distance OD. Furthermore, distance from the center of a slit 7a positioned at the center of the parallax barrier 7 to the center of a slit 7a positioned at the end of the parallax barrier 7 in the X-axis direction is defined as WL. The parallax barrier 7 itself is a light shielding plate, so that incident light does not transmit therethrough except for the slits 7a. However, a substrate for supporting a barrier layer is to be provided, and the refractive index of the substrate is defined as n. If there is no supporting substrate provided therein, the refractive index n may be set as "1" that is the refractive index of the air. With such definitions, the light emitted from the slit 7a is refracted according to the Snell's law when it is emitted from the substrate that supports the barrier layer. Here, the light incident angle and the light exit angle regarding the slit 7a located in the center of the parallax barrier 7 are defined as α and β, respectively, and the light incident angle and the light exit angle at the slit 7a located at the end of the parallax barrier 7 in the X-axis direction are defined as γ and δ, respectively. Further, the opening width of the slit 7a is defined as S1. There is a mutual relationship between the arranging pitch L of the slits 7a and the arranging pitch P of the pixels. Thus, one of the pitches is determined depending on the other. Normally, the arranging pitch P of the pixels is taken as the constant since the parallax barrier is designed in accordance with the display panel in many cases. Further, the refractive index n is determined depending on the selection of the material for the supporting substrate of the barrier layer. In the meantime, desired values are set for the observing distance OD between the parallax barrier and the observer, and the cycles e of the pixel enlarged projection images at the observing distance OD. The distance H between the barrier and the pixel as well as the barrier pitch L is determined by using those values. Following Expressions 19-24 apply, according to Snell's law and geometrical relations. Further, following Expressions 25-27 apply.

$$n \times \sin\alpha = \sin\beta \qquad \text{Expression 19}$$

$$OD \times \tan\beta = e \qquad \text{Expression 20}$$

$$H \times \tan\alpha = P \qquad \text{Expression 21}$$

$$n \times \sin\gamma = \sin\delta \qquad \text{Expression 22}$$

$$H \times \tan\gamma = C \qquad \text{Expression 23}$$

$$OD \times \tan\delta = WL \qquad \text{Expression 24}$$

$$WP - WL = C \qquad \text{Expression 25}$$

$$WP = 2 \times m \times P \qquad \text{Expression 26}$$

$$WL = m \times L \qquad \text{Expression 27}$$

In the above, the two-viewpoint stereoscopic image display device having left-eye pixels and right-eye pixels has been described. However, the exemplary embodiment of the present invention is not limited only to that. For example, the exemplary embodiment of the present invention can be applied to an N-viewpoint type display device in the same manner. In this case, the number of pixels contained in the area of the distance WP may be changed from "2 m" to "N×m" in the definition of the distance WP described above.

The parameters above can be summarized as follows. That is, the arranging pitch P of the pixels is a value determined depending on the display panel, and the observing distance OD and the cycles e of the enlarged projection images are values determined according to the setting of the display device. The refractive index n is determined depending on the material and quality of the supporting substrate and the like. The arranging pitch L of the slits and the distance between the parallax barrier and the pixels calculated from those values can be the parameters for determining the positions where the light from each pixel is projected on the observing plane. The parameter that changes the image distributing effect is the opening width S1 of the slits. That is, when the distance H between the barrier and the pixels is fixed, the smaller the opening width S1 of the slits becomes, the clearer the images at the pixels on the left and right sides can be separated. This is the same principle as the case of a pinhole camera. Thus, when the opening width S1 becomes larger, the images at the pixels on the left and right sides become blur. Thus, those images cannot be separated clearly.

Figure 15:
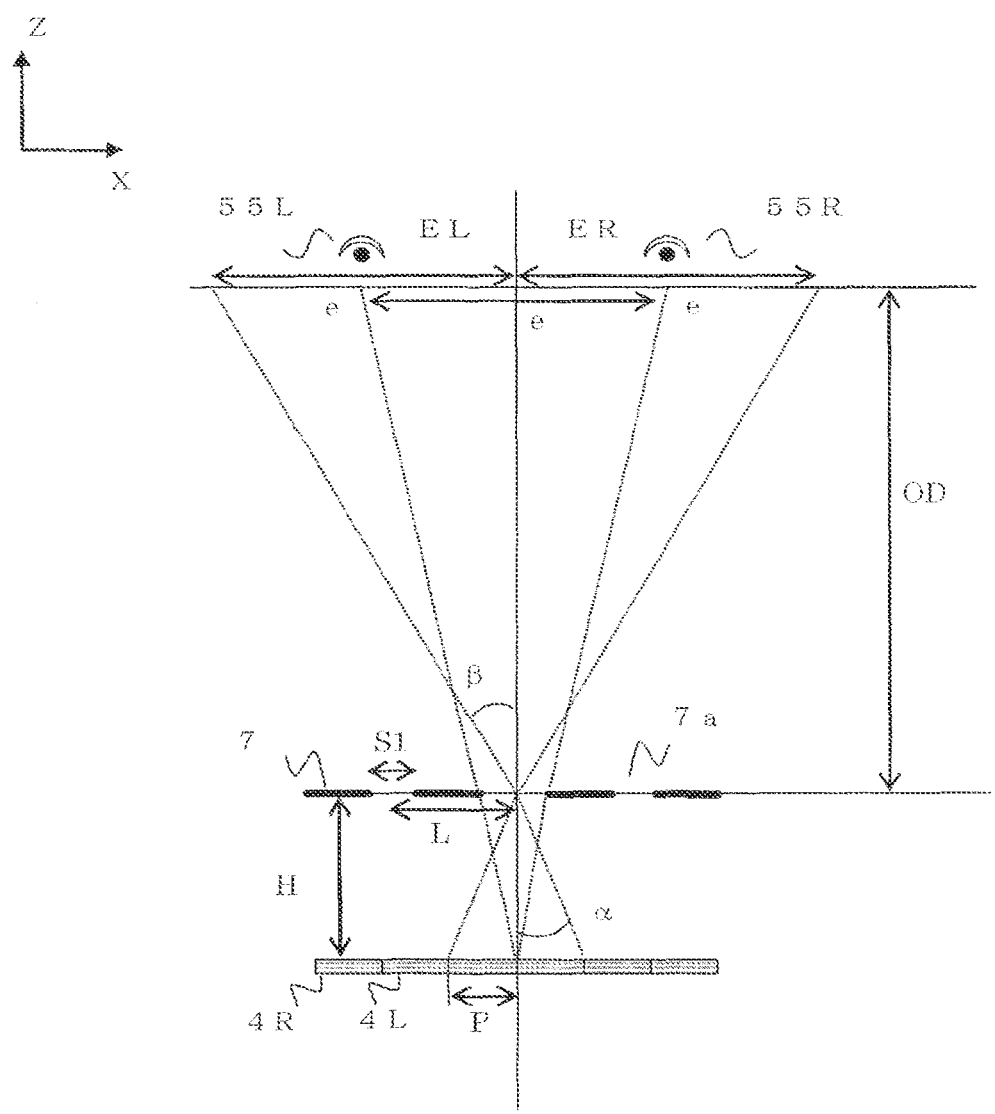
FIG. 15 is an illustration of an optical model at the time where the opening width of slits is the maximum, for calculating an image separating condition of the parallax barrier.

The range of the widths of the slits with which effective separation can be achieved by the parallax barrier can be calculated more intuitively than the case of the lens type. As shown in FIG. 15, the light emitted from the boundary between the left-eye pixel 4L and the right-eye pixel 4R is narrowed into the width S1 that is the opening width of the slit, when passing through the slit 7a. Then, it travels the distance OD and reaches the observing plane. In order to have the separating effect, the width at the observing plane needs to be equal to e or smaller. If the width becomes wider than that, it is larger than the projection cycle of the left and right pixels, so that the images cannot be separated. The opening width S1 of the slit 7a in this case is a half the slit pitch L. That is, the range of the width of the slits with which effective separation can be achieved by the parallax barrier is ½ of the slit pitch or smaller.

Effects of the second exemplary embodiment other than those described above are the same as those of the first exemplary embodiment described above.

Figure 16:
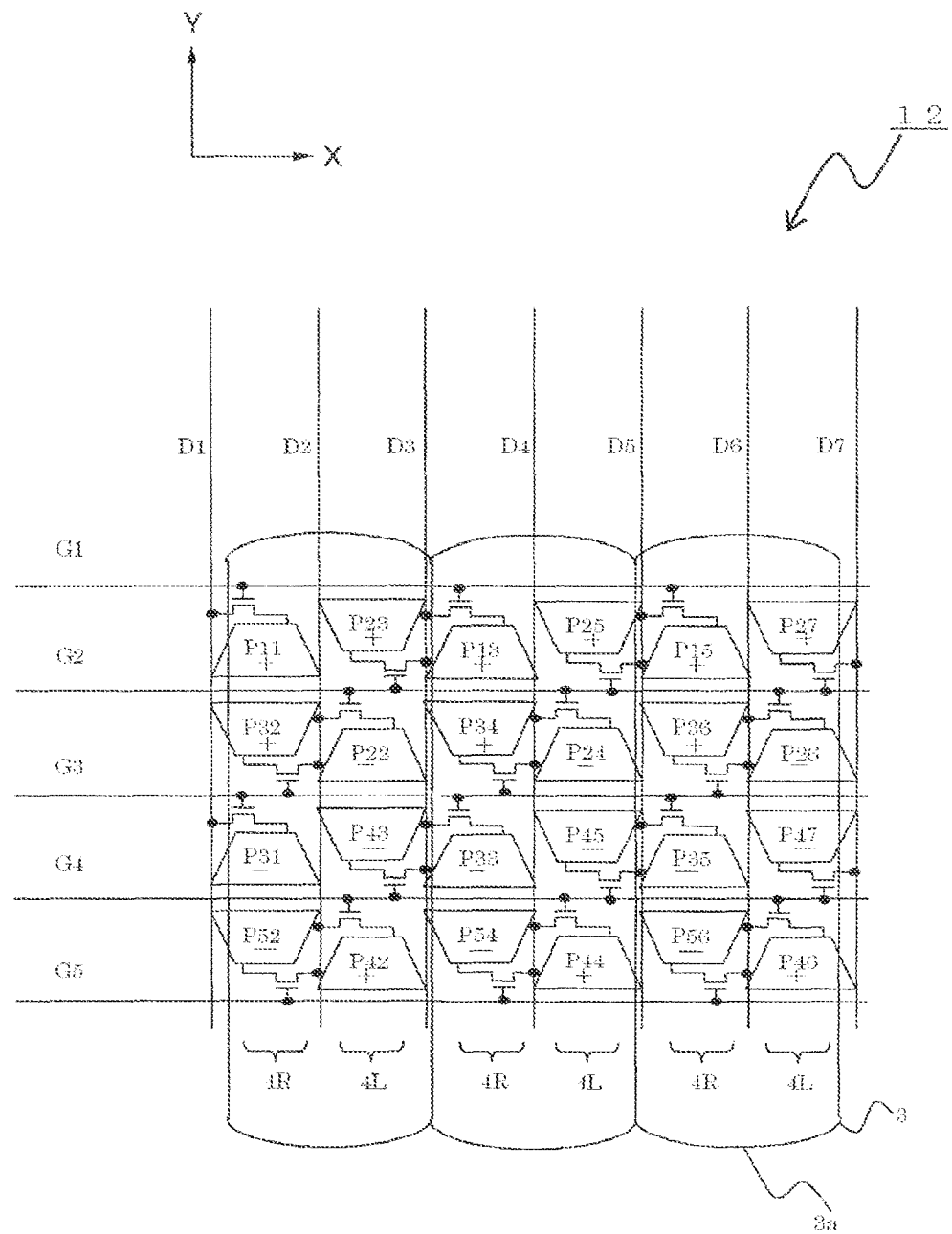
FIG. 16 is a top plan view showing polarities of each pixel in a display device according to a third exemplary embodiment of the present invention.

Next, a third exemplary embodiment of the present invention will be described. FIG. 16 is a top plan view showing polarities of each pixel in a display device according to the third exemplary embodiment of the present invention. Compared to the first exemplary embodiment of the present invention described above, the third exemplary embodiment is distinctive in respect that it employs 2-line dot inversion drive. The 2-line dot inversion drive method is a driving method which inverts polarities by every two gate lines, unlike the case of the dot inversion driving method. The 2-line dot inversion drive is also referred to as 1H2V dot inversion drive. This is because the polarities are inverted for every single data line arranged in the horizontal direction (H direction) or by every two gate lines that are arranged in the vertical direction (V direction).

That is, as shown in FIG. 16, when the gate lines G1 and G2 are selected, positive-polarity display data is transmitted to the data lines D1, D3, D5, D7, and negative-polarity display data is transmitted to the data lines D2, D4, D6. When the gate lines G3 and G4 are selected, negative-polarity display data is transmitted to the data lines D1, D3, D5, D7, and positive-polarity display data is transmitted to the data lines D2, D4, D6. Thereby, the polarity distribution as shown in FIG. 16 can be achieved. It can be seen that a 2-line inversion effect is implemented for the pixel groups configured with the right-eye pixels 4R. That is, different polarities are set for every two pixels in the Y-axis direction, and the pixels with the same polarity are arranged in the X-axis direction. This is the same for the pixel groups that are configured with the left-eye pixels 4L. Structures of the third exemplary embodiment other than those described above are the same as those of the first exemplary embodiment described above.

This exemplary embodiment is not only capable of achieving the 2-line inversion effect at each viewpoint but also capable of allowing the bottom sides of the trapezoid apertures of the pixels to be of the same polarity. This makes it possible to suppress abnormal alignment of the liquid crystal molecules in the vicinity of the bottom sides. Thus, a high image quality can be obtained. Further, the height of the light shielding part between the lower bottoms can also be reduced. Therefore, the numerical aperture can be improved so that bright display can be implemented. Effects of the third exemplary embodiment other than those described above are the same as those of the first exemplary embodiment described above.

Figure 17:
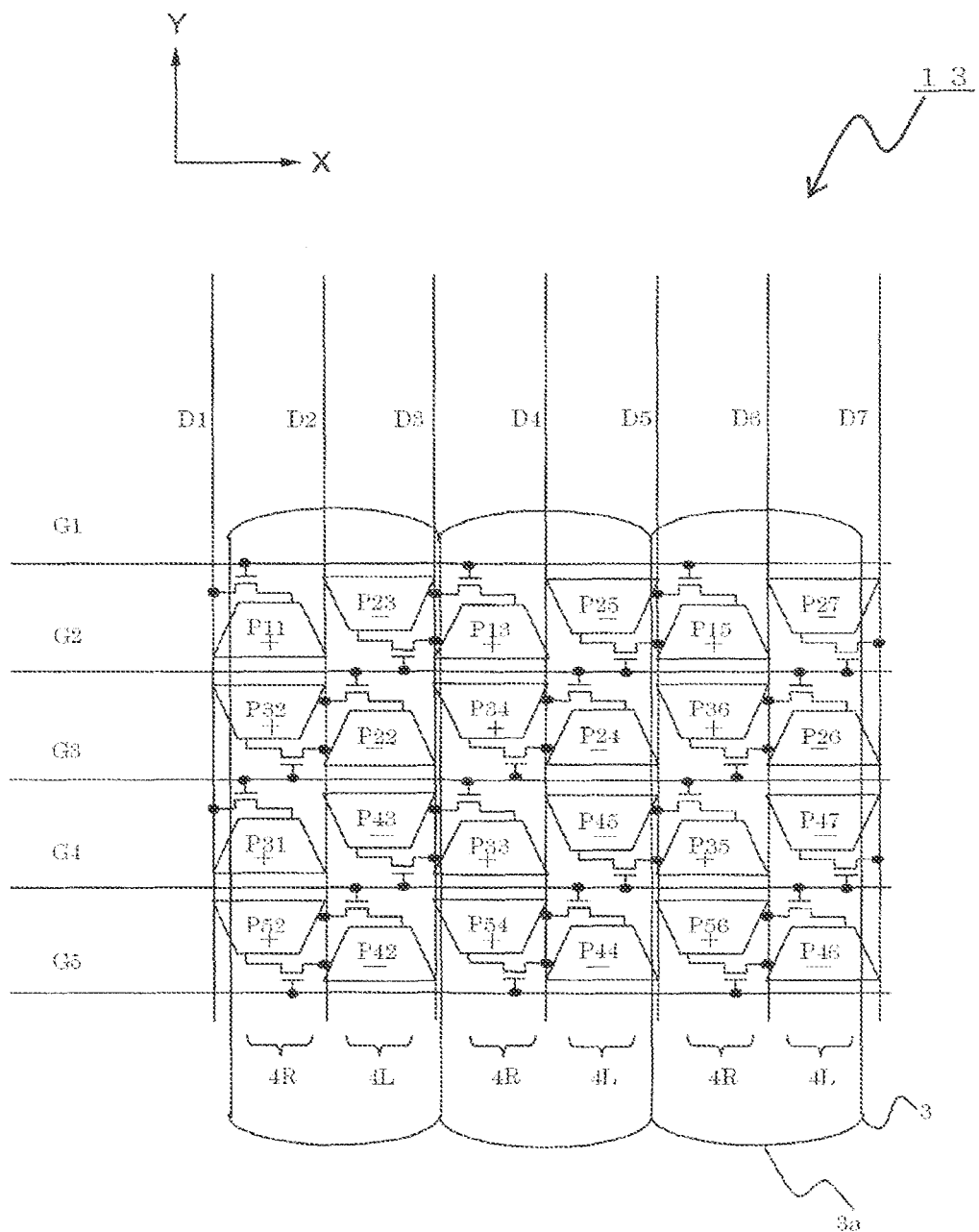
FIG. 17 is a top plan view showing polarities of each pixel in a display device according to a fourth exemplary embodiment of the present invention.

Next, a fourth exemplary embodiment of the present invention will be described. FIG. 17 is a top plan view showing polarities of each pixel in a display device according to the fourth exemplary embodiment of the present invention. Compared to the third exemplary embodiment of the present invention described above, the fourth exemplary embodiment is distinctive in respect that it employs line inversion drive. The line inversion drive is a driving method which inverts polarities for every single line. However, the data lines are configured to be in a same polarity. Through changing the potential of the counter electrode for every single line, the polarity of the display data written to the pixels can be inverted without inverting the polarity of the display data transmitted to the data lines. With this, withstanding pressure of the data line driving circuits can be reduced, so that the cost can be lowered.

As shown in FIG. 17, when the gate lines G1, G3, and G5 are selected, positive-polarity display data is written to the pixels that are connected to the data lines D1-D7. When the gate lines G2 and G4 are selected, negative-polarity display data is written to the pixels that are connected to the data lines D1-D7. Thereby, the polarity distribution as shown in FIG. 17 can be achieved. It can be seen that all the pixels are of the positive polarity, when looking at the pixel groups configured with the right-eye pixels 4R. Further, it can be seen that all the pixels are of the negative polarity, when looking at the pixel groups configured with the left-eye pixels 4L. In a next frame, the polarities are inverted, so that the pixel groups configured with the right-eye pixels 4R come to have pixels of negative-polarity (all the pixels) while the pixel groups configured with the left-eye pixels 4L come to have the pixels of positive-polarity (all the pixels). Structures of the fourth exemplary embodiment other than those described above are the same as those of the third exemplary embodiment described above.

It is possible with this exemplary embodiment to achieve the frame inversion drive effect at each viewpoint. Further, it is also possible to set the bottom sides of the trapezoid apertures of the pixels to be of the same polarity, so that a high image quality can be obtained. Effects of the fourth exemplary embodiment other than those described above are the same as those of the third exemplary embodiment described above.

Figure 18:
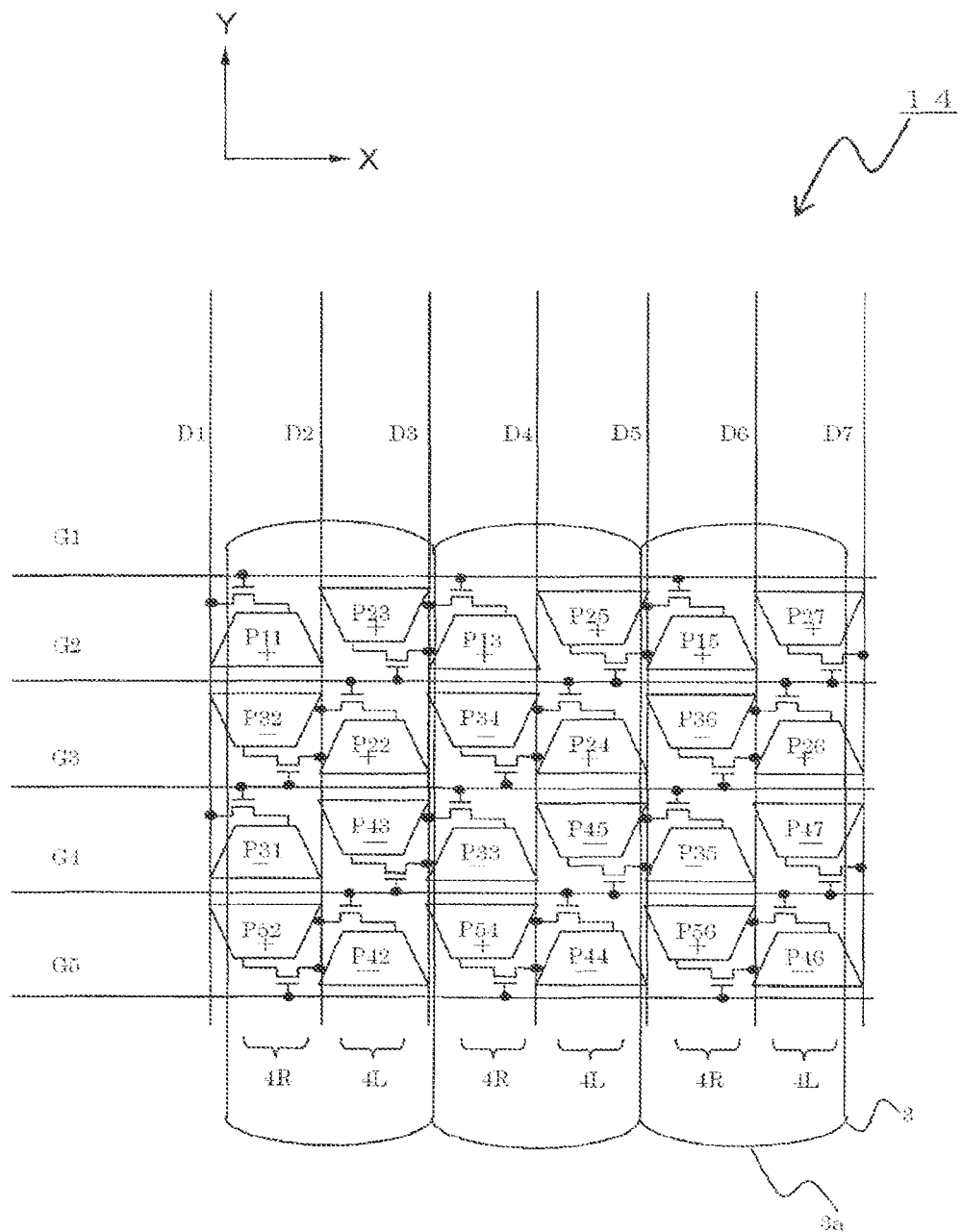
FIG. 18 is a top plan view showing polarities of each pixel in a display device according to a fifth exemplary embodiment of the present invention.

Next, a fifth exemplary embodiment of the present invention will be described. FIG. 18 is a top plan view showing polarities of each pixel in a display device according to the fifth exemplary embodiment of the present invention. Compared to the fourth exemplary embodiment of the present invention described above, the fifth exemplary embodiment is distinctive in respect that it employs 2-line inversion drive.

That is, as shown in FIG. 18, when the gate lines G1, G3, and G5 selected, positive-polarity display data is written to the pixels that are connected to the data lines D1-D7. When the gate lines G2 and G4 are selected, negative-polarity display data is written to the pixels that are connected to the data lines D1-D7. In a next frame, the positive and negative polarities are inverted. It can be seen that the pixels of the positive and negative polarities are disposed in a 2-line inversion state, when looking at the pixel groups configured with the right-eye pixels 4R. This is the same for the pixel groups configured with the left-eye pixels 4L. Structures of the fifth exemplary embodiment other than those described above are the same as those of the fourth exemplary embodiment described above.

Through employing the 2-line inversion drive, this exemplary embodiment is capable of achieving the line inversion effect (even though it is the 2-line inversion) by having the line inversion drive as the base. This makes it possible to have minute polarity distribution for each viewpoint in lines, so that a higher image quality can be achieved than the case of having only a frame inversion effect. Effects of the fifth exemplary embodiment other than those described above are the same as those of the fourth exemplary embodiment described above.

Figure 19:
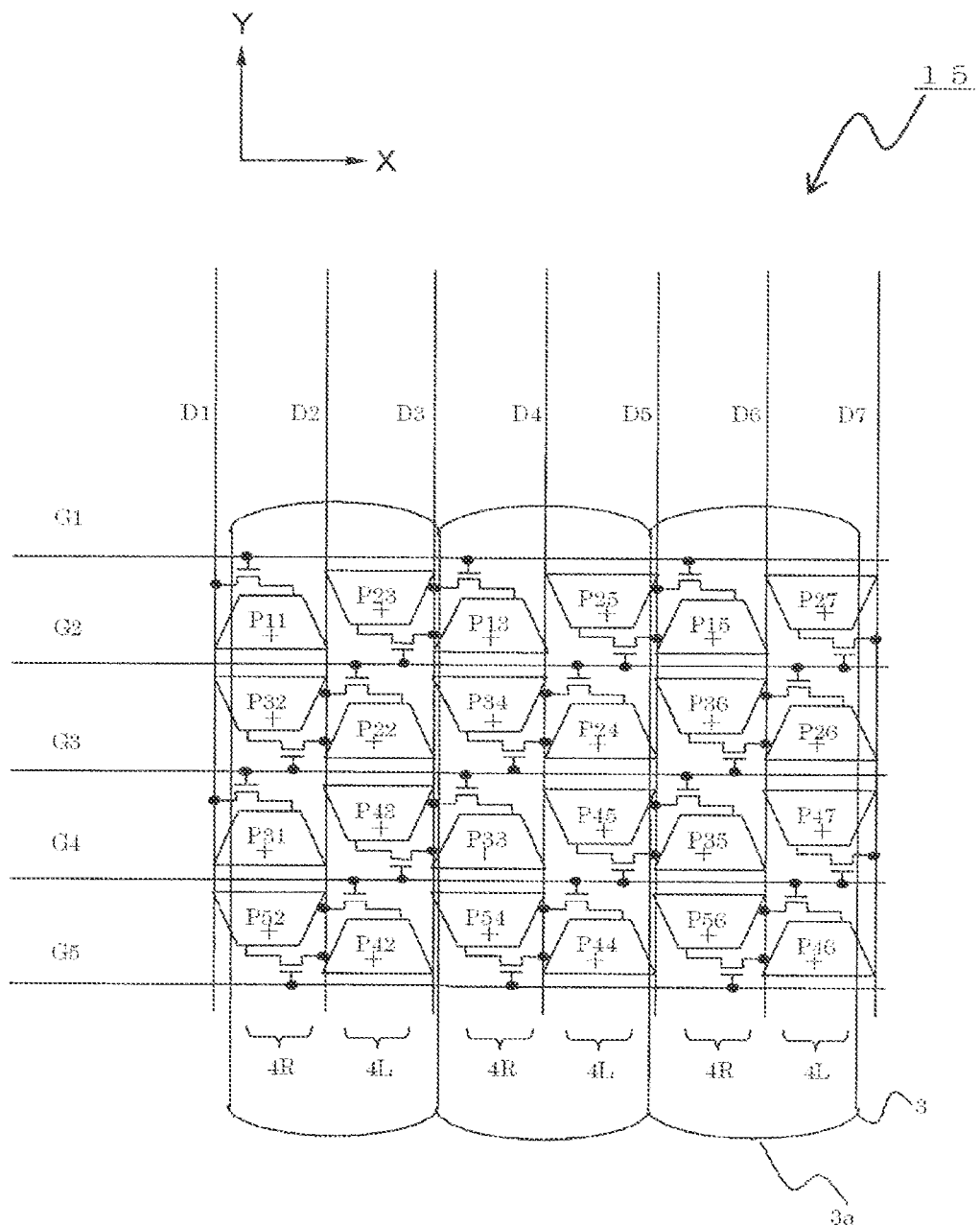
FIG. 19 is a top plan view showing polarities of each pixel in a display device according to a sixth exemplary embodiment of the present invention.

Next, a sixth exemplary embodiment of the present invention will be described. FIG. 19 is a top plan view showing polarities of each pixel in a display device according to the sixth exemplary embodiment of the present invention. Compared to the fourth exemplary embodiment of the present invention described above, the sixth exemplary embodiment is distinctive in respect that it employs frame inversion drive. The frame inversion drive is a driving method which does not invert the polarity of the data lines in a frame. That is, a same polarity is supplied to the whole surface while driving the scanning lines of a given period, and the polarity is inverted for a next period of driving the scanning lines.

That is, as shown in FIG. 19, when the gate lines G1-G5 selected, positive-polarity display data is written to the pixels that are connected to the data lines D1-D7. In a next frame, negative-polarity display data is written thereto. As a result, all the pixels of the pixel groups configured with the right-eye pixels 4R and the pixel groups configured with the left-eye pixels 4L come to have a same polarity. Structures of the sixth exemplary embodiment other than those described above are the same as those of the fourth exemplary embodiment described above.

It is possible with this exemplary embodiment to set the polarities at each viewpoint to be uniform through employing the frame inversion drive. Further, it is not only capable of setting the bottom sides of the trapezoid apertures of the pixels to be of the same polarity, but also capable of setting the oblique sides to be of the same polarity as well. Therefore, abnormal alignment of the liquid crystal molecules can be suppressed, so that a high image quality can be obtained.

It is not possible with this exemplary embodiment to achieve a uniform effect, such as the line inversion effect or the dot inversion effect by spatially distributing the polarities. Thus, the display quality may be improved by achieving a uniform effect in terms of the time axis by increasing the frame frequency (double speed, in particular). The frame frequency effective for that is 70 Hz or higher. Effects of the sixth exemplary embodiment other than those described above are the same as those of the fourth exemplary embodiment described above.

Figure 20:
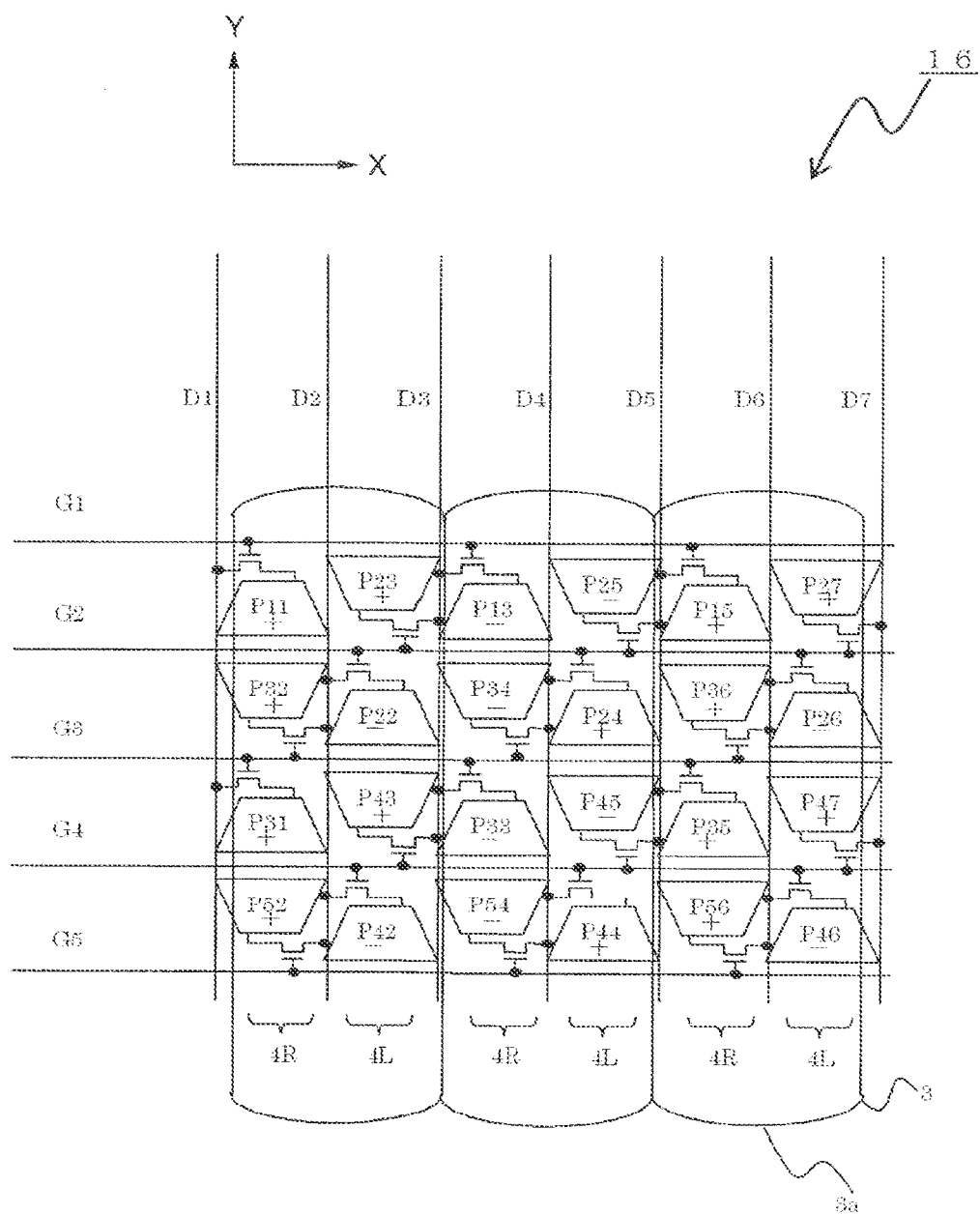
FIG. 20 is a top plan view showing polarities of each pixel in a display device according to a seventh exemplary embodiment of the present invention.

Next, a seventh exemplary embodiment of the present invention will be described. FIG. 20 is a top plan view showing polarities of each pixel in a display device according to the seventh exemplary embodiment of the present invention. Compared to the first exemplary embodiment of the present invention described above, the seventh exemplary embodiment is distinctive in respect that it employs 2H1V inversion drive.

The 2H1V inversion drive is a driving method which inverts the polarity of the data lines by a 2-line unit, and inverts the polarity of the gate line for every single line.

That is, as shown in FIG. 20, when the gate line G1 is selected, positive-polarity display data is written to the pixels that are connected to the data lines D1, D2, D5, D6, and negative-polarity display data is written to the pixels that are connected to the data lines D3, D4, D7. Then, when the gate line G2 is selected, negative-polarity display data is written to the pixels that are connected to the data lines D1, D2, D5, D6, and positive-polarity display data is written to the pixels that are connected to the data lines D3, D4, D7. In a next frame, display data of inverted polarities are written to the respective data lines. As a result, a column inversion effect can be achieved with the pixel groups that are configured with the right-eye pixels 4R, in which pixels of the same polarity are arranged in the vertical direction and pixels of different polarity thereof are arranged in the lateral direction. In the meantime, a dot inversion effect can be achieved with the pixel groups that are configured with the left-eye pixels.

Here, the storage capacitance line will be considered. The storage capacitance line placed between the gate lines G1 and G2 in particular is connected to the pixels P11, P23, P13, P25, P27, and P17. When the gate line G1 is selected, the display data is written to the pixels P11, P13, and P17. When the 2H1V inversion drive is employed, the positive-polarity data is written to the pixel P11, the negative-polarity display data is written to the pixel P13, and the positive-polarity display data is written to the pixel P17. As mentioned above, a plurality of pixels which are connected to each storage capacitance line and have the display data written thereto when the gate line is selected include the pixels to which the positive-polarity display data is written and the pixels to which the negative-polarity display data is written. Structures of this exemplary embodiment other than those described above are the same as those of the first exemplary embodiment described above.

In this exemplary embodiment, it is possible to achieve the dot inversion effect at least for one of the viewpoints even though the inversion effects differ for the left pixel groups and right pixel groups. Thus, a high image quality can be achieved at least for one viewpoint. Normally, human beings can utilize information with a better visually recognized condition, when the visually recognized conditions of the left and right eyes vary. For example, when the eyesight is different between both eyes, a video perceived by the eye of better eyesight is recognized, and particularly the fine part is compensated. When the display of the dot inversion effect visually recognized by the left eye is better than the display of the column inversion effect visually recognized by the right eye, it is possible with the exemplary embodiment to utilize the better display of the left eye to improve the display quality to be visually recognized. As mentioned, the quality as a whole can be improved through improving the display quality even just for one of the eyes rather than having deteriorated display quality for both eyes.

Further, it is possible with this exemplary embodiment to suppress fluctuation of the potential of the storage capacitance line when writing the display data to each pixel. This is because not only the pixels to which the positive-polarity display data is written but also the pixels to which the negative-polarity display data is written are connected to each storage capacitance line. This makes it possible to prevent the potential of the storage capacitance line from being fluctuated to one of the polarities, so that high quality display can be achieved by decreasing lateral-direction crosstalk and the like. Effects of the seventh exemplary embodiment other than those described above are the same as those of the first exemplary embodiment described above.

Figure 21:
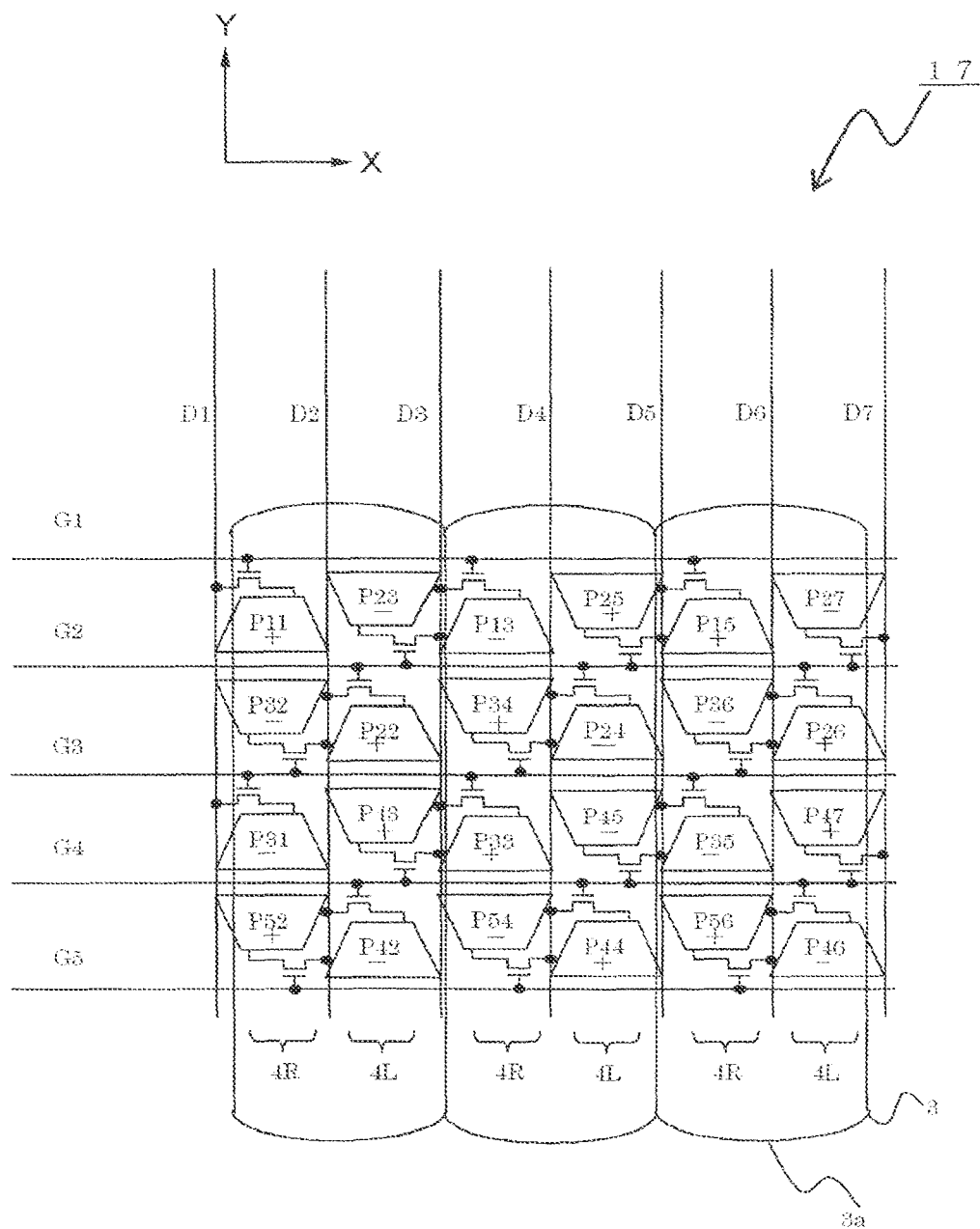
FIG. 21 is a top plan view showing polarities of each pixel in a display device according to an eighth exemplary embodiment of the present invention.

Next, an eighth exemplary embodiment of the present invention will be described. FIG. 21 is a top plan view showing polarities of each pixel in a display device according to the eighth exemplary embodiment of the present invention. Compared to the seventh exemplary embodiment of the present invention described above, the eighth exemplary embodiment is distinctive in respect that it employs 2H2V inversion drive. The 2H2V inversion drive is a driving method which inverts the polarity of the data lines by a 2-line unit, and inverts the polarity of the gate line by a 2-line unit as well.

That is, as shown in FIG. 21, when the gate line G1 is selected, positive-polarity display data is written to the pixels that are connected to the data lines D1, D2, D5, D6, and negative-polarity display data is written to the pixels that are connected to the data lines D3, D4, D7. This is the same when the gate line G2 is selected. Then, when the gate line G3 is selected, negative-polarity display data is written to the pixels that are connected to the data lines D1, D2, D5, D6, and positive-polarity display data is written to the pixels that are connected to the data lines D3, D4, D7. This is the same when the next gate line G4 is selected. In a next frame, display data of inverted polarities are written to the respective data lines. As a result, the pixel groups configured with the right-eye pixels 4R are in a polarity distribution with which the 2-line dot inversion (1H2V dot inversion) effect can be achieved. This is the same for the pixels groups that are configured with the left-eye pixels 4L. Structures of the eighth exemplary embodiment other than those described above are the same as those of the first exemplary embodiment described above.

With this exemplary embodiment, the pixel groups of the pixels for each viewpoint can all have the 2-line dot inversion effect. Therefore, the display quality can be improved. Further, as in the case of the seventh embodiment, fluctuation of the potential of each storage capacitance line can be suppressed.

As described in the third exemplary embodiment and the fifth exemplary embodiment, with the pixel structure according to the exemplary embodiment of the present invention, 2V inversion drive which inverts the polarity by every two gate lines can be combined suitably. Effects of the eighth exemplary embodiment other than those described above are the same as those of the first exemplary embodiment described above.

Figure 22:
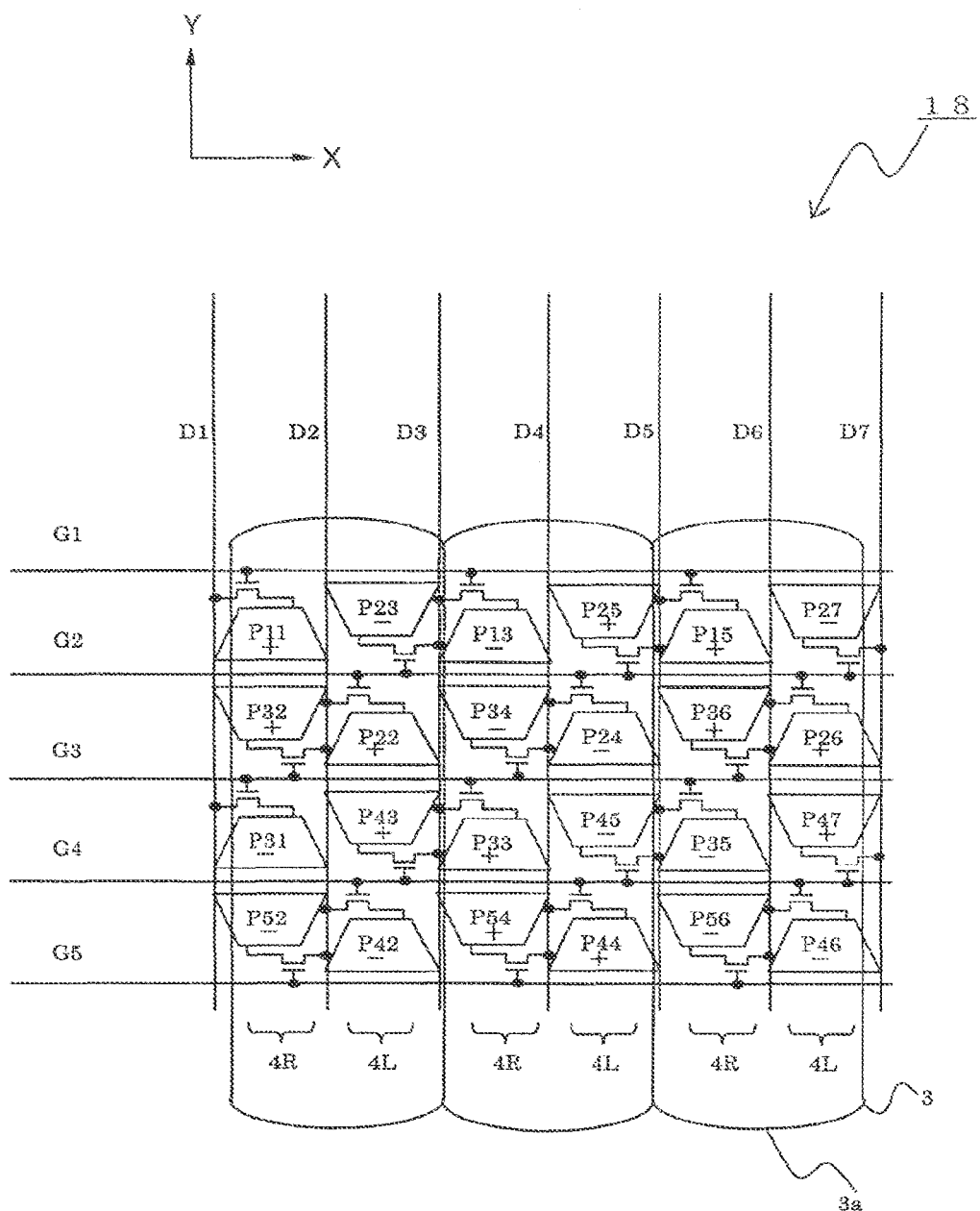
FIG. 22 is a top plan view showing polarities of each pixel in a display device according to a ninth exemplary embodiment of the present invention.
Figure 23:
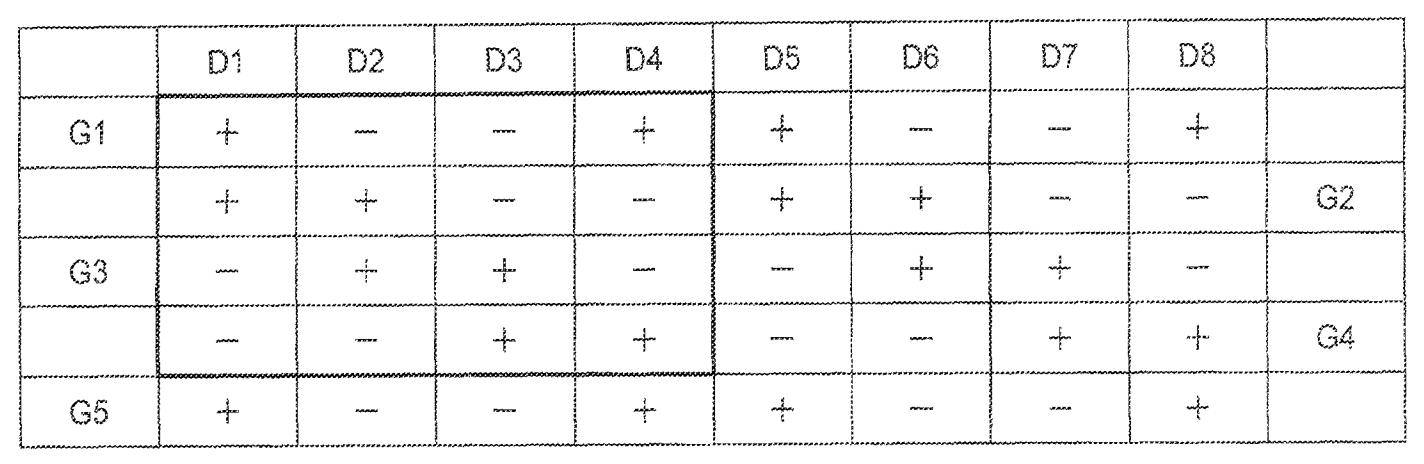

Next, a ninth exemplary embodiment of the present invention will be described. FIG. 22 is a top plan view showing polarities of each pixel in a display device according to the ninth exemplary embodiment of the present invention, and FIG. 23 is a table showing polarities of data lines when respective gate lines are being selected in the display device according to this exemplary embodiment. Compared to the first exemplary embodiment of the present invention described above, the ninth exemplary embodiment is distinctive in respect that it employs a driving method which uses 2H1V inversion drive as a base, and shifts a block of the same polarity successively.

That is, as shown in FIG. 22 and FIG. 23, when the gate lien G1 is selected, positive-polarity display data, negative-polarity display data, negative polarity display data, and positive-polarity display data are written, respectively, to the pixels connected to the data lines D1-D4. This set is written repeatedly to the pixels in the data line direction. That is, positive-polarity display data, negative-polarity display data, and negative polarity display data are written, respectively, to the pixels connected to the data lines D5-D7. Considering the data lines D1-D4, the polarities of the display data written thereto are "positive, positive, negative, negative" when the gate lines G2 is selected, "negative, positive, positive, negative" when the gate line G3 is selected, and "negative, negative, positive, positive" when the gate line G4 is selected. Under the selection of the gate line G5 and thereafter, the operations executed at the time of selecting the gate lines G1-G4 are repeated. That is, the polarity distribution shown with a thick frame in FIG. 23 is repeated in the X-axis direction and the Y-axis direction. This exemplary embodiment employs, as the base, 2H1V inversion drive which inverts the polarity of the data lines by a 2-line unit, and inverts the polarity of the gate line for every single line. However, the driving method of this exemplary embodiment is distinctive in respect that the polarity distribution of each gate line becomes shifted for every single data line, compared to the 2H1V inversion drive. In other words, for the state where an odd-numbered gate line is selected and the state where an even-numbered gate line is selected, the polarity of the display data transmitted to the data line is shifted by a single data line.

As a result, the pixel groups configured with the right-eye pixels 4R are in a polarity distribution with which the 2-line dot inversion (1H2V dot inversion) effect can be achieved. This is the same for the pixel groups that are configured with the left-eye pixels 4L. Structures of the ninth exemplary embodiment other than those described above are the same as those of the first exemplary embodiment described above.

With this exemplary embodiment, the polarity distribution for each viewpoint can all have the 2-line dot inversion effect. Further, it is possible to suppress fluctuation in the potential of each storage capacitance line and to set the polarities of the pixels having the bottom sides of the trapezoid apertures neighboring to each other to be the same. Thereby, the display quality can be improved.

With this exemplary embodiment, especially a driving method which scans every other gate line can be employed suitably. That is, when odd-numbered gate lines are selected successively, normal 2H1V inversion drive may be employed. When even-numbered gate lines are selected successively, 2H1V inversion drive may be employed while shifting a block of same polarity for one column. A drive IC capable of normal 2H1V inversion drive is provided with an optional function that can control the block of same polarity, so that the normal 2H1V inversion drive can be utilized easily. It is preferable for the scanning of the odd-numbered gate lines and the even-numbered gate lines to be completed within a frame period. That is, not the simple interlace drive but the double-speed interlace drive is preferred.

Further, regarding gate line driving circuits for driving the gate lines, the odd-numbered gate lines and the even-numbered gate lines may be connected to different gate line driving circuits. This makes it easier to scan the gate lines by every other line.

Furthermore, as the display image input format according to the exemplary embodiment, a format where left and right images are arranged in the vertical direction or a format where left and right images are arranged in a time-series manner can be employed suitably. As described above, when only the odd-numbered gate lines are selected successively, it is possible to write the display data only to the pixels that displays the image for the right eye. Then, by selecting only the even-numbered gate lines successively, it is possible to write the display data only to the pixels that displays the image for the left eye. In this manner, the driving method which writes the display data only to the pixels for a same viewpoint can be employed suitably for the format with which image information for the same viewpoint is inputted consecutively, so that the driving circuits can be simplified. Effects of the ninth exemplary embodiment other than those described above are the same as those of the first exemplary embodiment described above.

Figure 24:
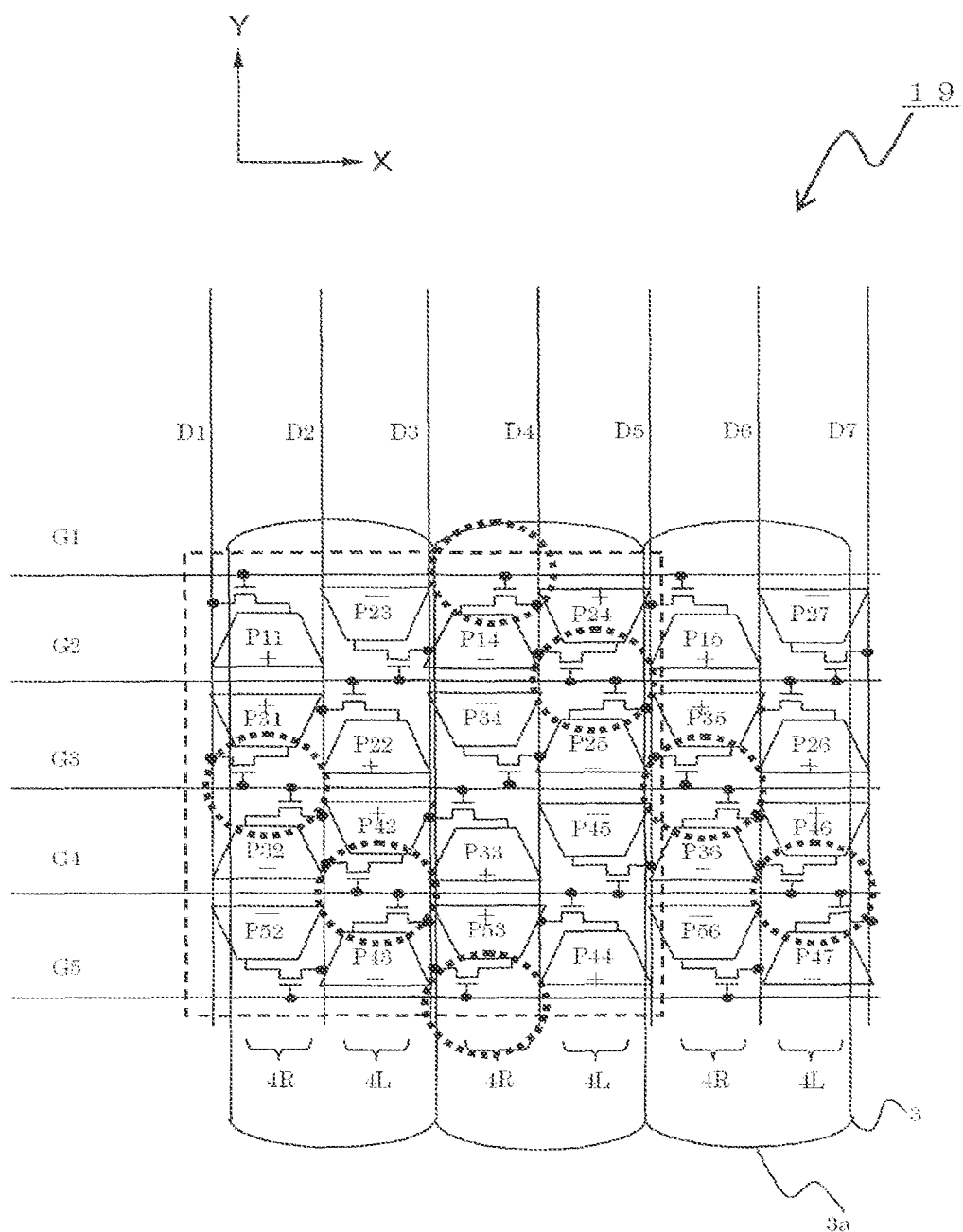
FIG. 24 is a top plan view showing polarities of each pixel in a display device according to a tenth exemplary embodiment of the present invention.

Next, a tenth exemplary embodiment of the present invention will be described. FIG. 24 is a top plan view showing polarities of each pixel in a display device according to the tenth exemplary embodiment of the present invention. Compared to the first exemplary embodiment of the present invention described above, the tenth exemplary embodiment is distinctive in respect that it has neighboring pixel pairs arranged in a line-symmetrical relation.

That is, as shown in FIG. 24, regarding the neighboring pixel pair configured with the pixel P22 and P23, the pixel P22 located on the −Y direction side with respect to the common gate line G2 is connected to the data line D2 that is located in the −X direction, while the pixel P23 located on the +Y direction side with respect to the gate line G2 is connected to the data line D3 that is located in the +X direction. That is, regarding this neighboring pixel pair, when each of the pixels is arranged vertically by having a common gate line interposed therebetween, the upper-side pixel is connected to the right-side data line.

In the meantime, regarding the neighboring pixel pair configured with the pixel P31 and P32, the pixel P32 located on the −Y direction side with respect to the common gate line G3 is connected to the data line D2 that is located in the +X direction, while the pixel P31 located on the +Y direction side with respect to the gate line G3 is connected to the data line D1 that is located in the −X direction. That is, regarding this neighboring pixel pair, when each of the pixels is arranged vertically by having a common gate line interposed therebetween, the upper-side pixel is connected to the left-side data line. In FIG. 24, the neighboring pixel pairs whose upper-side pixel is connected to the left-side data line are circled with dotted lines. Regarding the pixel columns neighboring to each other in the +X direction, the neighboring pixel pairs whose upper-side pixel is connected to the left-side data line are arranged for the gate lines that are neighboring to each other in the −Y direction. As a result, the same-type neighboring pixel pairs are to be arranged in an oblique direction. From another point of view, in this exemplary embodiment, it can be also expressed that the neighboring pixel pairs whose upper-side pixels are connected to the left-side data line and the neighboring pixel pairs whose upper-side pixels are connected to the right-side data line are disposed. Furthermore, these two kinds of neighboring pixel pairs are in a line-symmetrical relation with respect to a segment extending in the Y-axis direction as well as a segment extending in the X-axis direction. That is, the two kinds of the neighboring pixel pairs are arranged to be in a line-symmetrical relation with respect to the extending direction of the gate lines or to the orthogonal direction thereof.

Regarding the driving method, the tenth exemplary embodiment employs the dot inversion drive as in the case of the first exemplary embodiment described above. As a result, the pixel groups configured with the right-eye pixels 4R are in a polarity distribution with which the 2-line dot inversion (1H2V dot inversion) effect can be achieved. This is the same for the pixel groups that are configured with the left-eye pixels 4L. The base set in the polarity distribution of this exemplary embodiment has a sixteen pixel in total (four pixels in the X-axis direction, four pixels in the Y-axis direction), and it is shown in FIG. 24 by being surrounded by a broken line.

Structures of the tenth exemplary embodiment other than those described above are the same as those of the first exemplary embodiment described above.

In this exemplary embodiment, by using the normal dot inversion drive, it is possible with the tenth exemplary embodiment to achieve the 2-line dot inversion effect as well as the effect of suppressing the fluctuation of the potentials in each storage capacitance line, and to set the polarities of the pixels having bottom sides of the trapezoid apertures neighboring to each other to be the same, as in the case of the ninth exemplary embodiment described above. This makes it possible to achieve high image quality display at a low cost.

The layout of the two kinds of neighboring pixel pairs is not limited to the one described in this exemplary embodiment. It is also possible to arrange different kinds of neighboring pixel pairs by every plural-number row and every plural-number column. Especially, by arranging the different kinds of neighboring pixel pairs, influences of abnormal alignment of the liquid crystal molecules, etc., can be reduced even if it happens. This is because it is possible to prevent the abnormal state from generating at same positions of the whole pixels, since the positions of having abnormal alignment or the like differ when the pixel structures vary. Especially, the plural viewpoint display device according to the exemplary embodiment of the present invention enlarges the images by using the image separating device such as a lens, so that this effect is extremely large. Effects of the tenth exemplary embodiment other than those described above are the same as those of the first exemplary embodiment described above.

Figure 25:
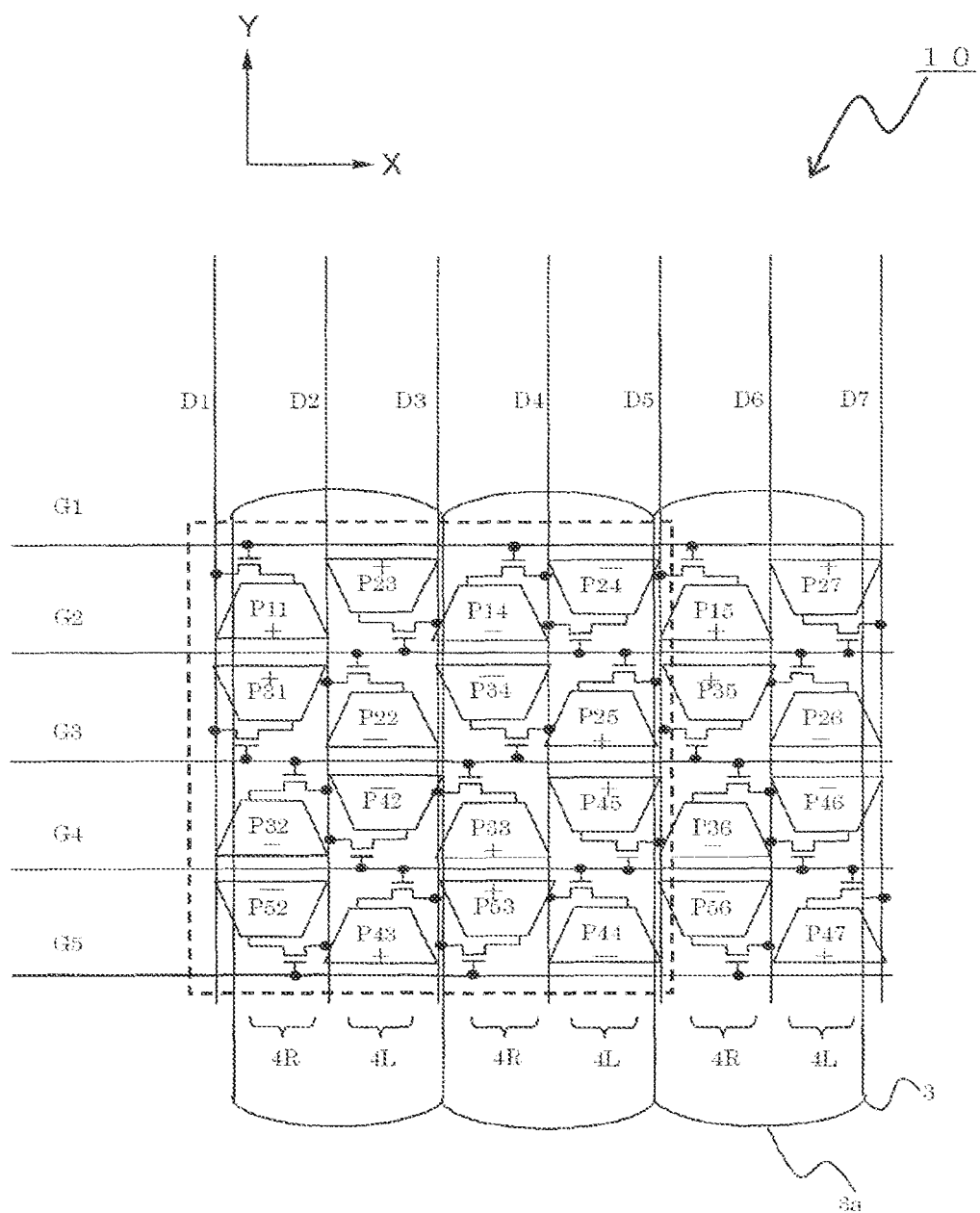
FIG. 25 is a top plan view showing polarities of each pixel in a display device according to an eleventh exemplary embodiment of the present invention.

Next, an eleventh exemplary embodiment of the present invention will be described. FIG. 25 is a top plan view showing polarities of each pixel in a display device according to the eleventh exemplary embodiment of the present invention. Compared to the tenth exemplary embodiment of the present invention described above, the eleventh exemplary embodiment is distinctive in respect that it employs a column inversion drive. The column inversion drive is a driving method with which display data of different polarity is transmitted for every data line, and the polarity is not inverted for each gate line.

As shown in FIG. 25, when the gate line G1 is selected, positive-polarity display data is written to the pixels that are connected to the data lines D1, D3, D5, D7, and negative-polarity display data is written to the pixels that are connected to the data lines D2, D4, D6. This is the same when the gate lines G2-G5 are selected. In a next frame, display data of inverted polarities are written to the respective data lines. As a result, the pixel groups configured with the right-eye pixels 4R are in a polarity distribution with which the 2-line dot inversion (1H2V dot inversion) effect can be achieved. This is the same for the pixels groups that are configured with the left-eye pixels 4L. Structures of the eleventh exemplary embodiment other than those described above are the same as those of the tenth exemplary embodiment described above.

It is possible with the eleventh exemplary embodiment to achieve the same effects as those of the tenth exemplary embodiment described above by employing the column inversion drive. The column inversion drive is a driving method which is similar to the dot inversion drive except that it does not invert the polarity when scanning the gate lines successively. That is, a driver IC capable of dot inversion drive can necessarily execute column inversion drive as well. Further, there is no inversion of the polarity when scanning the gate lines successively, so that the power can be saved with the column inversion drive compared to the case of the dot inversion drive. With a typical pixel structure, the polarity distribution becomes one-dimensional when the column inversion drive is employed. Thus, the display quality is deteriorated compared to the case of the dot inversion drive. However, the pixel structure of this exemplary embodiment makes it possible to achieve the 2-line dot inversion effect even with the use of the column inversion drive. Therefore, it is possible to achieve both the lower power and high image quality. Effects of the eleventh exemplary embodiment other than those described above are the same as those of the tenth exemplary embodiment described above.

Figure 26:
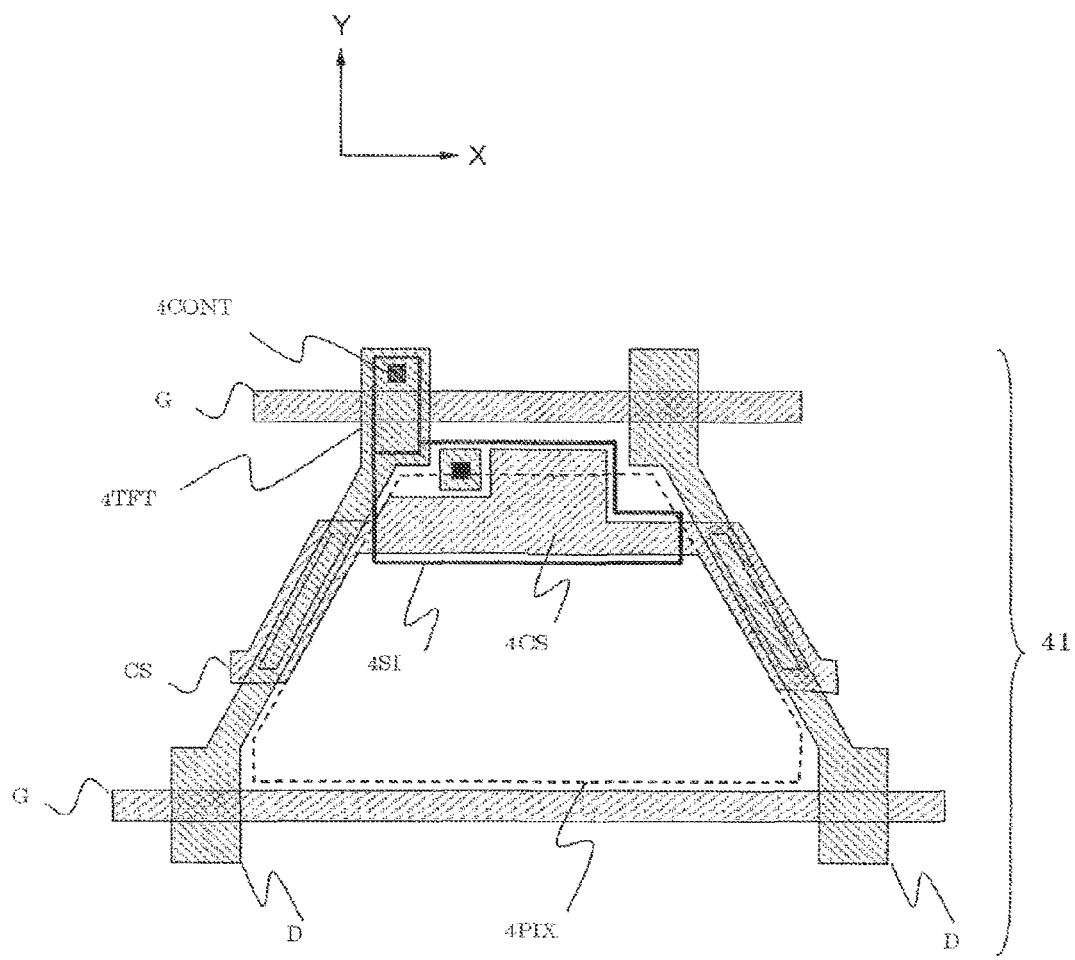
FIG. 26 is a top plan view showing a pixel in a display device according to a twelfth exemplary embodiment of the present invention.

Next, a twelfth exemplary embodiment of the present invention will be described. FIG. 26 is a top plan view showing a pixel of a display device according to the twelfth exemplary embodiment of the present invention. Compared to the first exemplary embodiment of the present invention described above, the twelfth exemplary embodiment is distinctive in respect that it employs a structure for reducing capacitance coupling at a part of the data line or a part of the storage capacitance line provided in a laminated manner.

As shown in FIG. 26, a gouged hole with no wiring is formed in a part of the storage capacitance line CS that is laminated with the data line D. Structures of the twelfth exemplary embodiment other than those described above are the same as those of the first exemplary embodiment described above.

It is possible with this exemplary embodiment to decrease electrical coupling of the data line and the storage capacitance line, so that a high image quality can be achieved. The numerical aperture can also be improved by applying the exemplary embodiment to the oblique wiring part that largely affects the numerical aperture.

The structure for decreasing the capacitance coupling is not limited to be in the above-described shape. For example, a large number of holes may be formed in one of the wirings, or a part of the wirings may be gouged out. Further, the above-described structure may be applied not to the storage capacitance line but to the data line. To employ the structure, it is desirable to have no gap between the data line and the storage capacitance line. A gap may cause light leakage, which may result in deteriorating the display image quality when the positions of the TFT substrate and the counter substrate become shifted. Effects of the twelfth exemplary embodiment other than those described above are the same as those of the first exemplary embodiment described above.

Figure 27:
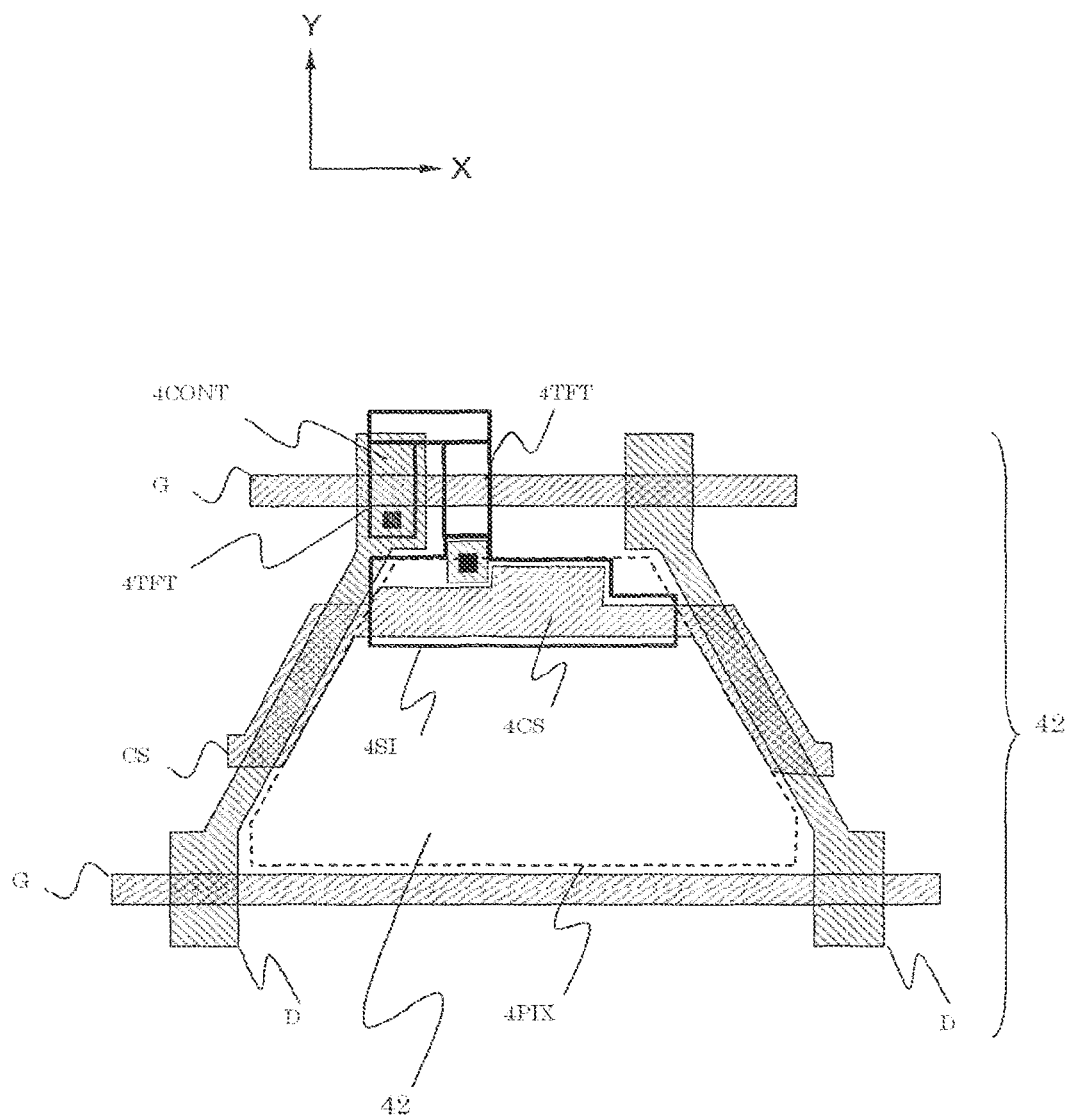
FIG. 27 is a top plan view showing a pixel in a display device according to a thirteenth exemplary embodiment of the present invention.

Next, a thirteenth exemplary embodiment of the present invention will be described. FIG. 27 is a top plan view showing a display device according to the thirteenth exemplary embodiment of the present invention. Compared to the first exemplary embodiment of the present invention described above, the thirteenth exemplary embodiment is distinctive in respect that the thin film transistor has a double gate structure.

As shown in FIG. 27, the source electrode and the drain electrode of the thin film transistor 4TFT are connected with the gate line G interposed therebetween. This is common to each thin film transistor of the double gate structure. Further, the source electrode of a given thin film transistor is connected to the drain electrode of another thin film transistor. As a result, the double gate structure is in a U-like shape in which the W direction is the same as the extending direction of the gate line. Structures of the thirteenth exemplary embodiment other than those described above are the same as those of the first exemplary embodiment described above.

Especially when low-temperature polysilicon or single crystalline silicon with high mobility is used for the semiconductor layer of the thin film transistors, this exemplary embodiment can reduce the leak power when the transistors are off. Thereby, high image quality display can be achieved. Further, with the double gate structure, deterioration of the numerical aperture can be suppressed by making the W direction of the transistors consistent with the extending direction of the gate lines and arranging the source electrode and the drain electrode by having the gate line interposed therebetween. Therefore, high image quality display can be achieved. This exemplary embodiment can be applied also to other multiple-gate structures such as triple gate structure. Effects of the thirteenth exemplary embodiment other than those described above are the same as those of the first exemplary embodiment described above.

Figure 28:
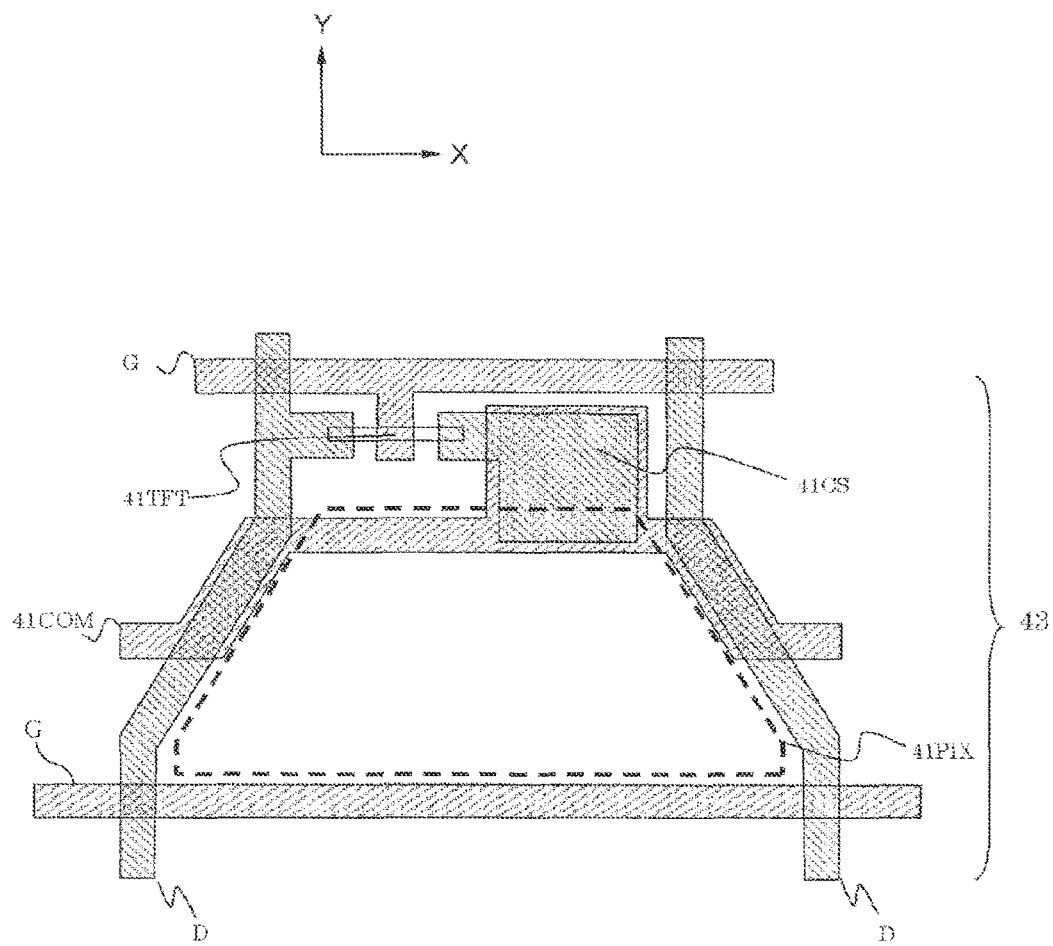
FIG. 28 is a top plan view showing a pixel in a display device according to a fourteenth exemplary embodiment of the present invention.

Next, a fourteenth exemplary embodiment of the present invention will be described. FIG. 28 is a top plan view showing a display device according to the fourteenth exemplary embodiment of the present invention. Compared to the first exemplary embodiment of the present invention described above, size and layout of the thin film transistor are different in the fourteenth exemplary embodiment.

That is, as shown in FIG. 28, a silicon thin film part of a thin film transistor 41TFT has a larger size in the L direction than in the W direction in this exemplary embodiment. That is, the channel length in the X-axis direction is larger than the channel width in the Y-axis direction. Further, the thin film transistor 41TFT is disposed on the side closer to the pixel 43 to which it belongs than the common gate line G of the neighboring pixel group to which it belongs. That is, unlike the first exemplary embodiment described above, the drain electrode and the source electrode of the thin film transistor are not disposed by having the common gate line interposed therebetween. Structures of the fourteenth exemplary embodiment other than those described above are the same as those of the first exemplary embodiment described above.

Especially when the thin film transistors having a larger size in the L direction than in the W direction are used, this exemplary embodiment arranges the thin film transistor on one side of the common gate line. Thereby, the vertical numerical aperture can be improved. This makes it possible to provide bright and high image quality display. Effects of the fourteenth exemplary embodiment other than those described above are the same as those of the first exemplary embodiment described above.

Figure 29:
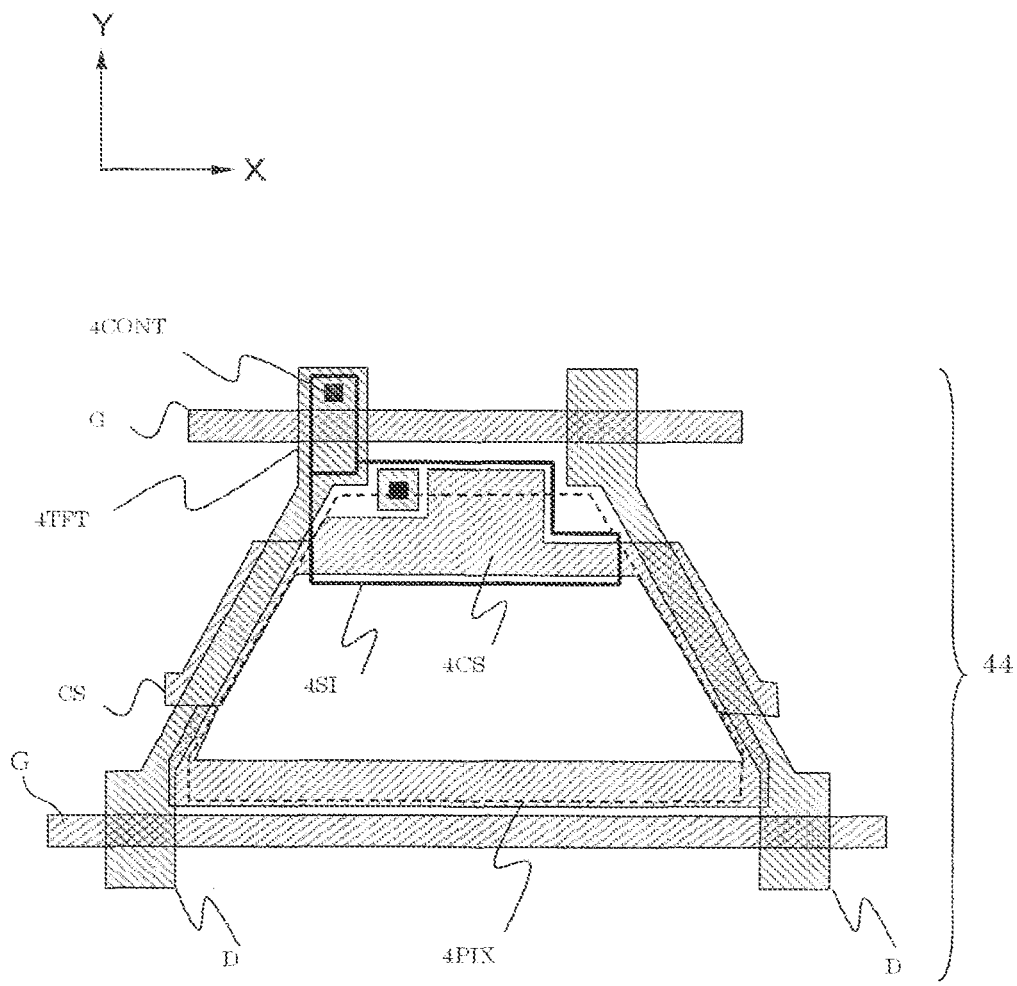
FIG. 29 is a top plan view showing a pixel in a display device according to a fifteenth exemplary embodiment of the present invention.

Next, a fifteenth exemplary embodiment of the present invention will be described. FIG. 29 is a top plan view showing a pixel of a display device according to the fifteenth exemplary embodiment of the present invention. Compared to the first exemplary embodiment of the present invention described above, layout of the storage capacitance lines is different in the fifteenth exemplary embodiment.

That is, as shown in FIG. 29, the storage capacitance line CS is formed also in the bottom side part of the trapezoid aperture in this exemplary embodiment. Further, it is electrically connected to the storage capacitance lines CS formed in the oblique-side parts. Thereby, the pixel electrode 4PIX comes to be surrounded by the storage capacitance lines CS. Structures of the fifteenth exemplary embodiment other than those described above are the same as those of the first exemplary embodiment described above.

This exemplary embodiment uses the storage capacitance lines having a constant potential to surround the pixel electrode. Thereby, influences of the electric field fluctuation in the surroundings can be shut off, so that high image quality display can be achieved. Further, a large number of storage capacitance lines can be provided all over, so that the resistance value can be decreased. Thus, it becomes tolerable to changes in the potentials. Effects of the fifteenth exemplary embodiment other than those described above are the same as those of the first exemplary embodiment described above.

Figure 30:
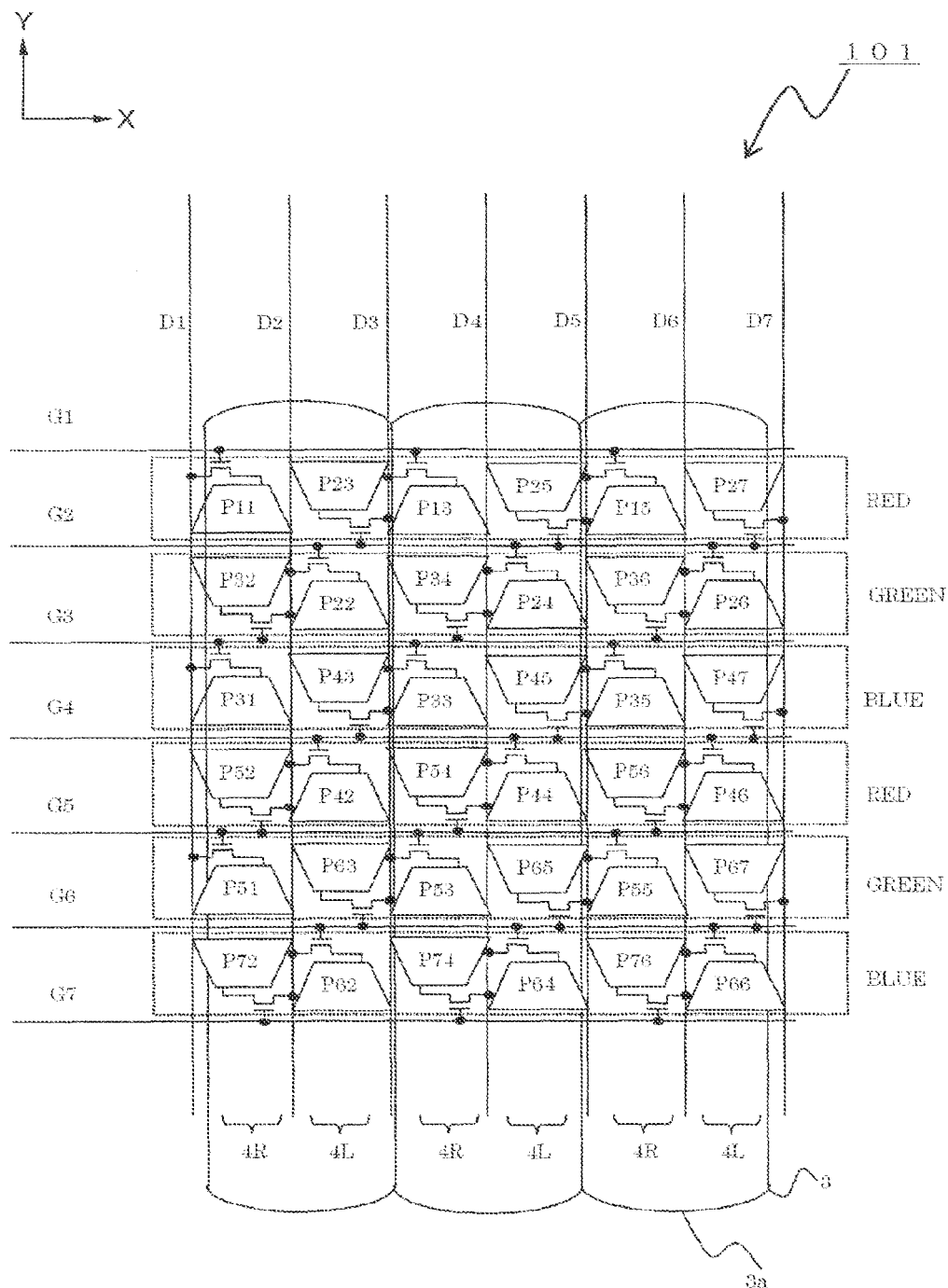
FIG. 30 is a top plan view showing a display device according to a sixteenth exemplary embodiment of the present invention.

Next, a sixteenth exemplary embodiment of the present invention will be described. FIG. 30 is a top plan view showing a pixel of a display device according to the sixteenth exemplary embodiment of the present invention. Compared to the first exemplary embodiment of the present invention described above, the sixteenth exemplary embodiment is distinctive in respect that it is compatible with color display.

That is, as shown in FIG. 30, this exemplary embodiment has color filters in a stripe form provided on a display panel. The color filters are of three types including red color filters RED, green color filters GREEN, and blue color filters BLUE.

That is, those are of three primary colors. The extending direction of each color filter is the X-axis direction that is the image separating direction of the lens. Those different-color filters are arranged in the Y-axis direction. Specifically, a red color filter RED is disposed between the gate line G1 and the gate line G2, and the pixels P11, P23, P13, P25, P15, and P27 work as the pixels that display red. This structure applies for each of the other colors. The pixels that are arranged with a specific color filter work as the pixels that display the corresponding color.

Then, twelve pixels disposed between the gate lines G1-G7 and between the data lines D1-D3 are repeatedly disposed in the X-axis direction and the Y-axis direction. Structures of the sixteenth exemplary embodiment other than those described above are the same as those of the first exemplary embodiment described above.

In this exemplary embodiment, in the color filters arranged in a stripe form, the direction towards which the same color continues is consistent with the extending direction of the gate lines. With this, a same-color color filter can be provided continuously for the oblique wiring parts. That is, it becomes unnecessary to manufacture complicated shapes such as trapezoids by using color resist or the like. Thus, the color filters can be manufactured easily, and the cost can be reduced. Furthermore, there is no junction part in different-color layers generated in the oblique wiring parts.

Thus, it is possible to provide a high image quality by suppressing abnormal alignment of the liquid crystal molecules. Further, since the image separating direction of the lenticular lens is set to be consistent with the direction towards which the same color of the color filter continues, it is possible to prevent the color from being separated by the image separating device such as the lenticular lens. Therefore, a high image quality can be achieved.

In this exemplary embodiment, each color pixel group is not distortedly arranged as one of the pixels that configure the neighboring groups, but arranged dispersedly for both pixels. For example, there are the pixel P11 and the pixel P52 as the pixels that configure a red pixel group. Out of this red pixel group, the pixel P11 is disposed on the −Y direction side with respect to the gate line G1 to which the pixel P11 is connected, and the pixel P52 is arranged on the +Y direction side with respect to the gate line G5 to which the pixel P52 is connected. Through configuring pixel groups of each color by using each of the pixels that configure the neighboring pixel groups, color dispersions can be suppressed. Thus, a high image quality can be achieved. Effects of the sixteenth exemplary embodiment other than those described above are the same as those of the first exemplary embodiment described above.

Figure 31:
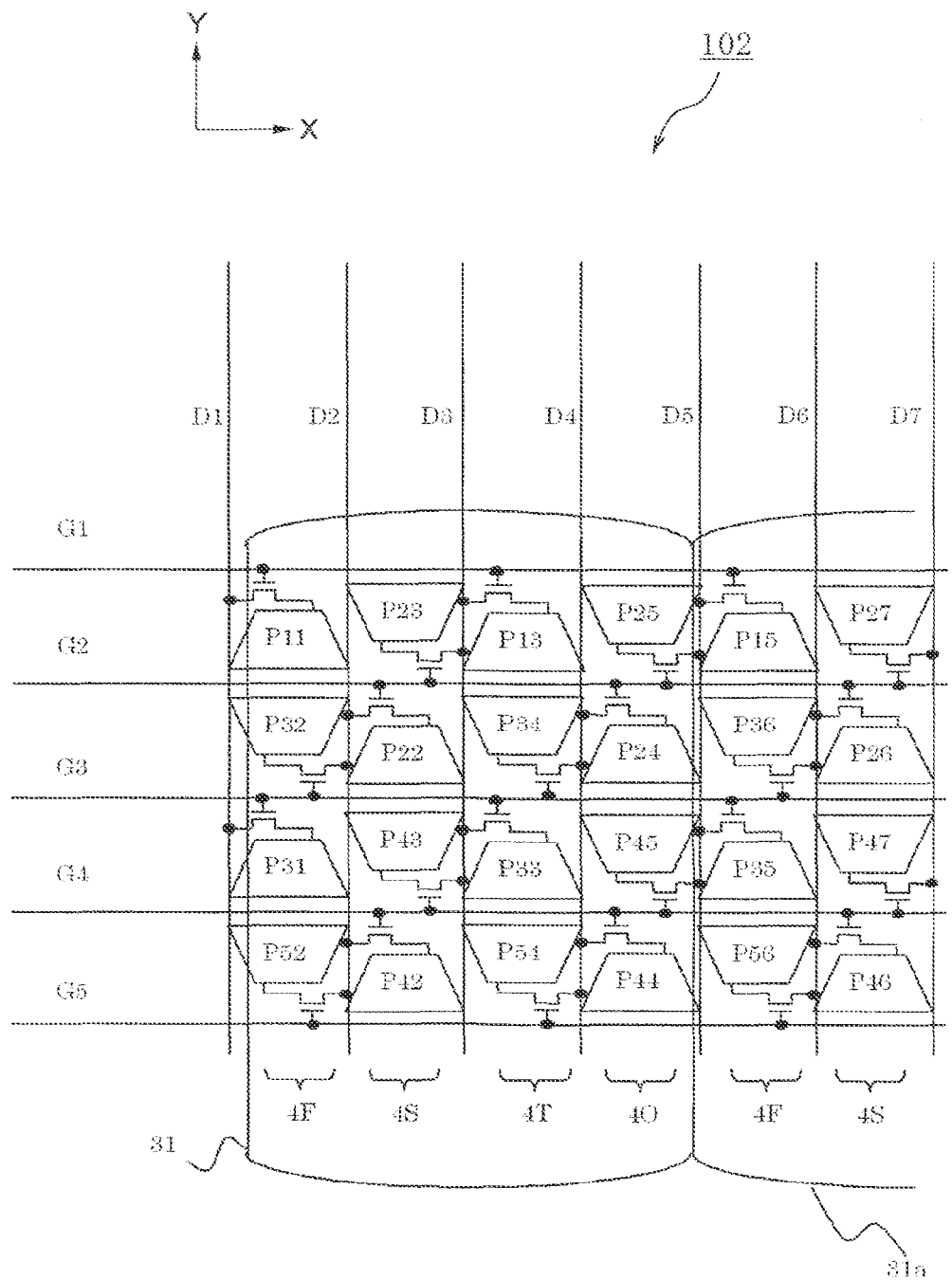
FIG. 31 is a top plan view showing a display device according to a seventeenth exemplary embodiment of the present invention.

Next, a seventeenth exemplary embodiment of the present invention will be described. FIG. 31 is a top plan view showing a display device according to the seventeenth exemplary embodiment of the present invention. Compared to the first exemplary embodiment of the present invention described above, the seventeenth exemplary embodiment is distinctive in respect that it is a multiple-viewpoint stereoscopic image display device with four viewpoints.

That is, as shown in FIG. 31, cylindrical lenses 31a configuring a lenticular lens 31 are arranged to correspond to pixels of four columns. Then, according to positional relations regarding the cylindrical lens 31a and each pixel column, pixels P11, P32, P31, and P52 are allotted as first viewpoint pixels 4F. Similarly, pixels P23, P22, P43, and P42 are allotted as second viewpoint pixels 4S, pixels P13, P34, P33, and P54 are allotted as third viewpoint pixels 4T, and pixels P25, P24, P45, and P44 are allotted as fourth viewpoint pixels 4O. Structures of the seventeenth exemplary embodiment other than those described above are the same as those of the first exemplary embodiment described above.

With this exemplary embodiment, the present invention can be also applied to the multiple-viewpoint stereoscopic image display device with an increased number of viewpoints. Thus, a high image quality can be achieved. Further, the probability of enabling stereoscopic view can be increased by increasing the number of viewpoints. The number of viewpoints is not limited to the number depicted in the exemplary embodiment. The present invention can be applied also to display devices of three viewpoints or more. Further, the number of viewpoints may not necessarily have to be an integer. The exemplary embodiment of the present invention can be applied also to a fraction-number stereoscopic image display device such as a fractional view type. Effects of the seventeenth exemplary embodiment other than those described above are the same as those of the first exemplary embodiment described above.

Figure 32:
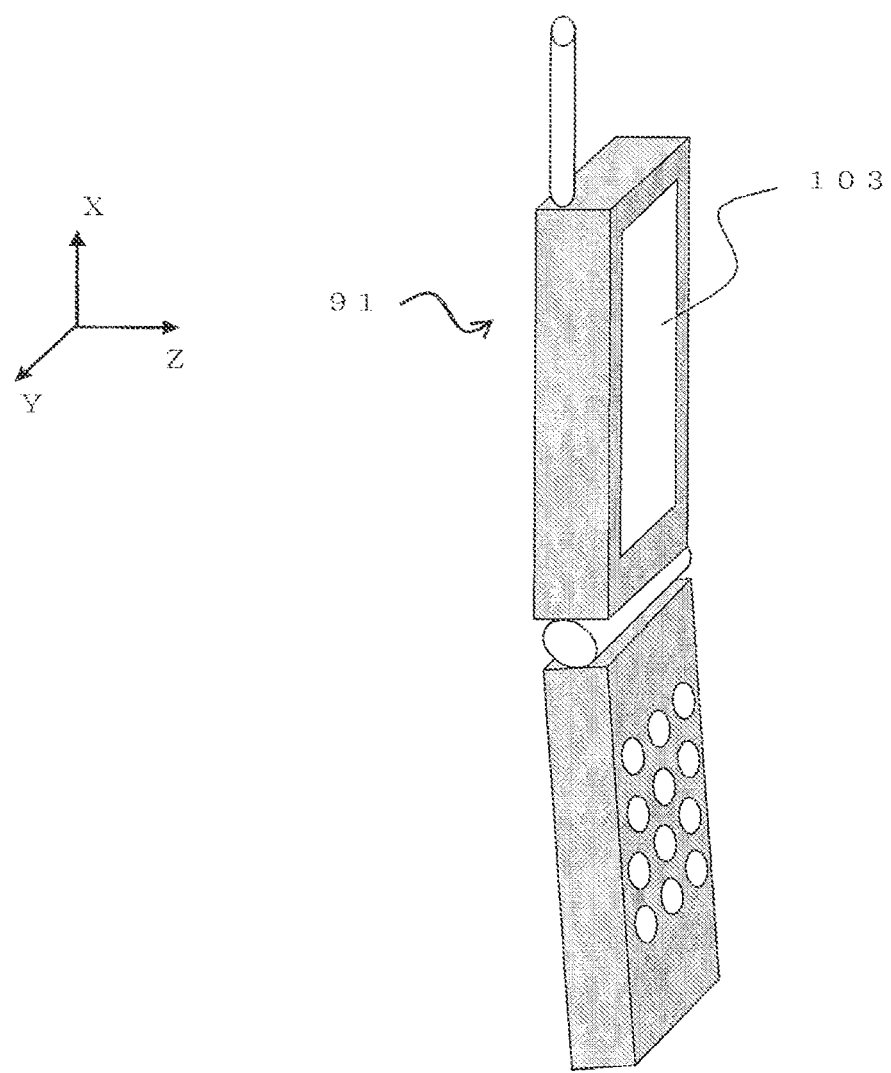
FIG. 32 is a perspective view showing a terminal device according to an eighteenth exemplary embodiment of the present invention.

Next, an eighteenth exemplary embodiment of the present invention will be described. FIG. 32 is a perspective view showing a terminal device according to the sixteenth exemplary embodiment, and FIG. 33 is a top plan view showing a display device according to this exemplary embodiment.

Figure 33:
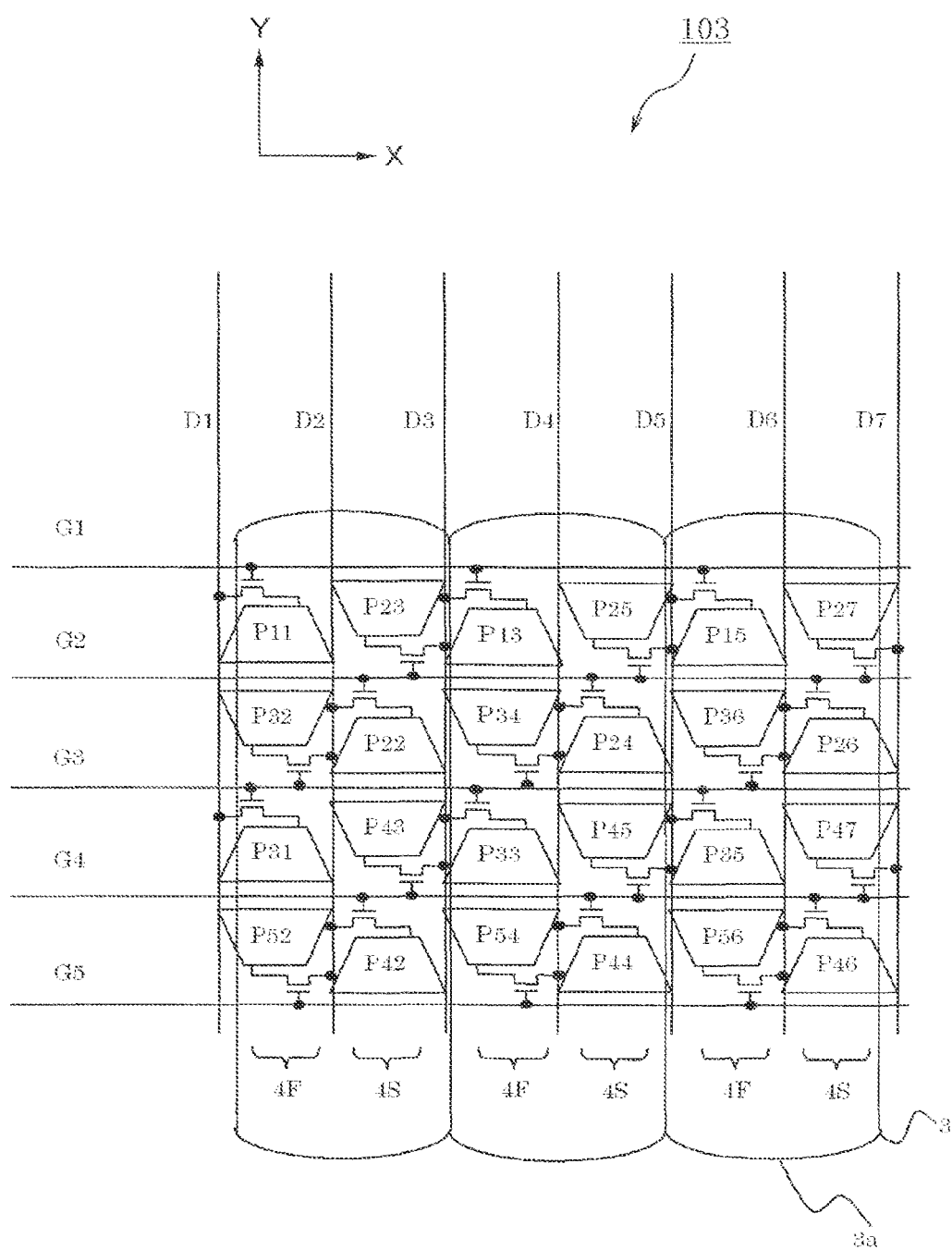
FIG. 33 is a top plan view showing a display device according to this exemplary embodiment of the present invention.
Figure 34:
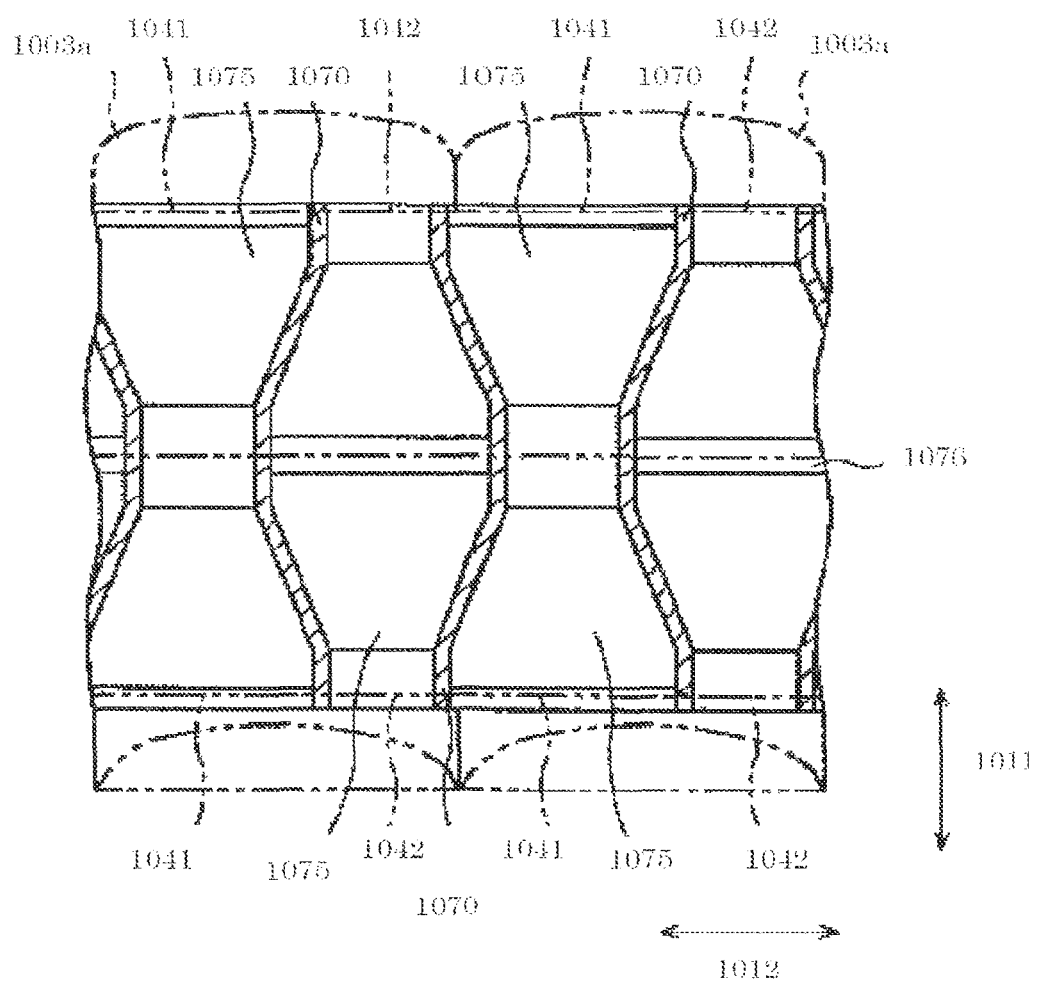
FIG. 34 is a plan view showing a display panel provided in a conventional image display device.

As shown in FIG. 32 and FIG. 33, a display device 103 according to this exemplary embodiment is mounted into a portable telephone 91 as the terminal device. Compared to the first exemplary embodiment described above, the eighteenth exemplary embodiment is different in respect that the longitudinal direction of the cylindrical lenses 3a configuring the lenticular lens (the Y-axis direction) is the lateral direction of the image display device (horizontal direction of the image), and the arranging direction of the cylindrical lenses 3a (X-axis direction) is the vertical direction (perpendicular direction of the image).

Further, as shown in FIG. 33, a plurality of pixel pairs each configured with a single first viewpoint pixel 4F and a single second viewpoint pixel 4S are arranged to the display device 103 in matrix. The arranging direction of the first viewpoint pixel 4F and the second viewpoint pixel 4S in a single pixel pair is the X-axis direction that is the arranging direction of the cylindrical lenses 3a, which is the vertical direction (perpendicular direction) of the screen. Further, structures of each of the pixels 4F and 4S are the same as those of the first exemplary embodiment described above. Structures of the eighteenth exemplary embodiment other than those described above are the same as those of the first exemplary embodiment described above.

Next, operations of the display device according to this exemplary embodiment will be described. However, the basic operations are the same as those of the first exemplary embodiment described above, and images to be displayed are different. The first viewpoint pixel 4F of the display device 103 shows an image for a first viewpoint, and the second viewpoint pixel 4S shows an image for a second viewpoint. The image for the first viewpoint and the image for the second viewpoint are not stereoscopic images having parallax from each other but plane images. Further, both images may be independent images form each other, or may be images showing information related to each other.

This exemplary embodiment has such an advantage that the observer can select the first viewpoint image or the second viewpoint image by simply changing the angle of the portable telephone 91. Particularly when there is a relevancy between the first viewpoint image and the second viewpoint image, each image can be observed by simply changing the observing angle. Therefore, convenience for the observers can be greatly improved. When the first viewpoint image and the second viewpoint image are arranged in the lateral direction, it sometimes happens that the right eye and the left eye observe different images depending on the observing position. In that case, the observer becomes confused, and becomes unable to recognize the images at each viewpoint. However, when the plural viewpoint images are arranged in the vertical direction as in this exemplary embodiment, the observer can always observe the images for each viewpoint with both eyes. Therefore, those images can be recognized easily. Effects of the eighteenth exemplary embodiment other than those described above are the same as those of the first exemplary embodiment described above. This exemplary embodiment can also be combined with any of the second to seventeenth exemplary embodiments described above.

The first to eighteenth exemplary embodiments have been described by referring to the case where the display device is loaded on the portable telephone to display stereoscopic images by supplying images with parallax to the left and right eyes of a single observer and to the case where the display device supply a plurality of kinds of images simultaneously to a single observer. However, the display device according to the exemplary embodiment of the present invention is not limited to such cases. The exemplary embodiment may be applied to a device that has a large-scale display panel and supply a plurality of different images to a plurality of observers. Further, each of the above-described exemplary embodiments may be employed individually or employed in combinations as appropriate.

While the present invention has been described above by referring to each of the exemplary embodiments, the present invention is not limited to those exemplary embodiments. Various changes and modifications that occur to those skilled in the art may be applied to the structures and details of the present invention. Further, it is to be understood that the present invention includes combinations of a part of or the whole part of the structures described in each of the exemplary embodiments.

The invention claimed is:
1. A display panel, comprising:
data lines for supplying display data to respective pixels;
pixel switches for transmitting display data signals from the data lines to the pixels;
gate lines for controlling the pixel switches, wherein
a neighboring pixel pair arranged with the gate line interposed therebetween is controlled by the gate line that is provided between those pixels, each of the pixels configuring the neighboring pixel pair is connected to the data line different from each other, and each of the neighboring pixel pairs neighboring to each other in an extending direction of the gate lines is connected to the gate line different from each other, wherein the disposed two or more pixel switches, which are controlled by a common gate line, are disposed between one of the pixels and the data line corresponding to the one of the pixels, wherein, the two or more pixel switches are connected in such a manner that, when all the pixel switches are turned on, a signal is transmitted from the data line corresponding to the one of the pixels.

2. The display device as claimed in claim 1, wherein the pixel switches are thin film transistors.

3. The display device as claimed in claim 1, wherein the two or more pixel switches disposed between the one of the pixels and the corresponding data line are thin film transistors, wherein at least two of the two or more thin film transistors are disposed in such a manner that a source electrode and a drain electrode of the thin film transistor are connected with the gate line interposed therebetween.

* * * * *